(12) United States Patent
Toda et al.

(10) Patent No.: US 11,037,969 B2
(45) Date of Patent: Jun. 15, 2021

(54) SOLID-STATE IMAGING DEVICE HAVING AN IMPURITY REGION ON AN UPPER SURFACE OF A PHOTOELECTRIC CONVERSION FILM

(71) Applicant: SONY CORPORATION, Tokyo (JP)

(72) Inventors: Atsushi Toda, Kanagawa (JP); Teruo Hirayama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/675,084

(22) Filed: Nov. 5, 2019

(65) Prior Publication Data

US 2020/0144317 A1 May 7, 2020

Related U.S. Application Data

(63) Continuation of application No. 15/489,243, filed on Apr. 17, 2017, now Pat. No. 10,497,727, which is a
(Continued)

(30) Foreign Application Priority Data

Jun. 18, 2010 (JP) .................................. 2010-139689

(51) Int. Cl.
*H01L 27/146* (2006.01)
*H01L 31/0224* (2006.01)
*H01L 31/032* (2006.01)

(52) U.S. Cl.
CPC .... *H01L 27/14607* (2013.01); *H01L 27/1464* (2013.01); *H01L 27/14632* (2013.01);
(Continued)

(58) Field of Classification Search
CPC ......... H01L 27/14607; H01L 27/14665; H01L 27/14645; H01L 31/022466;
(Continued)

(56) References Cited

U.S. PATENT DOCUMENTS

2004/0129991 A1* 7/2004 Lai ........................ H01L 31/105
257/433
2007/0279661 A1* 12/2007 Misawa ............ H01L 27/14687
358/1.9
(Continued)

FOREIGN PATENT DOCUMENTS

| JP | 2004-05559102 | 2/2004 |
| KR | 10-2010-0048904 | 5/2010 |
| WO | WO 2008/093834 | 8/2008 |

OTHER PUBLICATIONS

Official Action (with English translation) for Korean Patent Application No. 10-2020-0031212, dated May 1, 2020, 9 pages.
(Continued)

*Primary Examiner* — Albert H Cutler
(74) *Attorney, Agent, or Firm* — Sheridan Ross P.C.

(57) ABSTRACT

A solid-state imaging device includes a substrate and a photoelectric conversion region. The substrate has a charge accumulation region. The photoelectric conversion region is provided on the substrate. The photoelectric conversion region is configured to generate signal charges to be accumulated in the charge accumulation region. The photoelectric conversion region comprises a material that is not transparent.

17 Claims, 56 Drawing Sheets

Related U.S. Application Data continuation of application No. 15/048,741, filed on Feb. 19, 2016, now Pat. No. 9,679,928, which is a continuation of application No. 13/155,060, filed on Jun. 7, 2011, now Pat. No. 9,570,495.

(52) U.S. Cl.
CPC .. H01L 27/14645 (2013.01); H01L 27/14665 (2013.01); H01L 27/14687 (2013.01); H01L 31/022466 (2013.01); H01L 31/0322 (2013.01); *H01L 27/14609* (2013.01); *H01L 27/14621* (2013.01); *H01L 27/14627* (2013.01); *H01L 27/14643* (2013.01); *H01L 27/14647* (2013.01); *Y02E 10/541* (2013.01); *Y02P 70/50* (2015.11); *Y10T 29/49002* (2015.01)

(58) Field of Classification Search
CPC ........... H01L 27/1464; H01L 27/14687; H01L 31/0322; H01L 27/14632; H01L 27/14609; H01L 27/14621; H01L 27/14627; H01L 27/14643; H01L 27/14647; H01L 27/1461; H01L 27/14667; H01L 27/14669; H01L 27/1467; H01L 27/14672; H01L 27/14674; H01L 27/14676; Y02P 70/50; Y02E 10/541; Y10T 29/49002

See application file for complete search history.

(56) References Cited

U.S. PATENT DOCUMENTS

| | | | |
|---|---|---|---|
| 2009/0185060 A1* | 7/2009 | Akiyama | H01L 23/481 348/294 |
| 2010/0059843 A1* | 3/2010 | Ikuta | H01L 27/14687 257/432 |
| 2011/0309462 A1* | 12/2011 | Sargent | H04N 5/369 257/443 |

OTHER PUBLICATIONS

Official Action (with English translation) for Korean Patent Application No. Oct. 2019-0011760, dated Sep. 10, 2019, 7 pages.

* cited by examiner

FIG. 21A  PD VOLTAGE

FIG. 21B  FD VOLTAGE

FIG. 21C  PD RESET

FIG. 21D  FD RESET

FIG. 21E  TRANSPARENT ELECTRODE

FIG. 21F  READOUT

FIG. 21G  SELECTION

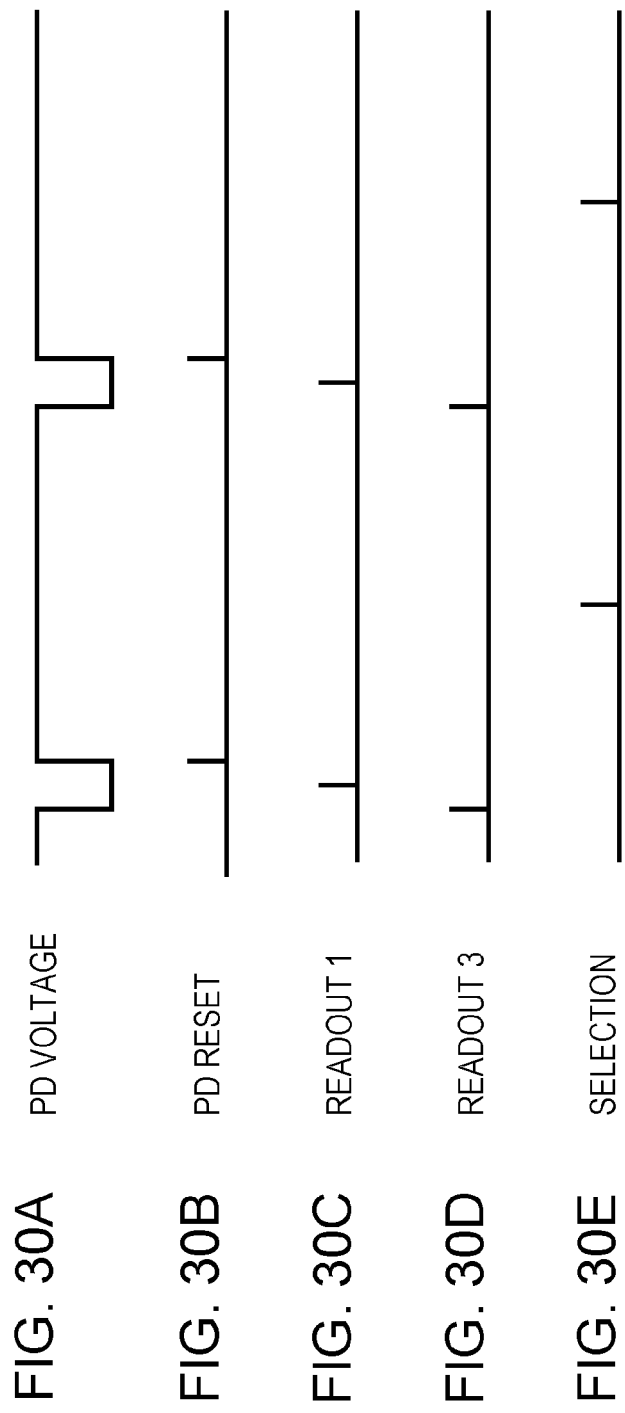

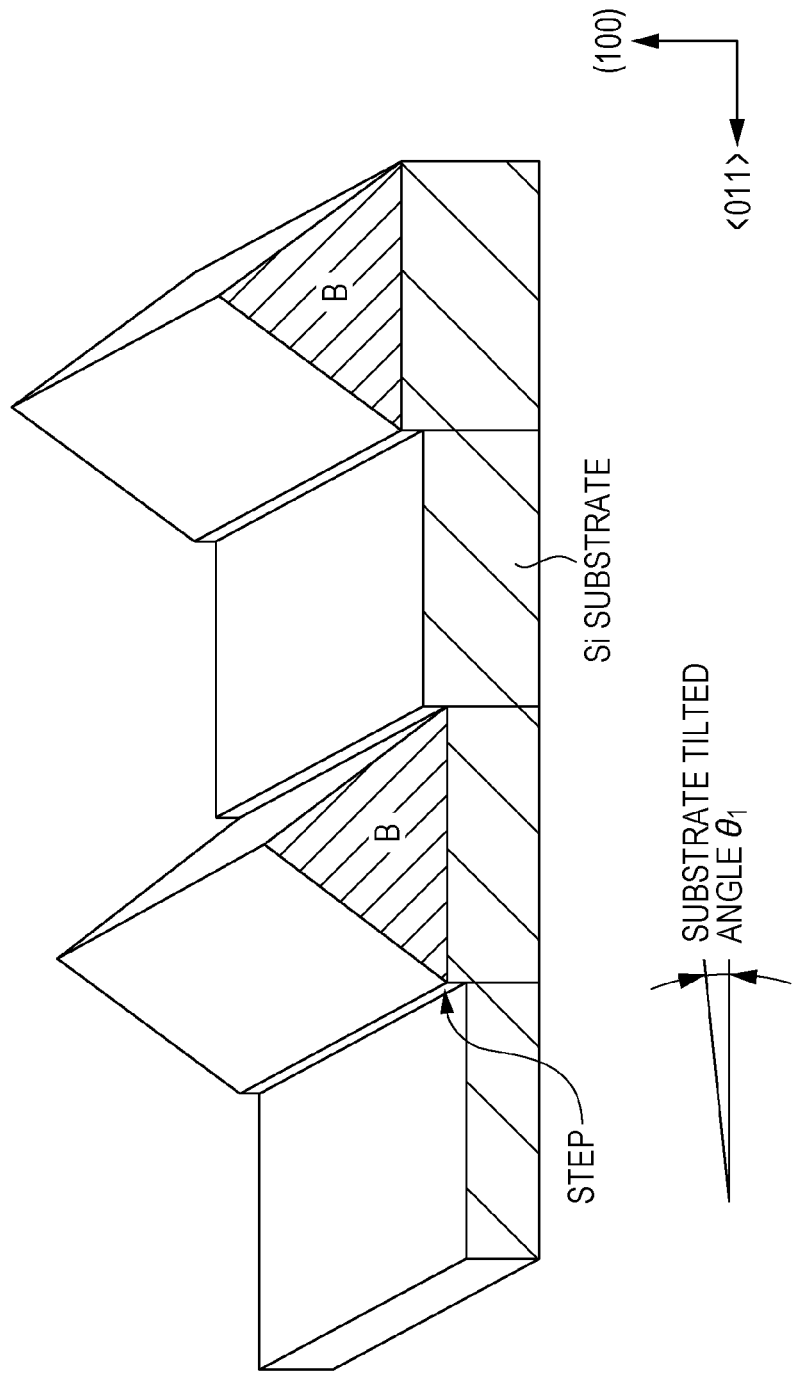

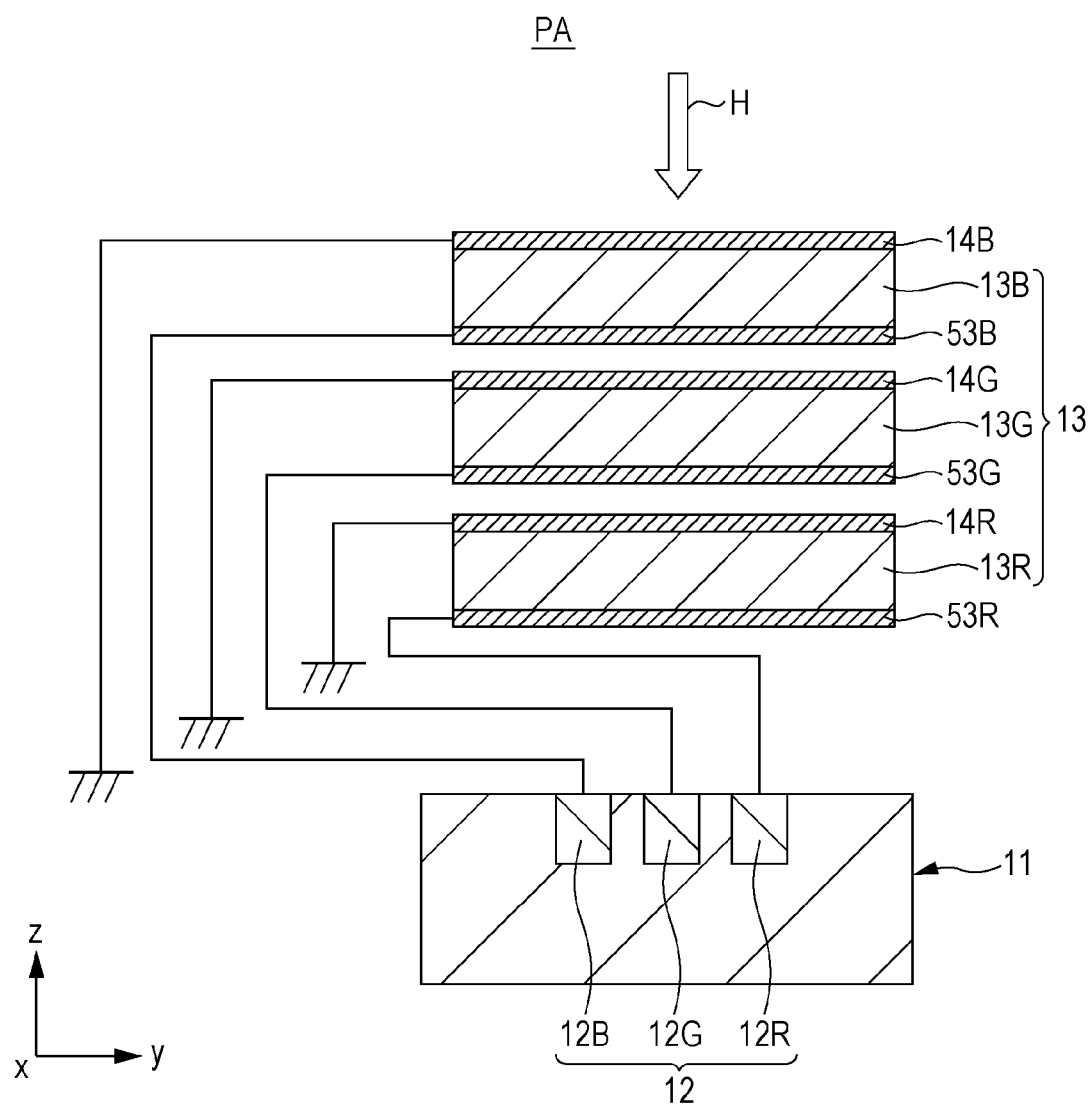

SOLID-STATE IMAGING DEVICE HAVING AN IMPURITY REGION ON AN UPPER SURFACE OF A PHOTOELECTRIC CONVERSION FILM

CROSS-REFERENCE TO RELATED APPLICATIONS

This application is a continuation of U.S. patent application Ser. No. 15/489,243, filed on Apr. 17, 2017, which is a continuation of U.S. patent application Ser. No. 15/048,741, filed Feb. 19, 2016, which is a continuation of U.S. patent application Ser. No. 13/155,060, filed Jun. 7, 2011, now U.S. Pat. No. 9,570,495, which claims priority to Japanese Patent Application JP 2010-139689, filed in the Japan Patent Office on Jun. 18, 2010, the entire disclosures of which are hereby incorporated herein by reference.

BACKGROUND

The present invention relates to a solid-state imaging device and an electronic device.

An electronic device such as a digital video camera or a digital still camera includes a solid-state imaging device. For example, a CMOS (complementary metal oxide semiconductor) type image sensor is used as the solid-state imaging device.

The solid-state imaging device has a plurality of pixels arranged on a surface of a semiconductor substrate. A photoelectric conversion unit is provided in each pixel. The photoelectric conversion unit is, for example, a photodiode, and generates signal charges by sensing light coming via an externally attached optical system in a light sensing surface and by photoelectric-converting the light.

Among the solid-state imaging devices, each pixel of the CMOS type image sensor includes a readout circuit in addition to the photoelectric conversion unit. The readout circuit includes a plurality of transistors, reads out signal charges generated in the photoelectric conversion unit, and outputs the read-out signal charges to a signal line as an electric signal.

In the CMOS type image sensor, the photoelectric conversion unit reads out the signal charges for each pixel or for each row where a plurality of pixels is arranged. In this case, exposure time for accumulating the signal charges is difficult to match in all the pixels, and thus in some cases, a captured image is distorted. Particularly, if the motion of a subject is great, this defect is noticeably generated.

In order to prevent this defect from being generated, a "global exposure" is performed in which all the pixels start exposure at the same time and finish the exposure at the same time.

The "global exposure" is performed, for example, in a "mechanical shutter method" using a mechanical shutter. Specifically, all the pixels start exposure by opening the mechanical shutter, and finish the exposure by closing the mechanical shutter. However, in this "mechanical shutter method," the size of a device is difficult to decrease since a mechanical light blocking unit is used. Also, since the speed of the driving operation of the mechanism is difficult to increase, the simultaneous exposure in all the pixels is hard to perform with high accuracy.

The "global exposure" is performed in a "global shutter method" in addition to the "mechanical shutter method." Specifically, the "global exposure" is performed by simultaneously driving all the pixels through an electrical control without using the mechanical shutter. In the global shutter method, a size of a device can be easily reduced since the mechanical light blocking unit is not used. Further, the speed of the driving operation is easily increased, and the simultaneous exposure in all the pixels can be performed with high accuracy (for example, refer to Japanese Unexamined Patent Application Publications Nos. 2004-055590, 2009-268083 and 2004-140152).

Meanwhile, in the solid-state imaging device, there is a demand for an increase in the number of pixels along with the small size. In this case, since the size of one pixel is small, it is hard for each pixel to sense a sufficient amount of light, and thus it is not easy to improve the image quality of a captured image. For this reason, it is necessary for the solid-state imaging device to have high sensitivity.

In order to realize the high sensitivity, there has been proposed one where a chalcopyrite based compound semiconductor film such as a $CuInGaSe_2$ film with high light absorption coefficient is used in the photoelectric conversion unit (for example, refer to Japanese Unexamined Patent Application Publications No. 2007-123720).

In addition, there has been proposed a "lamination type" where photoelectric conversion units for respective colors are laminated and disposed in a depth direction perpendicular to an imaging surface, instead of disposing the photoelectric conversion units which selectively sense light beams of respective colors in a direction along the imaging surface. In the "lamination type," each pixel senses not only light of one color but also light of plural colors. For this reason, a light sensing surface is extensively formed and thus use efficiency of light can be improved, thereby improving sensitivity (for example, refer to Japanese Unexamined Patent Application Publications No. 2006-245088).

Further, there has been proposed a "rear surface illumination type" where a photoelectric conversion unit senses light which is incident from a rear surface opposite to a front surface in which circuits, wires and the like are provided, in a semiconductor substrate. In the "rear surface illumination type," the circuits, the wires and the like, which block or reflect the incident light are not provided in the incident side, and thus sensitivity can be improved (for example, refer to Japanese Unexamined Patent Application Publications No. 2008-182142). In the "rear surface illumination type," there has been proposed one where a control gate electrode is formed in the photoelectric conversion unit on a surface opposite to the light sensing surface, a potential is controlled by applying a voltage to the photoelectric conversion unit, and signal charges are efficiently transferred (for example, refer to Japanese Unexamined Patent Application Publications No. 2007-258684).

In addition, the inventors of the present invention have recognized that in the solid-state imaging device, light enters an accumulator which accumulates signal charges generated by the photoelectric conversion unit or a readout circuit which reads out the signal charges, which causes noise to be generated, and thus there is a problem in that the image quality of a captured image is deteriorated.

In order to prevent the generation of such a defect, a light blocking film may block light from entering the accumulator or the readout circuit.

However, if the light blocking film is formed between the photoelectric conversion unit and the accumulator or the readout circuit, the area of the light sensing surface becomes small since the aperture ratio is reduced, and thus sensitivity is lowered in some cases.

In addition, light is diffracted or scattered due to the light blocking film, the diffracted light or the scattered light enters the accumulator to generate noise, and thus there are cases where the image quality of a captured image is deteriorated.

In the case of the "rear surface illumination type" solid-state imaging device, the accumulator or the readout circuit is formed on the front surface side opposite to the rear surface side which senses light in the substrate, but, in some cases, the above-described defects are generated since the substrate is thin for reading out the signal charges.

FIG. 60 is a cross-sectional view illustrating the "rear surface illumination type" solid-state imaging device.

FIG. 61 shows a simulation result of a form of light traveling in the "rear surface illumination type" solid-state imaging device. Here, a result of a case where light having a wavelength of 650 nm vertically enters the surface of the silicon substrate 101J (3 µm thick) is shown.

As shown in FIG. 60, in the "rear surface illumination type" solid-state imaging device, members such as on-chip lenses ML, color filters CF, and insulating films Z1, Z2 are provided on the rear surface side of the silicon substrate 101J. A wire layer 111 is provided on the front surface side of the silicon substrate 101J. The wire layer 111 is provided to cover a readout circuit (not shown) provided on the front surface side of the silicon substrate 101J.

In the "rear surface illumination type" solid-state imaging device, photodiodes (not shown) provided inside the silicon substrate 101J sense light passing through the respective portions such as the on-chip lenses ML and the color filters CF. Further, the readout circuit (not shown) provided on the front surface side of the silicon substrate 101J reads out signal charges from the photodiodes (not shown).

As shown in FIG. 61, in the "rear surface illumination type" solid-state imaging device, the light which enters the rear surface (the upper surface in FIG. 60) of the silicon substrate 101J through the respective portions such as the on-chip lenses ML and the color filters CF reaches the front surface (lower surface). Specifically, light passing through the red filter layer CFR reaches the front surface of the silicon substrate 101J more than light passing through the green filter layer CFG, and 28% of the light reaches the front surface.

As such, the inventors of the present invention have recognized that even in the "rear surface illumination type," the light coming from the rear surface side is not blocked and reaches the front surface side on which the accumulator is provided, and thus there are cases where noise is generated and image quality of a captured image is deteriorated.

Particularly, in a case where imaging is performed in the "global shutter method," since exposure in all the pixels is performed at the same time and then signal charges are temporarily accumulated in the accumulator, if light enters the accumulator, noise is notably generated.

Therefore, in the solid-state imaging device, there are cases where it is difficult for the small size and the improvement in the image quality of a captured image to be compatible.

SUMMARY

Disclosed herein are one or more inventions that provide a solid-state imaging device and an electronic device, of which the size can be easily reduced and which can improve the image quality of a captured image by preventing generation of noise.

According to an embodiment, a solid-state imaging device includes a substrate and a photoelectric conversion region. The substrate has a charge accumulation region. The photoelectric conversion region is configured to generate signal charges to be accumulated in the charge accumulation region. The photoelectric conversion region is provided on the substrate. The photoelectric conversion region comprises a material that is not transparent.

According to an embodiment, an electronic apparatus includes a solid-state imaging device. The solid state imaging device includes (a) a substrate, and (b) a photoelectric conversion region configured to generate signal charges. The photoelectric conversion region is provided on the substrate. The signal processing unit is configured to process an output of the solid-state imaging device. The photoelectric conversion region comprises a material that is not transparent.

According to an embodiment, a method for manufacturing a solid-state imaging device includes forming a charge accumulation region in a substrate, and forming a photoelectric conversion region electrically connected to the charge accumulation region. The charge accumulation region is configured to accumulate signal charges generated by the photoelectric conversion region. The photoelectric conversion region comprises a material that is not transparent.

Accordingly, it is possible to provide a solid-state imaging device and an electronic device, of which a size can be easily reduced and which can suppress generation of defects such as deterioration in image quality of a captured image, by preventing generation of noise.

BRIEF DESCRIPTION OF THE DRAWINGS

FIGS. 30A to 30E are diagrams illustrating an operation of the solid-state imaging device according to the modified example 1-5 of the first embodiment.

FIG. 50 is an enlarged perspective view illustrating an area in which an antiphase domain is generated when the photoelectric conversion film is formed on the silicon substrate according to the seventh embodiment.

FIG. 51 is a diagram illustrating main portions of a solid-state imaging device according to an eighth embodiment.

DETAILED DESCRIPTION OF EMBODIMENTS

Hereinafter, devices and constructions embodying principles of the present invention(s) (herein referred to as embodiments) will be described with reference to the accompanying drawings. The description will be carried out in the following order.

1. A first embodiment (a rear surface illumination type)
2. A second embodiment (with a pixel dividing portion (the First))
3. A third embodiment (with a pixel dividing portion (the Second))
4. A fourth embodiment (with a pixel dividing portion (the Third))
5. A fifth embodiment (with an electrode under a photoelectric conversion film)
6. A sixth embodiment (with an electrode under a photoelectric conversion film (a front surface illumination type))
7. A seventh embodiment (in a case of using an off substrate)
8. An eighth embodiment (in a case of laminating a photoelectric conversion film (the First))
9. A ninth embodiment (in a case of laminating a photoelectric conversion film (the Second))
10. A tenth embodiment (in a case of laminating a photoelectric conversion film (the Third))
11. An eleventh embodiment (light blocking with a combination a photoelectric conversion film and a color filter (the First))
12. A twelfth embodiment (light blocking with a combination a photoelectric conversion film and a color filter (the Second))
13. Others 1. A First Embodiment (a Case where a Photoelectric Conversion Film has a Light Blocking Function)

A. A Device Configuration

A-1. A Configuration of Main Portions of a Camera

Figure 1:
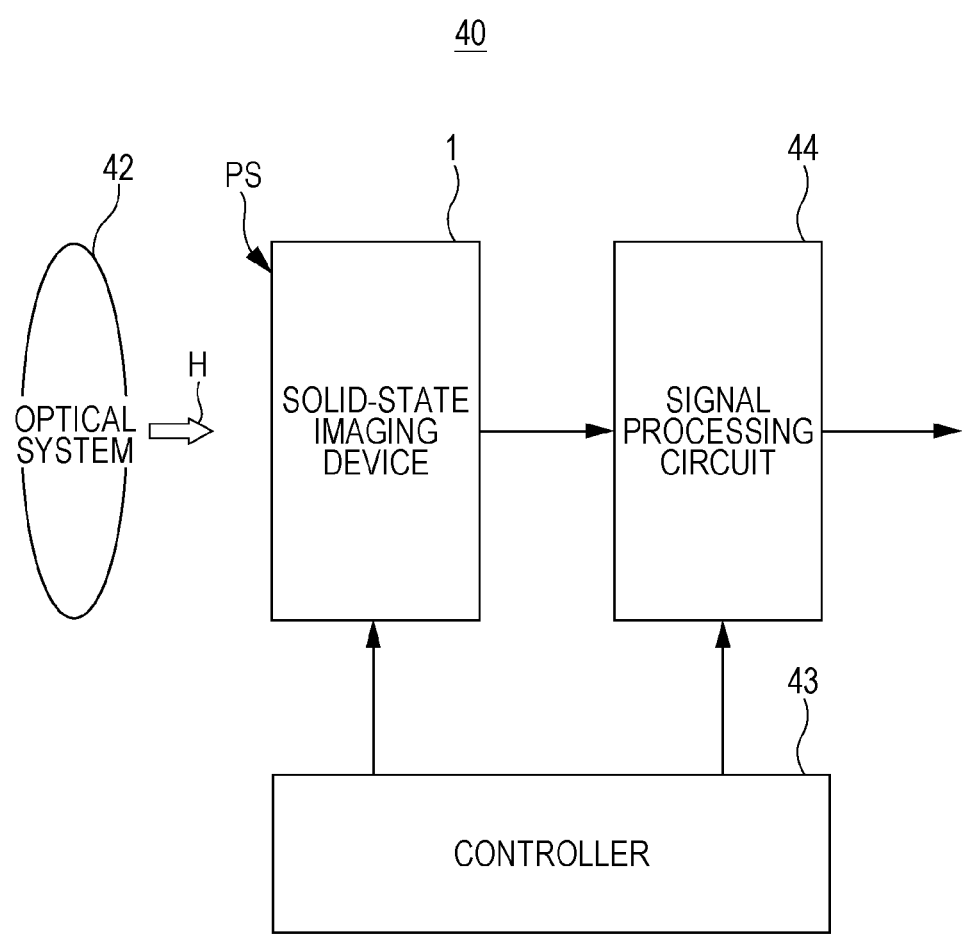
FIG. 1 is a diagram illustrating a configuration of a camera according to a first embodiment.

FIG. 1 is a diagram illustrating a configuration of a camera 40 according to the first embodiment.

As shown in FIG. 1, the camera 40 includes a solid-state imaging device 1, an optical system 42, a control unit 43 (or controller 43), and a signal processing circuit 44. Each portion will be described sequentially.

The solid-state imaging device 1 senses light (subject image) passing through the optical system 42 using an imaging surface PS and performs a photoelectric conversion for the light, thereby generating signal charges. Here, the solid-state imaging device 1 is driven in response to a control signal output from the control unit 43. Specifically, the solid-state imaging device 1 reads out the signal charges and outputs the read-out signal charges as raw data.

The optical system 42 includes optical members such as an imaging lens and a diaphragm, and is disposed so as to collect the incident light H which is incident as a subject image, on the imaging surface PS of the solid-state imaging device 1.

The control unit 43 outputs various kinds of control signals to the solid-state imaging device 1 and the signal processing circuit 44 so as to control and drive the solid-state imaging device 1 and the signal processing circuit 44.

The signal processing circuit 44 performs a signal process for an electric signal output from the solid-state imaging device 1 and thus generates a digital image of a subject image.

A-2. A Configuration of Main Portions of the Solid-State Imaging Device

An entire configuration of the solid-state imaging device 1 will be described.

Figure 2:
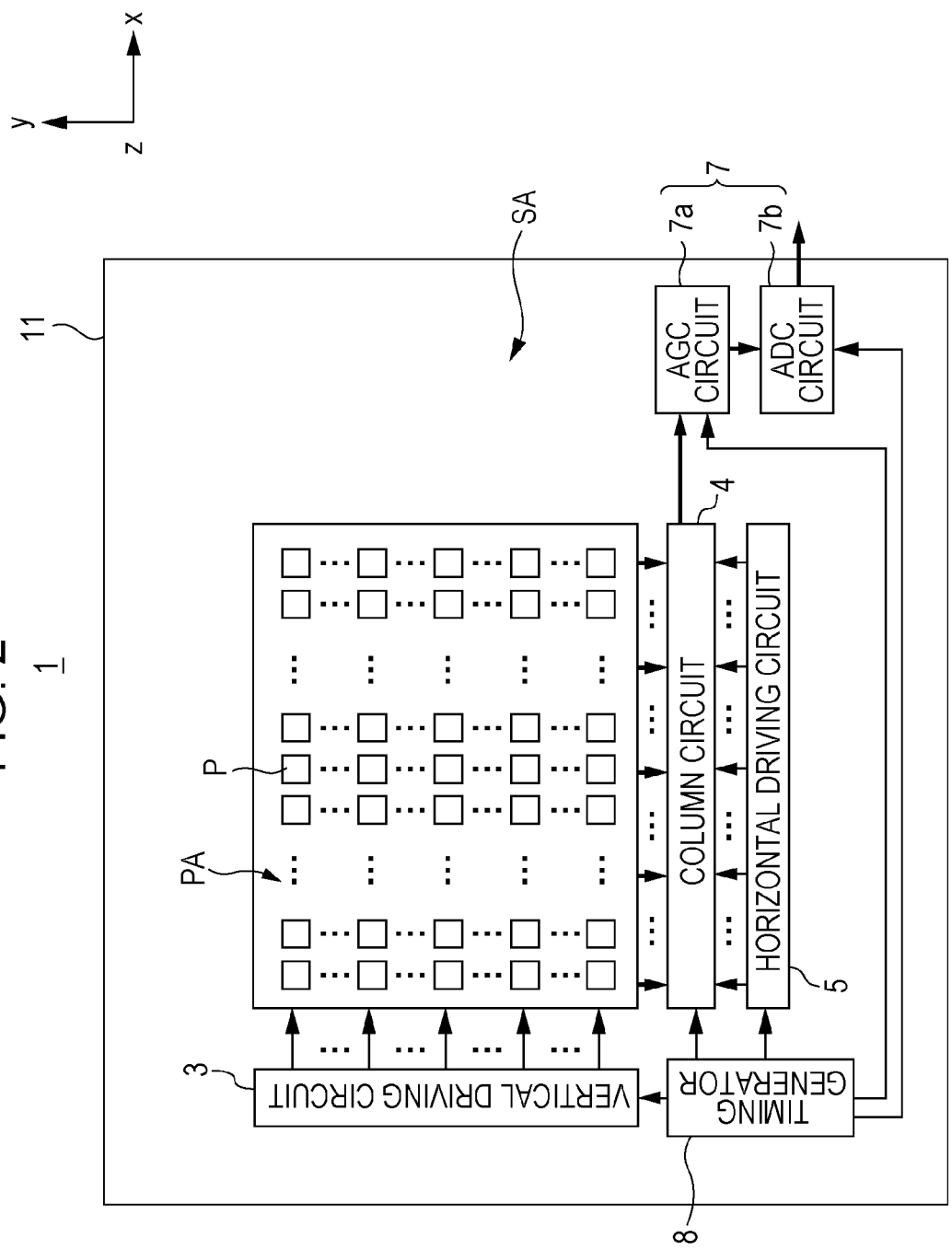
FIG. 2 is a block diagram illustrating an entire configuration of a solid-state imaging device according to the first embodiment.

FIG. 2 is a block diagram illustrating the entire configuration of the solid-state imaging device 1 according to the first embodiment.

The solid-state imaging device 1 is constituted by, for example, a CMOS type image sensor. The solid-state imaging device 1 includes a silicon substrate 11 as shown in FIG. 2. The silicon substrate 11 is a semiconductor substrate made of, for example, a monocrystalline silicon semiconductor, and has an imaging area PA and a peripheral area SA on its surface, as shown in FIG. 2.

The imaging area PA has a rectangular shape as shown in FIG. 2, wherein plural pixels P are respectively arranged in the horizontal direction x and the vertical direction y. In other words, the pixels P are arranged in a matrix. The imaging area PA corresponds to the imaging surface PS shown in FIG. 1. Details of the pixels P will be described later.

The peripheral area SA is positioned around the imaging area PA as shown in FIG. 2. Further, peripheral circuits are provided in the peripheral area SA.

Specifically, as shown in FIG. 2, as the peripheral circuits, a vertical driving circuit 3, a column circuit 4, a horizontal driving circuit 5, an outward output circuit 7, and a timing generator 8 are provided.

The vertical driving circuit 3, as shown in FIG. 2, is provided in the side part of the imaging area PA in the peripheral area SA, and is electrically connected to the respective rows of the plural pixels P arranged in the horizontal direction H in the imaging area PA.

The column circuit 4, as shown in FIG. 2, is provided in the lower part of the imaging area PA in the peripheral area SA, and performs signal processes for signals output from the pixels P with column units. Here, the column circuit 4 includes a CDS (correlated double sampling) circuit (not shown), and performs a signal process for removing fixed pattern noise.

The horizontal driving circuit 5 is electrically connected to the column circuit 4 as shown in FIG. 2. The horizontal driving circuit 5 includes, for example, shift registers, and sequentially outputs the signals for each column of the pixels P, which are held in the column circuit 4, to the outward output circuit 7.

The outward output circuit 7, as shown in FIG. 2, is electrically connected to the column circuit 4, and performs a signal process for the signals output from the column circuit 4, and then outputs the processed signals to an external device. The outward output circuit 7 includes an AGC (automatic gain control) circuit 7a and an ADC (analog-to-digital conversion) circuit 7b. In the outward output circuit 7, the AGC circuit 7a gives a gain to the signals and then the ADC circuit 7b converts the analog signals to digital signals for output to the external device.

The timing generator 8, as shown in FIG. 2, is electrically connected to the vertical driving circuit 3, the column circuit 4, the horizontal driving circuit 5, and the outward output circuit 7. The timing generator 8 generates various kinds of pulse signals, and outputs the pulse signals to the respective portions of the vertical driving circuit 3, the column circuit 4, the horizontal driving circuit 5, and the outward output circuit 7 for driving control.

Details thereof will be described later, and the above-described respective portions are operated so as to perform exposure by the "global shutter method." In other words, incident light is sensed by all the pixels P at the same time, and then the global exposure for finishing the sensing is performed without use of a mechanical light blocking unit. In addition, electric signals output from the respective pixels P are read out to the column circuit 4, and then the accumulated signals in the column circuit 4 are selected by the horizontal driving circuit 5 and sequentially output to the outward output circuit 7.

A-3. A Detailed Configuration of the Solid-State Imaging Device

A detailed configuration of the solid-state imaging device according to this embodiment will be described.

Figure 3:
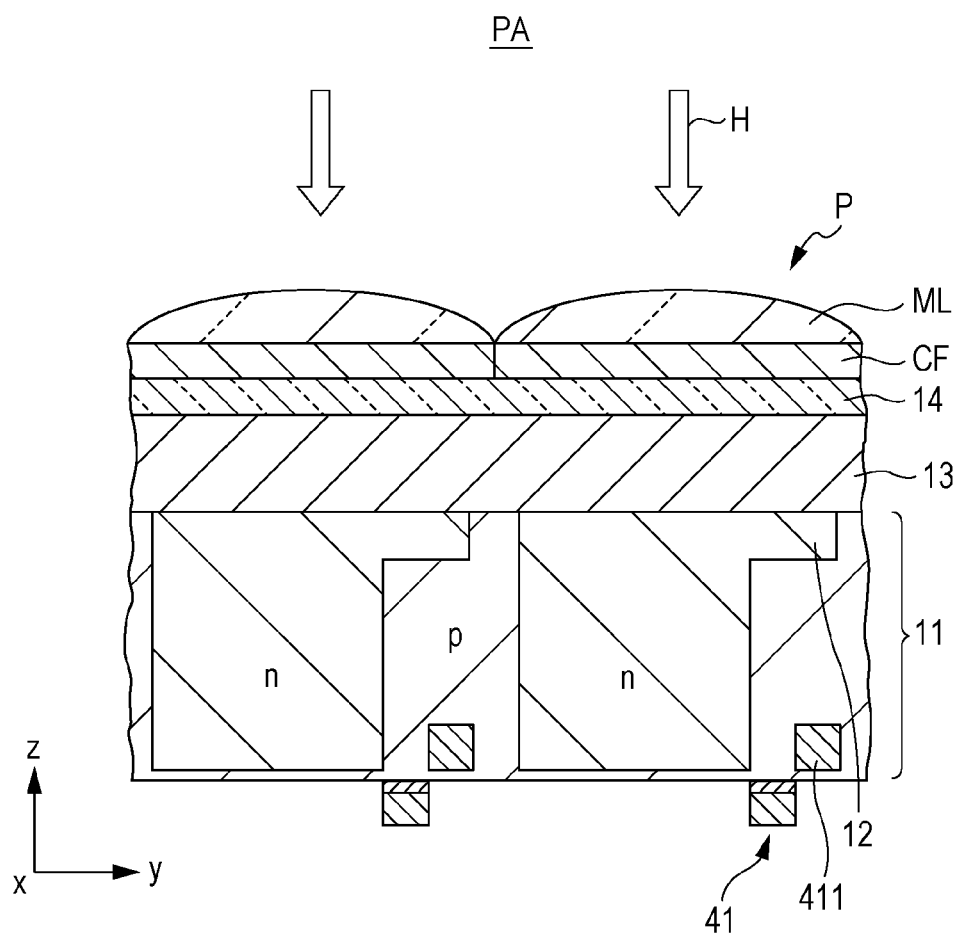
FIG. 3 is a diagram illustrating main portions of the solid-state imaging device according to the first embodiment.
Figure 4:
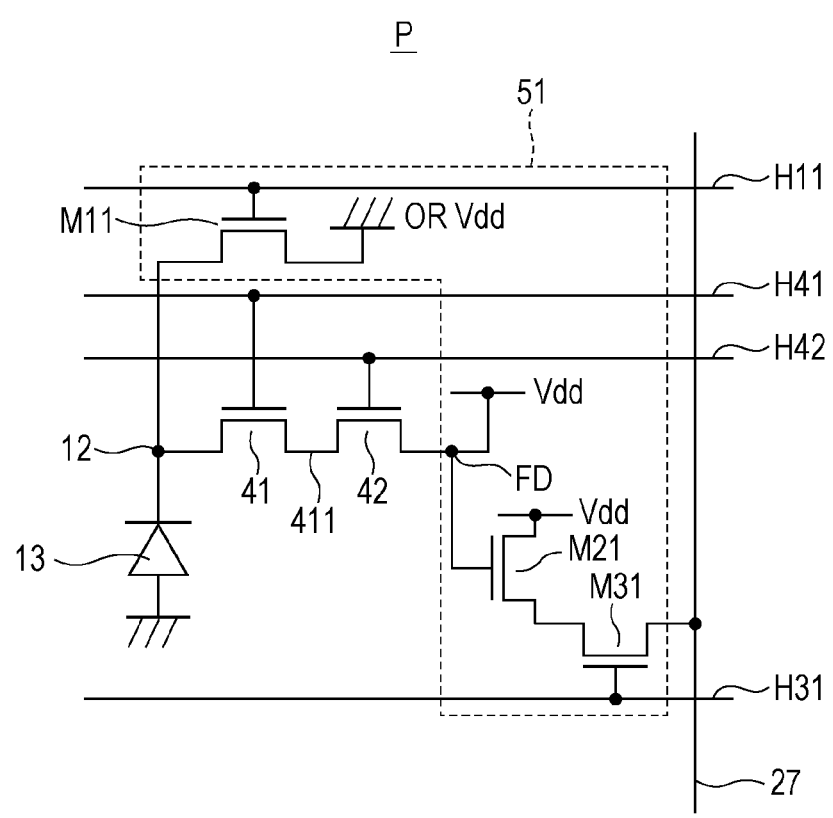
FIG. 4 is a diagram illustrating main portions of the solid-state imaging device according to the first embodiment.

FIGS. 3 and 4 are diagrams illustrating main portions of the solid-state imaging device according to the first embodiment.

Here, FIG. 3 shows a cross-section of the pixels P. FIG. 4 shows a circuit configuration of the pixel P.

As shown in FIG. 3, the solid-state imaging device 1 includes the silicon substrate 11, and a photoelectric conversion film 13 is formed on one side surface (upper surface) of the silicon substrate 11. In addition, on the upper surface, on-chip lenses ML and color filters CF are provided on the silicon substrate 11.

In contrast, a gate MOS 41 is provided on the other side surface (lower surface) of the silicon substrate 11, as shown in FIG. 3. Although not shown in FIG. 3, independent gate MOS 42 and a readout circuit 51 are provided as shown in FIG. 4.

The readout circuit 51, as shown in FIG. 4, includes a PD reset transistor M11, an amplification transistor M21, and a selection transistor M31.

Further, a wire layer (not shown) is provided on the other side surface (lower surface) of the silicon substrate 11 so as to cover the respective portions such as the gate MOS 41.

In the solid-state imaging device 1, the photoelectric conversion film 13 senses the incident light H passing through the on-chip lenses ML and the color filters CF from the rear surface (upper surface) side and generates signal charges. The signal charges generated by the photoelectric conversion film 13 are accumulated in an n type impurity area 12 provided in the silicon substrate 11. Thereafter, the signal charges accumulated in the n type impurity area 12 is transferred to an n type impurity region 411 by the gate MOS 41 and are accumulated in the n type impurity region 411. Also, the signal charges are transferred by the gate MOS 42 and read out by the readout circuit 51, and then output to the vertical signal line 27 as electric signals.

That is to say, the solid-state imaging device 1 is constituted by a "rear surface illumination type CMOS image sensor."

The respective portions will be sequentially described in detail.

A-3-1. The Photoelectric Conversion Film 13

In the solid-state imaging device 1, the photoelectric conversion film 13, as shown in FIG. 3, is provided on the one side surface (upper surface) of the silicon substrate 11 which is, for example, a p type silicon semiconductor. The photoelectric conversion film 13 is formed as a single body over the plural pixels P, as shown in FIGS. 2-3.

Here, the photoelectric conversion film 13 is provided to cover the n type impurity areas 12 which are formed to correspond to the plural pixels P in the silicon substrate 11. As illustrated, the photoelectric conversion film 13 is adjacent to, in contact with, and/or in direct contact with the n-type impurity areas. Each of the n type impurity areas 12 functions as an accumulator which accumulates the signal charges generated by the photoelectric conversion film 13. In the n type impurity area 12, the impurity is preferably distributed such that concentration of the impurity increases from the upper surface to the lower surface of the silicon substrate. In this way, the signal charges (here, electrons) moved from the photoelectric conversion film 13 can be naturally moved to the gate MOS 41 side in the n type impurity area 12.

In addition, as shown in FIG. 3, a transparent electrode 14 is provided on the photoelectric conversion film 13. The transparent electrode 14 is connected to the ground, and thus prevents charging due to the accumulation of holes. In other words, the photoelectric conversion film 13 is interposed between the n type impurity area 12 functioning as a lower electrode and the transparent electrode 14 functioning as an upper electrode.

The photoelectric conversion film 13 senses the incident light H and performs photoelectric conversion for the light in the respective pixels P, thereby generating signal charges.

As shown in FIG. 4, the photoelectric conversion film 13 has an anode connected to the ground, and the accumulated signal charges (here, electrons) are read out through the gate MOS 41, the gate MOS 42 and the readout circuit 51, and output to the vertical signal line 27 as electric signals.

Specifically, the photoelectric conversion film 13 is connected to a gate of the amplification transistor M21 via the gate MOS 41 and the gate MOS 42, as shown in FIG. 4. Further, in the photoelectric conversion film 13, the accumulated signal charges are transferred to a floating diffusion FD connected to the gate of the amplification transistor M21, by the gate MOS 41 and the gate MOS 42 as output signals.

The photoelectric conversion film 13 functions as the accumulator which accumulates the signal charges like the n type impurity area 12 and as a light blocking film which blocks the incident light H from reaching the accumulator, in addition to perform the photoelectric conversion. Along therewith, the photoelectric conversion film 13 functions as a light blocking film which blocks the incident light H which travels towards the readout circuit 51, from reaching the readout circuit 51.

Specifically, the photoelectric conversion film 13 is made of a compound semiconductor having a chalcopyrite structure. For example, the photoelectric conversion film 13 is made of $CuInSe_2$ which is the compound semiconductor having the chalcopyrite structure.

Figure 5:
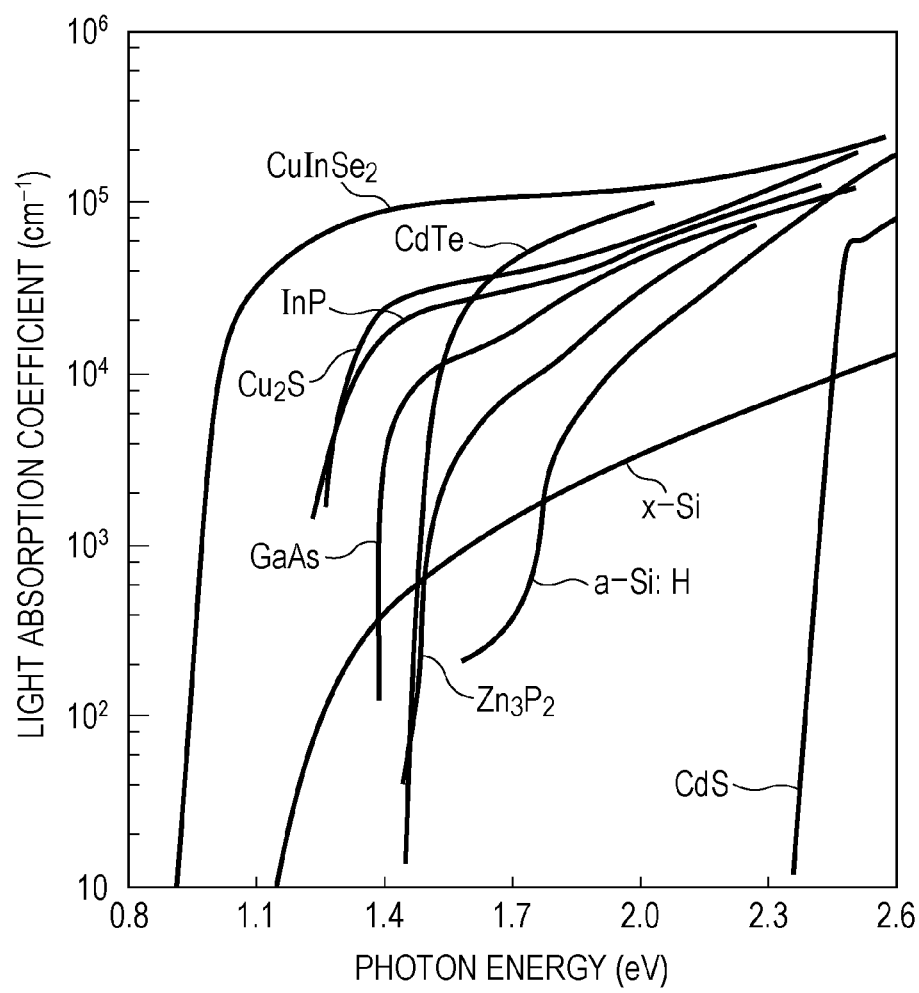
FIG. 5 is a diagram illustrating a relationship between photon energy and a light absorption coefficient.

FIG. 5 is a diagram illustrating a relationship between photon energy and a light absorption coefficient.

As shown in FIG. 5, $CuInSe_2$ is higher than other materials in the light absorption coefficient, and particularly, is double digits higher than the Si single crystal (in the figure, x-Si). For this reason, $CuInSe_2$ suitably functions not only as a photoelectric conversion film but also as a light blocking film which blocks visible light.

The photoelectric conversion film 13 may use materials having any crystal structure such as monocrystalline, polycrystalline or amorphous structures as long as the materials have the higher absorption coefficient of visible light than the silicon substrate 11 and realize the photoelectric conversion function.

The photoelectric conversion film 13 may be formed using chalcopyrite materials other than $CuInSe_2$.

Figure 6:
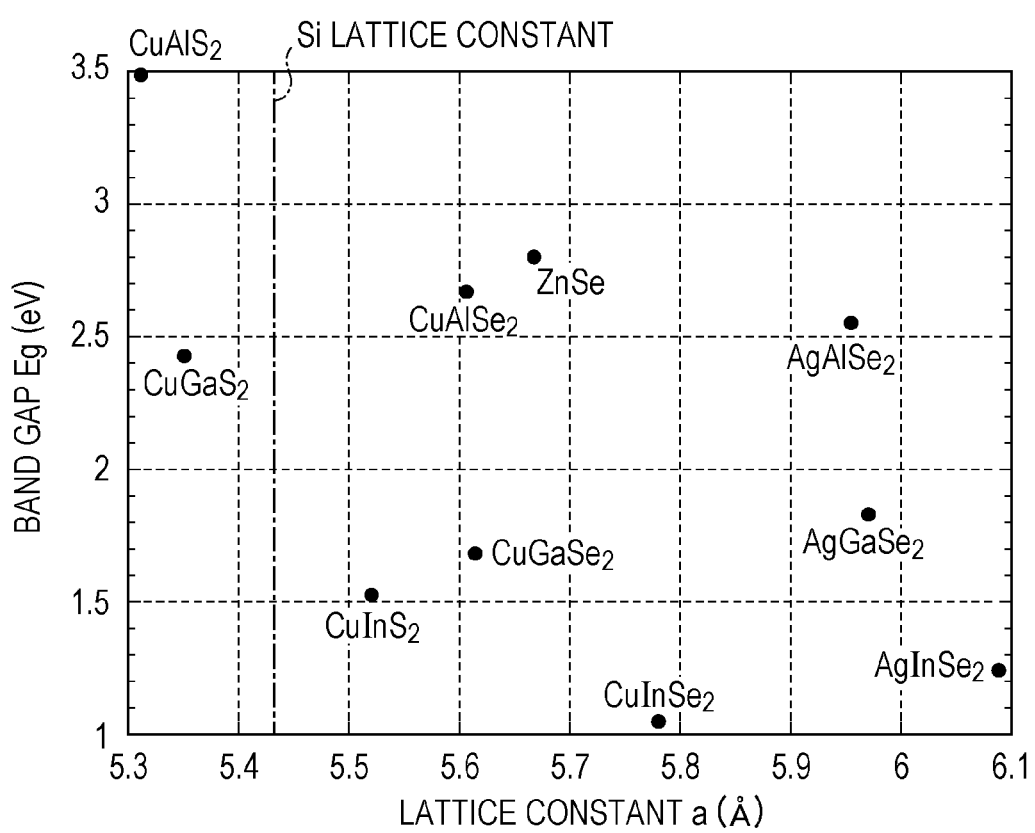
FIG. 6 is a diagram illustrating a relationship between a lattice constant and a band gap regarding a chalcopyrite material.
Figure 7:
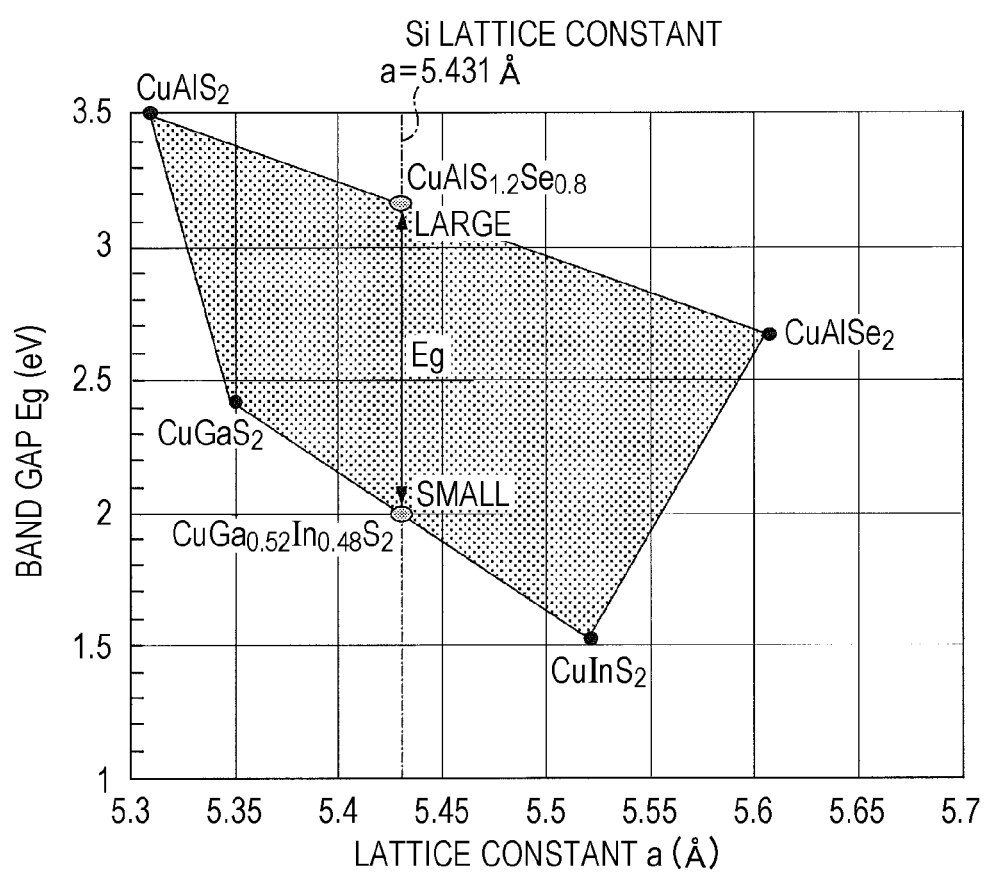
FIG. 7 is a diagram illustrating a relationship between a lattice constant and a band gap regarding a chalcopyrite material.

FIGS. 6 and 7 are diagrams illustrating a relationship between a lattice constant and a band gap regarding the chalcopyrite materials.

As shown in FIG. 6, various chalcopyrite materials are shown. Of them, as shown in FIG. 7, for example, the photoelectric conversion film 13 may be made of a compound semiconductor with the chalcopyrite structure including copper-aluminum-gallium-indium-sulfur-selenium based mixed crystal. The copper-aluminum-gallium-indium-sulfur-selenium based mixed crystal can be formed through the control of the composition so as to correspond with the lattice constant of silicon (Si), and thus a crystal defect can be reduced. That is to say, since the copper-aluminum-gallium-indium-sulfur-selenium based mixed crystal can be epitaxially grown on the silicon substrate 11 as a monocrystalline thin film, and thus a crystal defect such as a misfit dislocation occurring at a heterointerface, it is possible to suppress generation of dark currents and reduce noise.

In addition to the above-described compound semiconductor, the photoelectric conversion film 13 may be formed using a compound semiconductor with the chalcopyrite structure including a copper-aluminum-gallium-indium-zinc-sulfur-selenium based mixed crystal.

Figure 8:
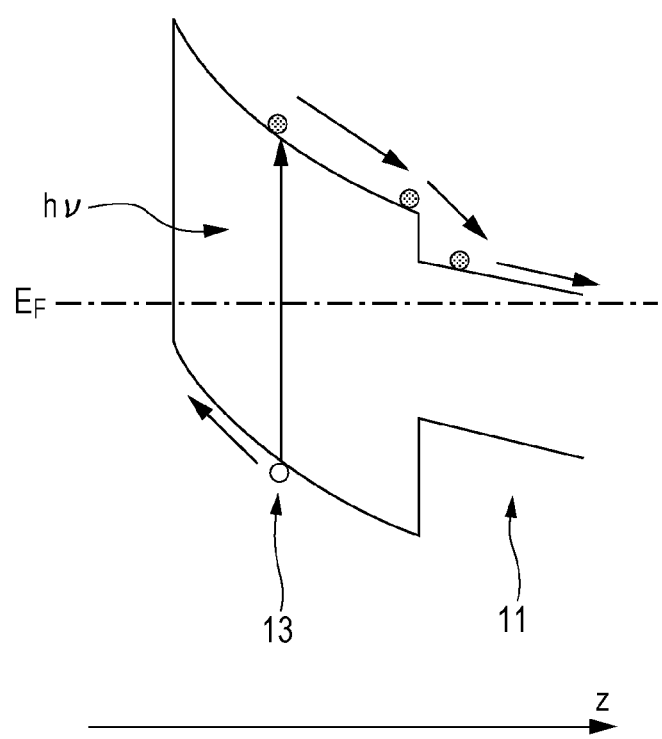
FIG. 8 is a diagram illustrating a band structure of the solid-state imaging device according to the first embodiment.

FIG. 8 is a diagram illustrating a band structure of the solid-state imaging device according to the first embodiment.

FIG. 8 shows a band structure for parts of the photoelectric conversion film 13 and the silicon substrate 11. In other words, a band structure in the depth direction z of the photoelectric conversion film 13 and the silicon substrate 11 is shown.

As shown in FIG. 8, in the depth direction z, the band is formed to be tilted with respect to the photoelectric conversion film 13. Due to this, accumulated electrons are easily moved to the silicon substrate 11 side.

The conductivity type of the photoelectric conversion film 13 is, for example, a p type. The photoelectric conversion film 13 may be of an i type or an n type, in addition to the p type.

A-3-2. The Gate MOS 41 and the Gate MOS 42

In the solid-state imaging device 1, the gate MOS 41 and the gate MOS 42 are provided for each of the plural pixels P shown in FIG. 2, as shown in FIG. 4.

The gate MOS 41 and the gate MOS 42 output the generated signal charges to the gate of the amplification transistor M21 as the electric signals. Specifically, the gate MOS 41 and the gate MOS 42, as shown in FIG. 4, are provided to be interposed between the photoelectric conversion film 13 and the floating diffusion FD. The gate MOS 41 and the gate MOS 42 transfer the signal charges to the floating diffusion FD as output signals when the gates are applied with readout signals from the readout lines H41 and H42.

Here, the gate MOS 41 is provided on the opposite surface (front surface) side to the surface (rear surface) on which the photoelectric conversion film 13 is provided in the silicon substrate 11, as shown in FIG. 3. Although not shown in FIG. 3, like the gate MOS 41, the gate MOS 42 is provided on the opposite surface (front surface) side to the surface (rear surface) on which the photoelectric conversion film 13 is provided in the silicon substrate 11.

The gate MOS 41 and the gate MOS 42 have active areas (not shown) formed in the silicon substrate 11, and the gates thereof are made of conductive materials.

A-3-3. The Readout Circuit 51

In the solid-state imaging device 1, the readout circuits 51 are disposed in plurality so as to correspond to the plural pixels P shown in FIG. 2.

As shown in FIG. 4, the readout circuit 51 includes the PD reset transistor M11, the amplification transistor M21, and the selection transistor M31, and reads out the signal charges through the gate MOS 41.

Although not shown in FIG. 3, the respective transistors M11, M21 and M31 constituting the readout circuit 51, like the gate MOS 41, is provided on the opposite surface (front surface) side to the surface (rear surface) on which the photoelectric conversion film 13 is provided in the silicon substrate 11. The respective transistors M11, M21 and M31 have, for example, active areas (not shown) formed in the silicon substrate 11, and the gates thereof are made of conductive materials.

In the readout circuit 51, the PD reset transistor M11 resets a potential at the photoelectric conversion film 13.

Specifically, the PD reset transistor M11, as shown in FIG. 4, has a gate connected to a PD reset line H11 which is supplied with a PD reset signal. In addition, the PD reset transistor M11 is electrically connected to the photodiode which has one terminal connected to the ground and the other terminal which is formed of the photoelectric conversion film 13. The PD reset transistor M11 resets a potential at the photodiode in response to the PD reset signal output from the PD reset line H11.

In the readout circuit 51, the amplification transistor M21 amplifies and outputs the electric signals resulting from the signal charges.

Specifically, the amplification transistor M21, as shown in FIG. 4, has a gate connected to the floating diffusion FD. In addition, the amplification transistor M21 has a drain connected to a power source potential supply line Vdd, and a source connected to the selection transistor M31. The amplification transistor M21 is supplied with a constant current from a constant current source (not shown) when the selection transistor M31 is turned on, and thus works as a source follower. For this reason, the amplification transistor M21 amplifies the output signals from the floating diffusion FD when the selection signal is supplied to the selection transistor M31.

In the readout circuit 51, the selection transistor M31 outputs the electric signals output from the amplification transistor M21 to the vertical signal line 27 when the selection signal is input to the selection transistor M31.

Specifically, as shown in FIG. 4, the selection transistor M31 has a gate connected to a selection line H31 which is supplied with the selection signal. The selection transistor M31 is turned on when the selection signal is supplied, and outputs the output signals amplified by the amplification transistor M21 to the vertical signal line 27 as described above.

A-3-4. Others

In addition, as shown in FIG. 3, the color filter CF and the on-chip lens ML are provided on the upper surface (rear surface) side of the silicon substrate 11 so as to correspond to the pixel P.

Here, the color filter CF includes filters of the three primary colors, for example, a red filter layer (not shown), a green filter layer (not shown), and a blue filter layer (not shown). Further, the filters of the three primary colors are disposed for each pixel P, for example, in the Bayer arrangement. The arrangement of the filter layers of the respective colors is not limited to the Bayer arrangement, but may be other arrangements.

As shown in FIG. 3, the on-chip lens ML is provided over the upper surface of the silicon substrate 11 via the photoelectric conversion film 13, the transparent electrode 14, and the color filter CF. The on-chip lens ML is provided to protrude upwards in the convex shape from the silicon substrate 11, and collects the incident light H coming from above on the photoelectric conversion film 13.

Although not shown in the figure, the wire layer (not shown) is provided on the lower surface (front surface) of the silicon substrate 11 to cover the respective portions such as the gate MOS 41. In the wire layer, a wire (not shown) electrically connected to each circuit element is formed inside an insulating layer (not shown). Specifically, the respective wires constituting the wire layer are laminated and formed so as to function as a wire such as the readout line H41 shown in FIG. 4.

B. Manufacturing Method

The essence of the manufacturing method of the solid-state imaging device 1 will be described.

Figure 9A:
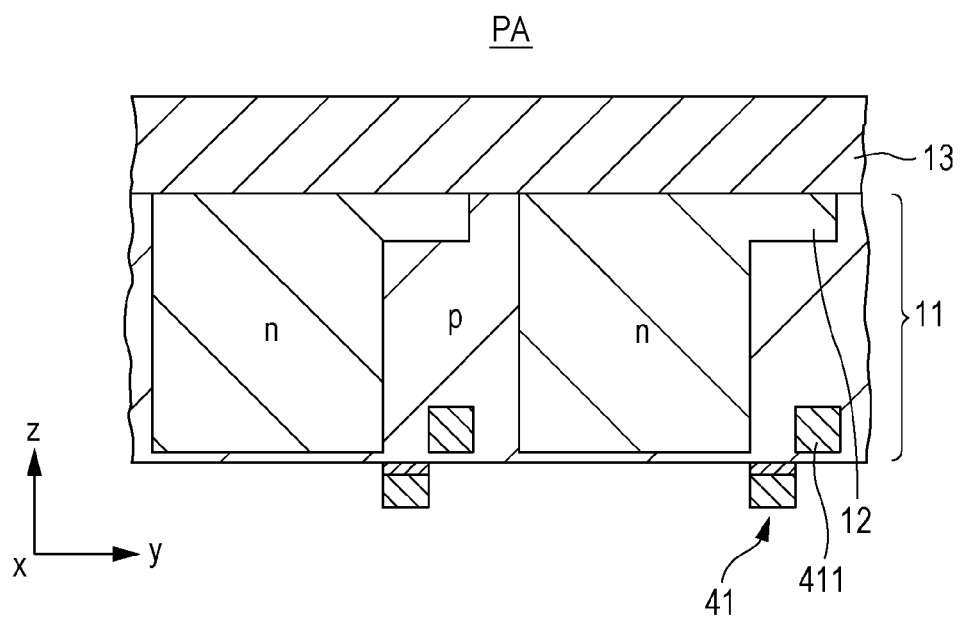
FIGS. 9A and 9B are diagrams illustrating a manufacturing method of the solid-state imaging device according to the first embodiment.
Figure 9B:
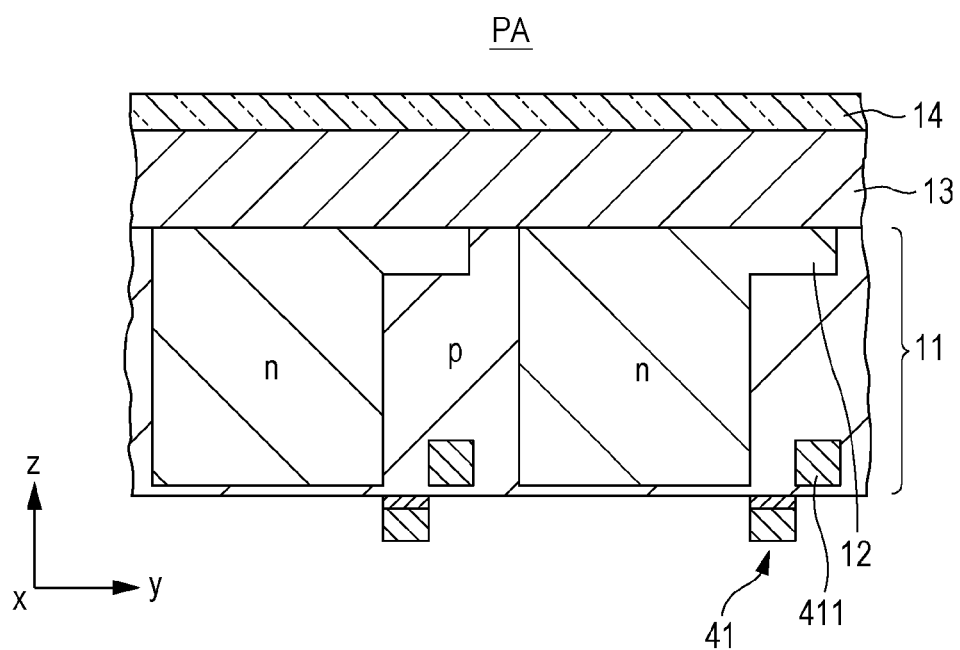

FIGS. 9A and 9B are diagrams illustrating a manufacturing method of the solid-state imaging device according to the first embodiment.

Here, FIGS. 9A and 9B show the cross-sections in the same manner as FIG. 3, and the solid-state imaging device 1 shown in FIG. 3 is manufactured through the respective steps shown in FIGS. 9A and 9B.

B-1. Formation of the Photoelectric Conversion Film 13

First, the photoelectric conversion film 13 is formed as shown in FIG. 9A.

Here, the respective portions such as the gate MOS 41 are formed on the surface of the silicon substrate 11 before the photoelectric conversion film 13 is formed. Further, the wire layer (not shown) is formed on the surface (front surface) of the silicon substrate 11 so as to cover the respective portions such as the gate MOS 41.

In this embodiment, the respective portions are formed on a silicon layer of a so-called SOI substrate (corresponding to the silicon substrate 11), and then the silicon layer is transcribed onto a surface of another glass substrate (not shown). Thereby, the rear surface side of the silicon substrate 11 which is the silicon layer is seen and (100) surface is exposed. The n type impurity area 12 is formed inside or within a portion of the silicon substrate 11.

Next, as shown in FIG. 9A, the photoelectric conversion film 13 is formed on the opposite surface (rear surface) to the surface on which the respective portions such as the gate MOS 41 are formed in the silicon substrate 11.

The photoelectric conversion film 13 is made of the compound semiconductor with the chalcopyrite structure including, for example, $CuInSe_2$ mixed crystal.

In addition, a compound semiconductor with the chalcopyrite structure including copper-aluminum-gallium-indium-sulfur-selenium based mixed crystal may be formed on the silicon substrate 11 so as to lattice-match with the silicon substrate 11, thereby forming the photoelectric conversion film 13.

In this case, the compound semiconductor is epitaxially grown on the silicon substrate 11 by, for example, an MBE method, an MOCVD method, or the like, thereby forming the photoelectric conversion film 13.

The lattice constant of silicon (Si) is 5.431 Å. The CuAlGaInSSe based mixed crystal includes a material corresponding to the lattice constant, and can be formed so as to lattice-match with the silicon substrate 11. Thereby, for example, a $CuGa_{0.52}In_{0.48}S_2$ film is formed on the silicon substrate 11 as the photoelectric conversion film 13.

The photoelectric conversion film 13 is formed so as to have, for example, a p type as a conductivity type. In addition to the p type, the photoelectric conversion film 13 may be formed to have an i type or an n type as the conductivity type.

In this embodiment, the p type $CuGa_{0.52}In_{0.48}S_2$ film is formed and then the photoelectric conversion film 13 is formed such that, for example, concentration of zinc (Zn) which is an n type impurity is reduced according to the crystal growth. Thereby, the photoelectric conversion film 13 can be formed such that the band is tilted in the depth direction z.

The photoelectric conversion film 13 is formed such that the concentration of the impurity becomes, for example, $10^{14}$ to $10^{16}$ $cm^{-3}$. In addition, the photoelectric conversion film 13 is formed such that the film thickness becomes 300 nm.

The photoelectric conversion film 13 is formed to cover parts where pixel dividing portions PB are formed on the silicon substrate by epitaxially growing the compound semiconductor.

In the above description, although the case where the n type impurity is contained in the $CuGa_{0.52}In_{0.48}S_2$ film is described, this embodiment is not limited thereto. For example, by appropriately controlling each amount of a group III and a group I to be supplied, the photoelectric conversion film 13 can be formed such that the band is tilted in the depth direction z as in the above description.

Figure 10:
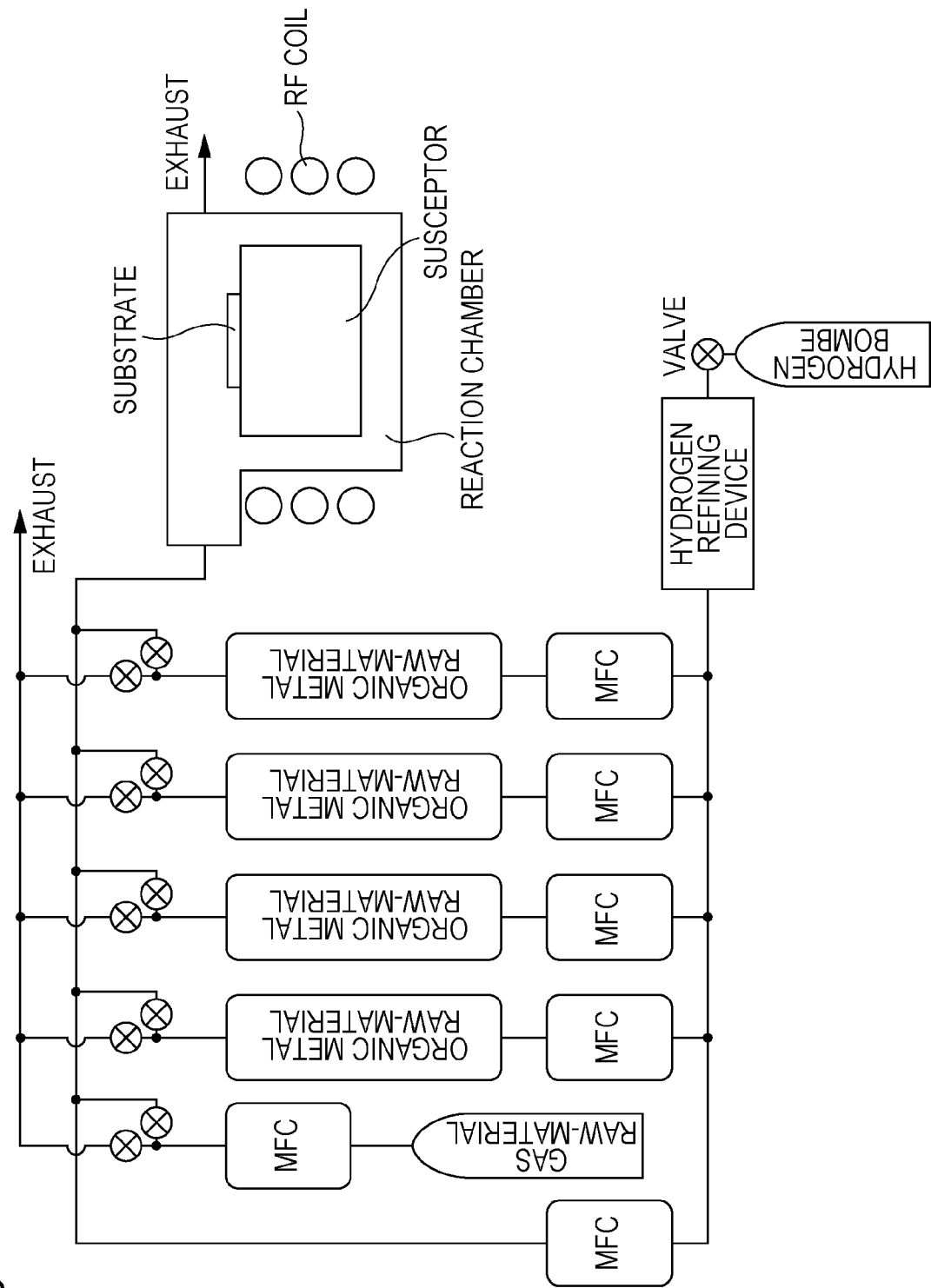
FIG. 10 shows a MOCVD device used in the first embodiment.

FIG. 10 is a diagram illustrating an MOCVD device used in the first embodiment.

In a case where the above-described compound semiconductor is crystal-grown by the MOCVD growth method, for example, the MOCVD device shown in FIG. 10 is used.

If the above-described crystal is grown on the substrate (silicon substrate), the substrate can be placed on a susceptor (made of carbon) as shown in FIG. 10. The susceptor is heated by a high frequency heating device (RF coils), and a temperature of the substrate is controlled. For example, the substrate is heated in a temperature range of 400° C. to 1000° C. where thermal decomposition can occur.

In addition, organic metal raw-materials are bubbled by hydrogen to enter a saturated vapor pressure state, and each raw-material molecule is transferred to a reaction tube. Here, a flow rate of hydrogen which flows towards each raw-material due to a mass flow controller (MFC) is controlled, and a molar amount of the raw-material which is transferred per unit of time is adjusted. The organic metal raw-materials are thermally decomposed on the substrate and grow the crystal. There is a correlation between a ratio of transferred molar amount and a composition ratio of the crystal. Thereby, the composition ratio of the crystal can be arbitrarily adjusted.

As raw gases, the following organic metals may be used.

Specifically, as an organic metal of copper, for example, acetylacetone copper ($Cu(C_5H_7O_2)_2$) is used. In addition, cyclopentadienyl copper triethylene (h5-($C_2H_5$) Cu:P ($C_2H_5$)$_3$) may be used.

As an organic metal of gallium (Ga), for example, trimethyl gallium ($Ga(CH_3)_3$) is used. In addition, triethyl gallium ($Ga(C_2H_5)_3$) may be used.

As an organic metal of aluminum (Al), for example, trimethyl aluminum ($Al(CH_3)_3$) is used. In addition, triethyl aluminum ($Al(C_2H_5)_3$) may be used.

As an organic metal of indium (In), for example, trimethyl indium ($In(CH_3)_3$) is used. In addition, triethyl indium ($In(C_2H_5)_3$) may be used.

As an organic metal of selenium (Se), for example, dimethyl selenium ($Se(CH_3)_2$) is used. In addition, diethyl selenium ($Se(C_2H_5)_2$) may be used.

As an organic metal of sulfur (S), for example, dimethyl sulfide ($S(CH_3)_3$) is used. In addition, diethyl sulfide ($S(C_2H_5)_2$) may be used.

As an organic metal of zinc (Zn), for example, dimethyl zinc ($Zn(CH_3)_2$) is used. In addition, diethyl zinc ($Zn(C_2H_5)_2$) may be used.

In addition to the organic metals, for example, as a Se raw-material, hydrogen selenide ($H_2Se$) may be used. Further, as an S raw-material, hydrogen sulfide ($H_2S$) may be used.

In addition, the raw-material such as cyclopentadienyl copper triethylene (h5-($C_2H_5$)Cu:P($C_2H_5$)$_3$), acetylacetone copper ($Cu(C_5H_7O_2)_2$) or trimethyl indium ($In(CH_3)_3$) is in a solid phase state at room temperature. In this case, the raw-material enters a liquid phase state through heating. In addition, even in the solid phase state, the raw-material may be used in a high vapor pressure simply at a high temperature.

Figure 11:
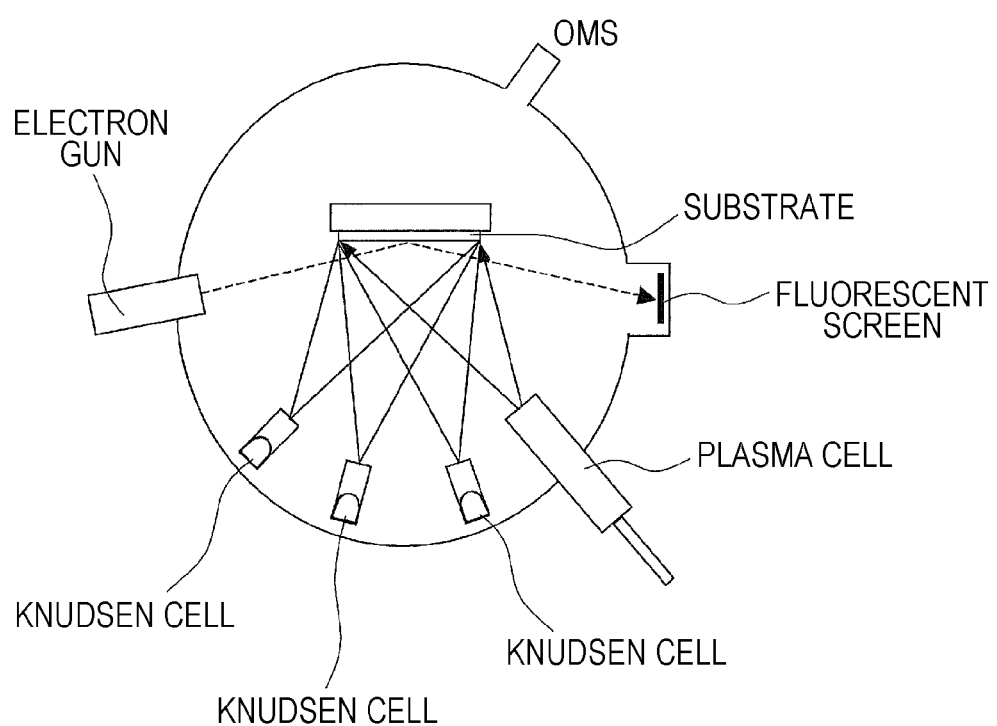
FIG. 11 is an MBE device used in the first embodiment.

FIG. 11 is a diagram illustrating an MBE device used in the first embodiment.

In a case where the above-described compound semiconductor is crystal-grown by the MBE growth method, for example, the MBE device shown in FIG. 11 is used.

In this case, the simple substance raw-material of copper, and each of the simple substance raw-materials of gallium (Ga), aluminum (Al), indium (In), selenium (Se), and sulfur (S) are contained in each Knudsen cell. Further, these raw-materials are heated at an appropriate temperature, and the substrate is irradiated with each of molecular beams so as to perform crystal growth.

In this case, in a raw-material having a particularly high vapor pressure such as sulfur (S), stability of an amount of the molecular beams is lacking. Therefore, in this case, the amount of the molecular beams may be stabilized using a valved cracking cell. In addition, as in the gas source MBE, a portion of raw-materials may use gas sources. For example, as a Se material, hydrogen selenide ($H_2SE$) may be used, and, as a sulfur (S) raw-material, hydrogen sulfide ($H_2S$) may be used.

B-2. Formation of the Transparent Electrode 14

Next, the transparent electrode 14 is formed as shown in FIG. 9B.

Here, the transparent electrode 14 is formed to cover the upper surface of the photoelectric conversion film 13. For example, the transparent electrode 14 is made of indium tin oxide (ITO). In addition, the transparent electrode 14 may be made of a transparent conductive material such as zinc oxide or indium zinc oxide.

The transparent electrode 14 is formed as a single body over the plural pixels P shown in FIG. 2.

Further, as shown in FIG. 3, the respective portions such as the color filters CF and the on-chip lenses ML are formed on the upper surface (rear surface) of the silicon substrate 11. In this way, the rear surface illumination type CMOS image sensor is completed.

C. An Operation

An operation of the solid-state imaging device 1 will be described.

Figure 12:
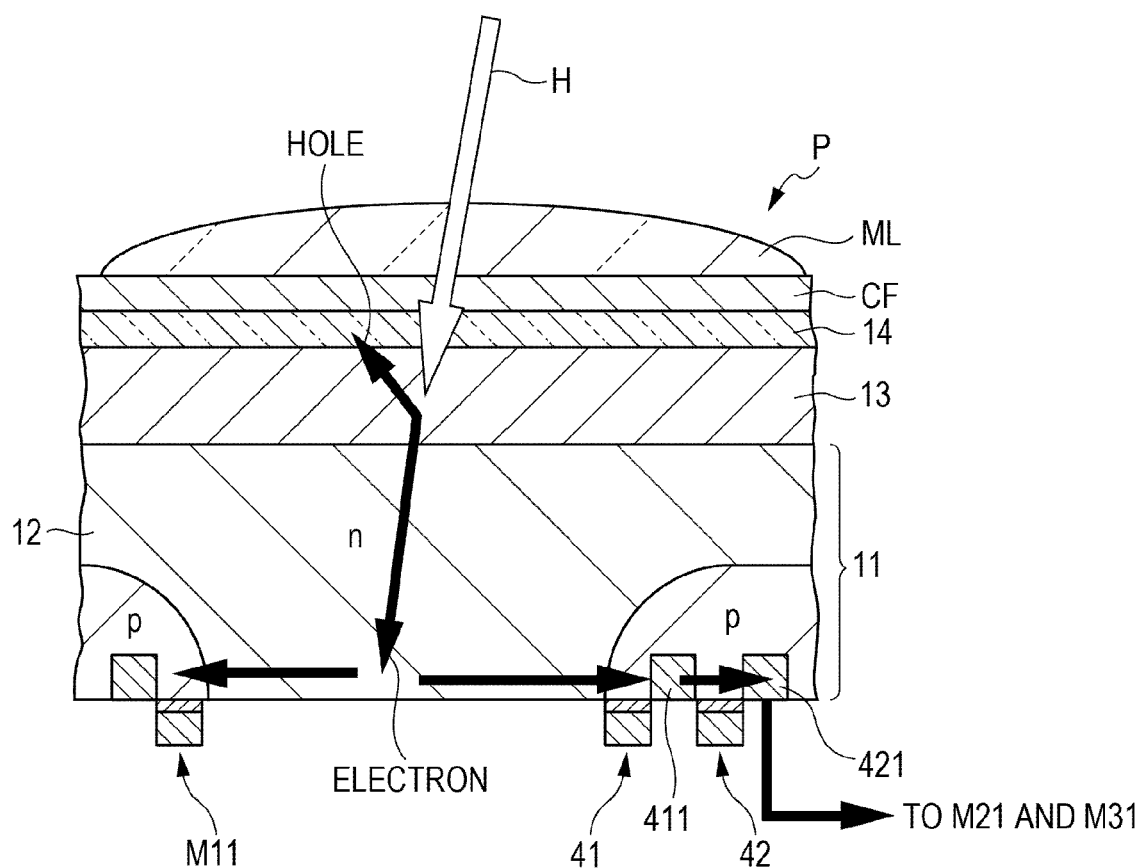
FIG. 12 is a diagram illustrating an operation of the solid-state imaging device according to the first embodiment.
Figure 13:
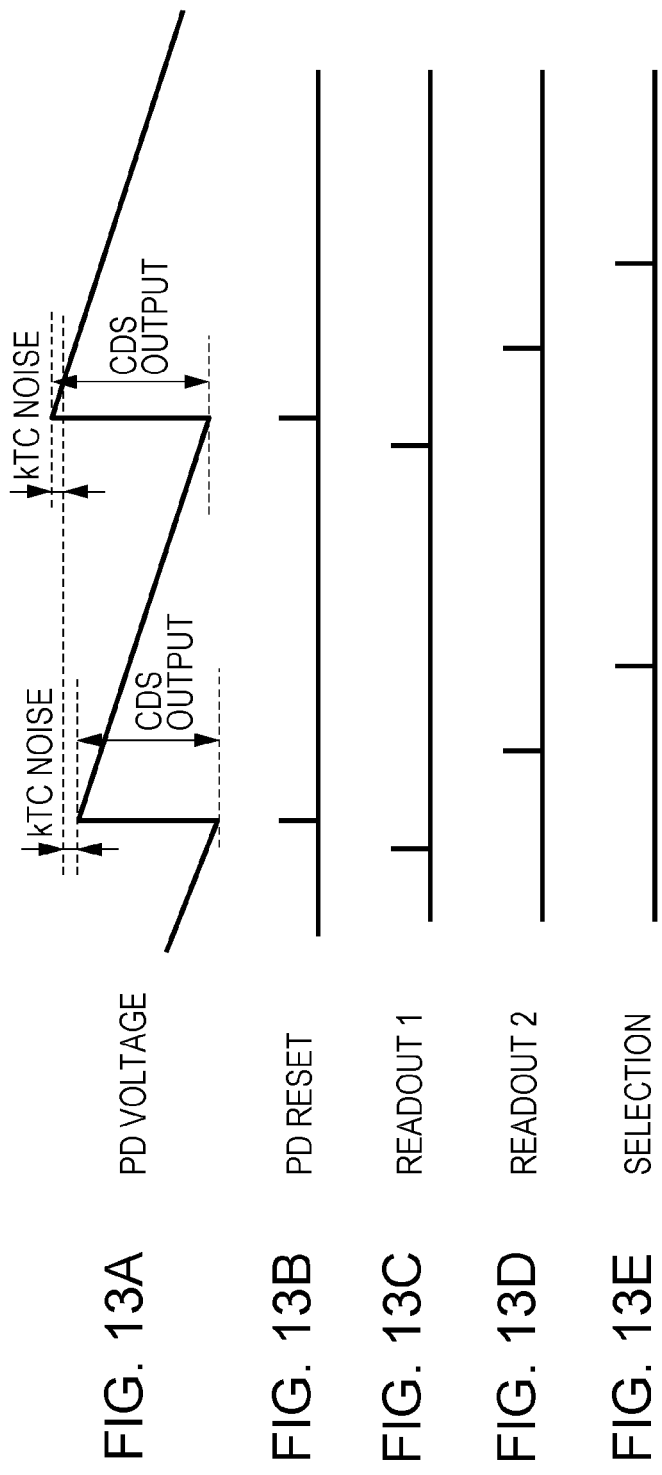
FIGS. 13A to 13E are diagrams illustrating an operation of the solid-state imaging device according to the first embodiment.

FIGS. 12 to 13E are diagrams illustrating an operation of the solid-state imaging device 1 according to the first embodiment.

FIG. 12 is a cross-sectional view and shows movements of electrons or holes when the incident light H enters the photoelectric conversion film 13.

Also, FIGS. 13A to 13E show timing charts. In FIGS. 13A to 13E, FIG. 13A indicates a voltage at the photodiode constituted by the photoelectric conversion film 13 (refer to FIG. 4). FIG. 13B indicates a PD reset signal transmitted to the gate of the PD reset transistor M11 via the PD reset line H11. FIG. 13C indicates a first readout signal transmitted to the gate of the gate MOS 41 via the readout line H41. FIG. 13D indicates a second readout signal transmitted to the gate of the gate MOS 42 via the readout line H42. FIG. 13E indicates a selection signal transmitted to the gate of the selection transistor M31 via the selection line H31. FIGS. 13A to 13E shows that the signals have a high level at the longitudinal lines extending vertically from the transverse lines, and thus the respective transistors are turned on.

As described above, in this embodiment, the global exposure is performed in which the incident light is sensed by all the pixels P at the same time, and then the sensing is finished without using a mechanical light blocking unit. That is to say, the exposure is performed by the "global shutter method."

Specifically, as shown in FIG. 12, the incident light H enters the photoelectric conversion film 13 passing through the respective portions from the upper side of the silicon substrate 11. In the photoelectric conversion film 13 which the incident light H has entered, the generated electrons (signal charges) are moved to the n type impurity area 12 (accumulator 1) of the silicon substrate 11, and the holes are moved to the transparent electrode 14.

In addition, as shown in FIGS. 12 to 13E, the signal charges accumulated in the n type impurity area 12 (accumulator 1) are transferred to the n type impurity region 411 (accumulator 2) by the gate MOS 41, and immediately thereafter, PD reset is made. In other words, the n type impurity area 12 (accumulator 1) is connected to the ground by the PD reset transistor M11, and the potential is reset to the voltage 0V (or, the power source voltage Vdd) (refer to FIG. 4). Furthermore, immediately after the rest, as shown in FIGS. 13A to 13E, the signal charges begin to accumulate.

The signal charges are transferred to the n type impurity region 421 (FD) by the gate MOS 42 and then accumulated.

This operation is performed in all the pixels P. The readout circuit 51 reads out the signal charges for each pixel P and outputs the read-out signal charges to the vertical signal line 27 as electric signals.

In the above description, the fixed pattern noise in the amplification transistor M21 can be removed through the subtraction between the signals before and after the reset by the CDS circuit. However, the PD reset is made immediately after the signal charges accumulated in the n type impurity area 12 (accumulator 1) are transferred to the n type impurity region 411 (accumulator 2). For this reason, a variation in the reset signal voltage which is used as a reference when the CDS process is performed occurs, and thus kTC noise is included.

In this embodiment, the photoelectric conversion film 13 functions as a light blocking film along with the photoelectric conversion function. Thereby, as shown in FIG. 12, the incident light H is blocked from entering the respective n type impurity areas 12 and 411, which function as the accumulators, by the photoelectric conversion film 13. In addition, the incident light H is blocked from entering the readout circuit 51 or the n type impurity region 421 (floating diffusion layer) which functions as a floating diffusion by the photoelectric conversion film 13.

Figure 14:
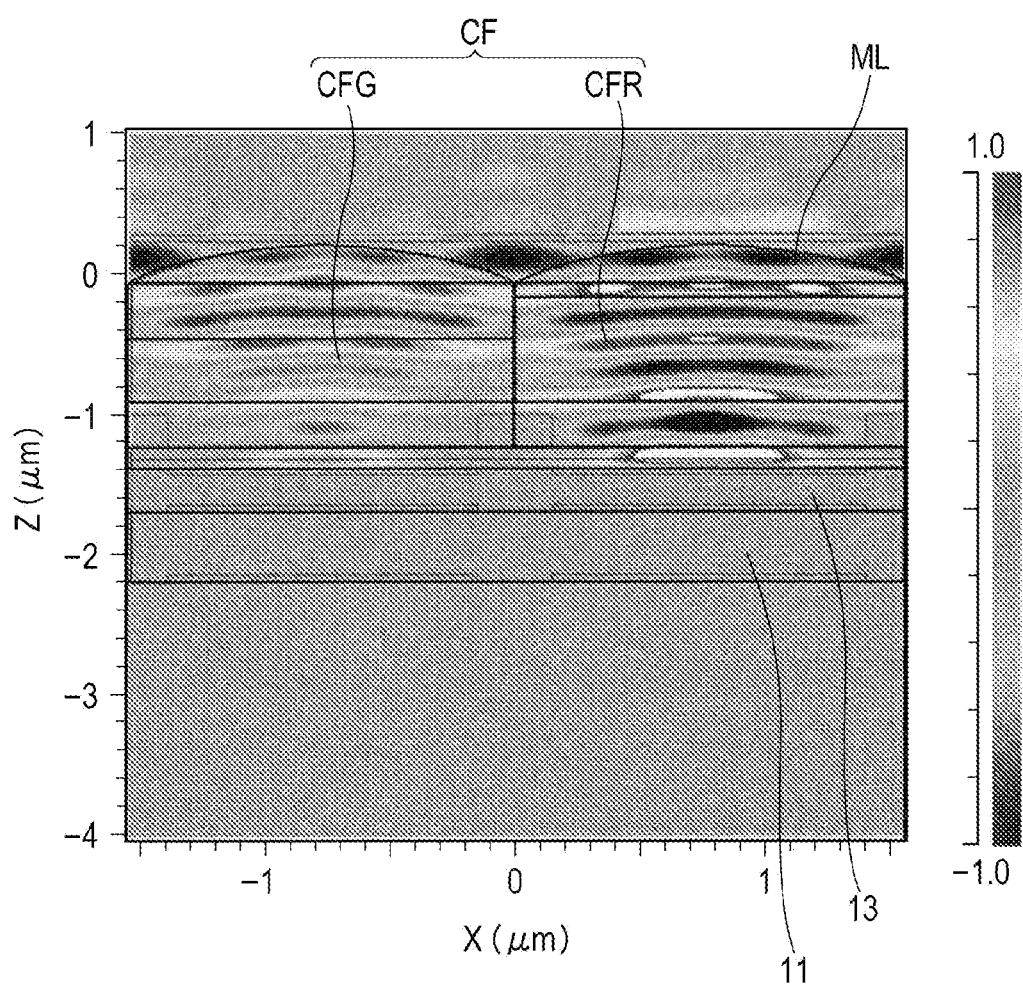
FIG. 14 is a diagram illustrating a simulation result of a form of light traveling in the solid-state imaging device according to the first embodiment.
Figure 60:
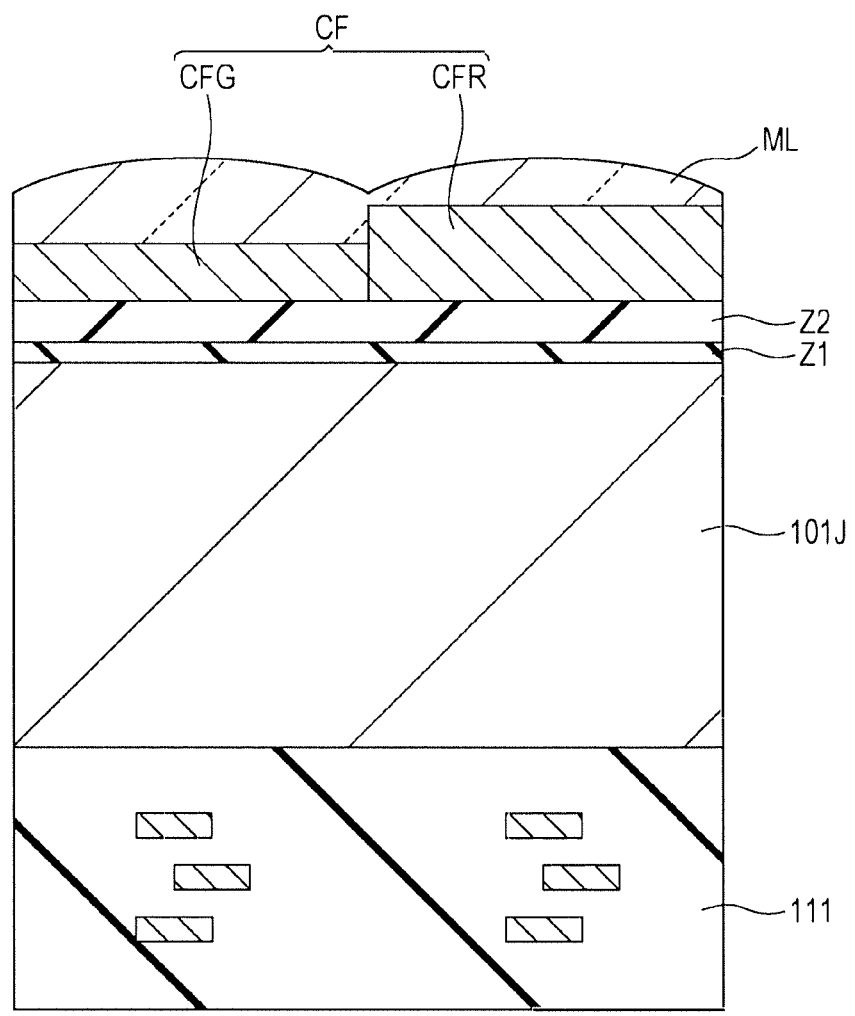
FIG. 60 is a cross-sectional view illustrating a "rear surface illumination type" solid-state imaging device.
Figure 61:
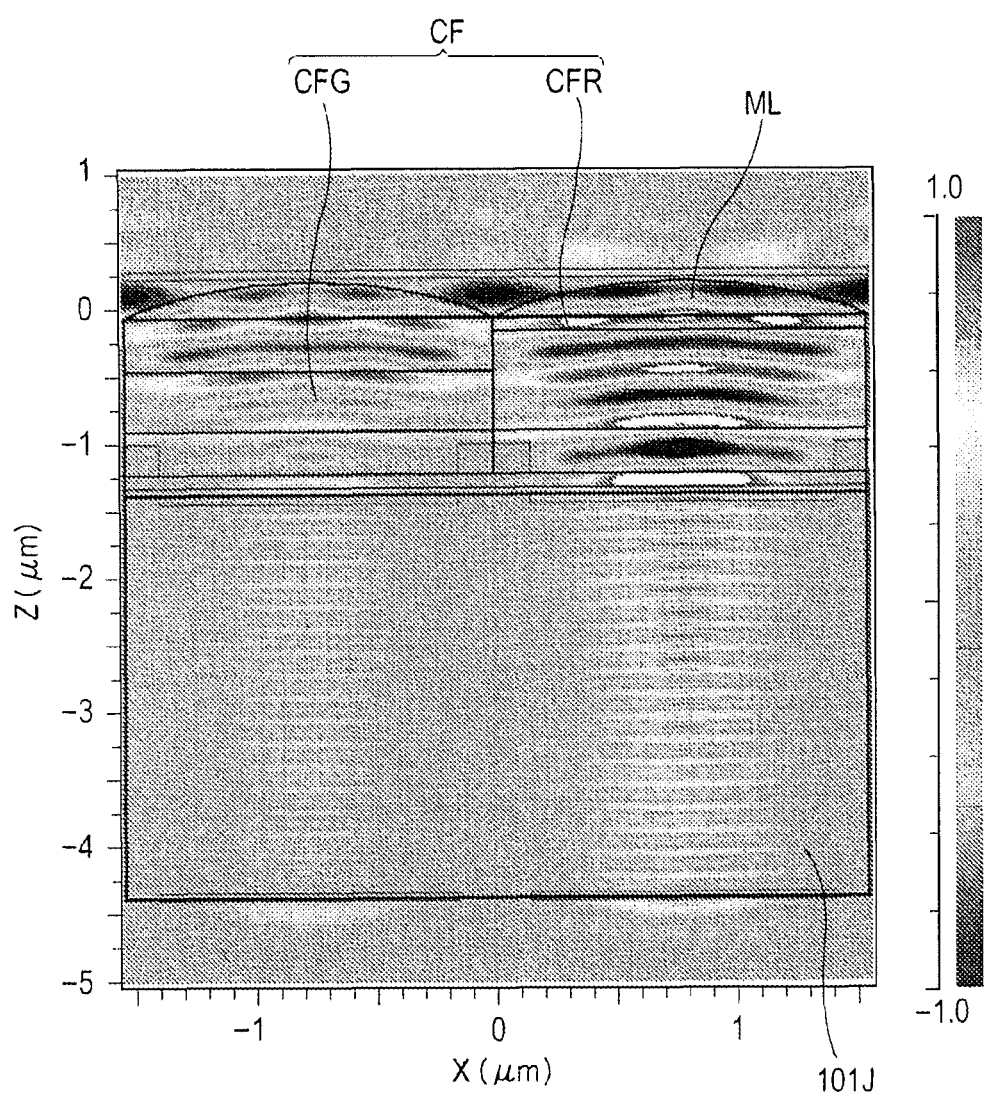
FIG. 61 is a diagram illustrating a simulation result of a form of light traveling in the "rear surface illumination type" solid-state imaging device.

FIG. 14 is a diagram illustrating a simulation result of a form of light traveling in the solid-state imaging device according to the first embodiment. Here, a result is shown when light having the wavelength of 650 nm enters a CuInGaS$_2$ film with the thickness of 0.3 μm which is formed as the photoelectric conversion film 13 on the silicon substrate 11 (0.5 μm thick) as in FIG. 60.

As shown in FIG. 14, in the solid-state imaging device in this embodiment, it can be seen that the incident light is absorbed and blocked by the photoelectric conversion film 13 and thus does not enter the silicon substrate 11. In this case, it can be seen that if a rate of light reaching the bottom of the silicon substrate 11 is specifically estimated, only the light of $1.8 \times 10^{-3}$% reaches, and the light is nearly blocked.

As such, in this embodiment, since the incident light H coming from the upper surface (rear surface) can be blocked, and the light does not reach the respective portions such as the accumulators, it is possible to prevent the generation of noise and improve the image quality of a captured image.

D. Conclusion

As described above, in this embodiment, in the pixels P, the photoelectric conversion film 13 generates the signal charges by sensing and photoelectric-converting the incident light H. The signal charges generated by the photoelectric conversion film 13 are read out by the readout circuit 51. Also, the signal charges generated by the photoelectric conversion film 13 are accumulated in the n type impurity areas 12 and 411 which are the accumulators. Here, the photoelectric conversion film 13 is provided at the side where the incident light H enters when seen from the readout circuit 51 and the n type impurity areas 12 and 411 in the silicon substrate 11, and thus blocks the incident light H from entering the readout circuit 51 and the n type impurity areas 12 and 411.

For this reason, in this embodiment, it is possible to realize a small size, prevent the generation of noise, and improve the image quality of a captured image.

Further, in this embodiment, the pixels P include the photoelectric conversion film 13, and the photoelectric conversion film 13 is made of the compound semiconductor having the chalcopyrite structure. The photoelectric conversion film 13 is formed on the silicon substrate 11 so as to lattice-match with the silicon substrate 11. In this case, since the misfit dislocation occurring in the heterointerface can be reduced, the crystallinity of the photoelectric conversion film 13 is improved. Thus, the crystal defect is reduced, and thereby it is possible to suppress the generation of a dark current and prevent deterioration of the image quality due to white dots. Further, since high sensitivity can be realized, a high quality imaging can be performed even in a dark imaging environment (for example, night time).

In the above description, the definition of the "lattice matching" includes a state close to the lattice matching under a condition of the thickness of the photoelectric conversion film being within a critical film thickness.

In other words, if the thickness is within the critical film thickness, the lattice matching is not completely made, but the crystallinity can become good since the misfit dislocation is not included.

Further, the "critical film thickness" is defined by the equation (1) by "Matthews and Blakeslee" (for example, refer to J. W. Mathews and A. E. Blakeslee, J. Cryst. Growth 27(1974) 118-125) and the equation (2) by "People and Bean" (for example, refer to R. People and J. C. Bean, Appl. Phys. Lett. 47(1985) 322-324). In the following equations, a denotes a lattice constant, b denotes a Burgers vector for dislocation, v denotes a Poisson ratio, and f denotes a lattice mismatching |Δa/a|.

$$h_c = \frac{b}{2\pi f} \frac{1}{(1+v)} \left( \ln \frac{h_c}{b} + 1 \right) \quad (1)$$

$$h_c = \frac{1}{16\pi\sqrt{2}} \frac{1-v}{(1+v)} \frac{b^2}{a} \frac{1}{f^2} \ln \frac{h_c}{b} \quad (2)$$

E. Modified Examples

E-1. A Modified Example 1-1

In the above description, although the case where the photoelectric conversion film 13 is made of the chalcopyrite materials has been described, the present invention is not limited thereto.

The photoelectric conversion film 13 may be made of silicide based materials.

Figure 15:
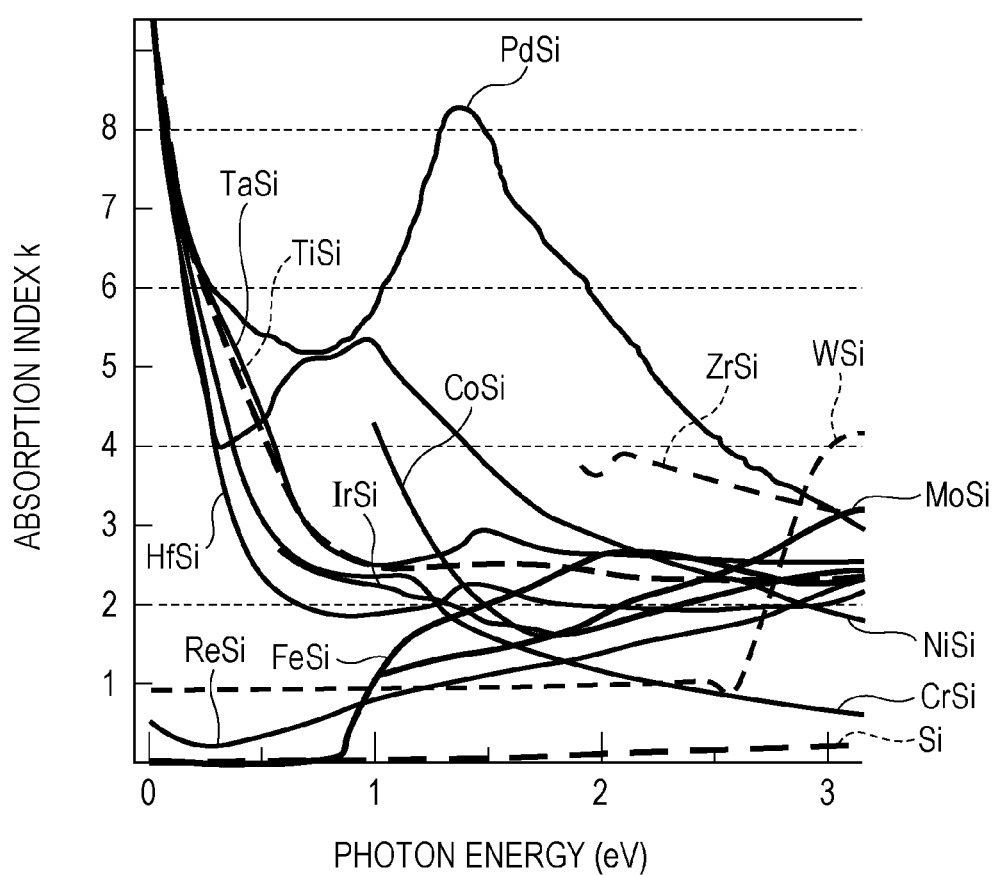
FIG. 15 is a diagram illustrating a relationship between photon energy and an absorption index regarding a silicide material.

FIG. 15 is a diagram illustrating a relationship between the photon energy (eV) and the absorption index k in the silicide materials.

The light absorption coefficient α indicates the following relation with respect to the absorption index k and the wavelength λ.

α=4πk/λ

For this reason, as can be seen from FIG. 15, the silicide based materials such as CoSi, CrSi, HfSi, IrSi, MoSi, NiSi, PdSi, ReSi, TaSi, TiSi, WSi, and ZrSi have a higher light absorption coefficient α than Si.

In addition, a β-iron silicide material (β-FeSi$_2$) is double digits higher than Si in the light absorption coefficient (refer to H. Katsumata, et al., J. Appl. Phys. 80 (10), 5955 (1996)).

In addition, the β-iron silicide material (β-FeSi$_2$) can be epitaxially grown on a silicon substrate (refer to John E. Mahan, et al., Appl. Phys. Lett. 56 (21), 2126 (1990)). Thereby, the photoelectric conversion film 13 can be formed so as to realize both the photoelectric conversion function and the light blocking function by using the β-iron silicide material (β-FeSi$_2$).

Further, a Barium silicide based material (BaSi$_2$) or Ba$_{1-x}$Sr$_x$Si$_2$ is about double digits higher than silicon (Si) in the light absorption coefficient (refer to the following reference). In the same manner, silicide materials such as SiGe, Mg$_2$SiGe, SrSi$_2$, MnSi$_{1.7}$, CrSi$_2$, Ni—Si, Cu/Si, Co/Si, or Pt/Si are higher than Si in the light absorption coefficient.

Therefore, the photoelectric conversion film 13 can be formed so as to also function as a light blocking film by using silicide materials.

In addition to the above-described inorganic materials, the photoelectric conversion film 13 may be formed using organic materials.

For example, quinacridone or coumarin based organic materials, or the like have the light absorption coefficient almost twice higher than Si, and the photoelectric conversion film 13 can be formed so as to have the light blocking function along with the photoelectric conversion function by using them.

E-2. A Modified Example 1-2

In the first embodiment, as described above, the kTC noise is included in the signal, but the kTC noise may be removed as described below.

Figure 16:
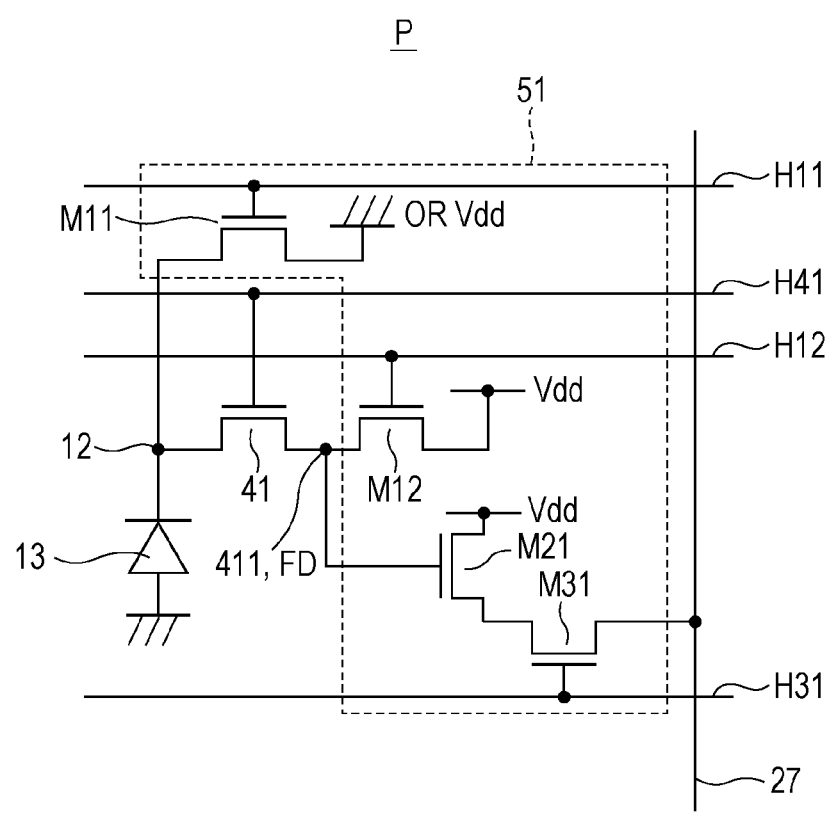
FIG. 16 is a diagram illustrating a circuit configuration of a pixel constituting a solid-state imaging device according to a modified example 1-2 of the first embodiment.

FIG. 16 is a diagram illustrating a circuit configuration of a pixel constituting a solid-state imaging device according to a modified example 1-2 of the first embodiment.

Figure 17:
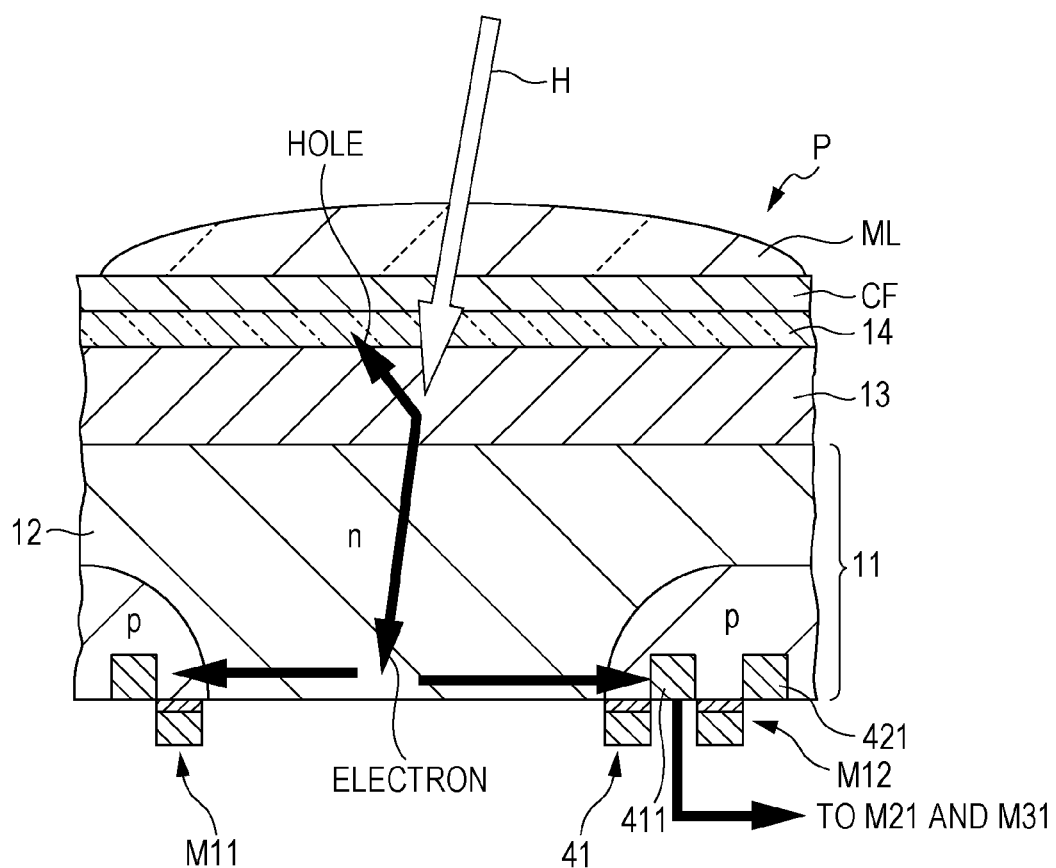
FIG. 17 is a diagram illustrating an operation of the solid-state imaging device according to the modified example 1-2 of the first embodiment.
Figure 18:
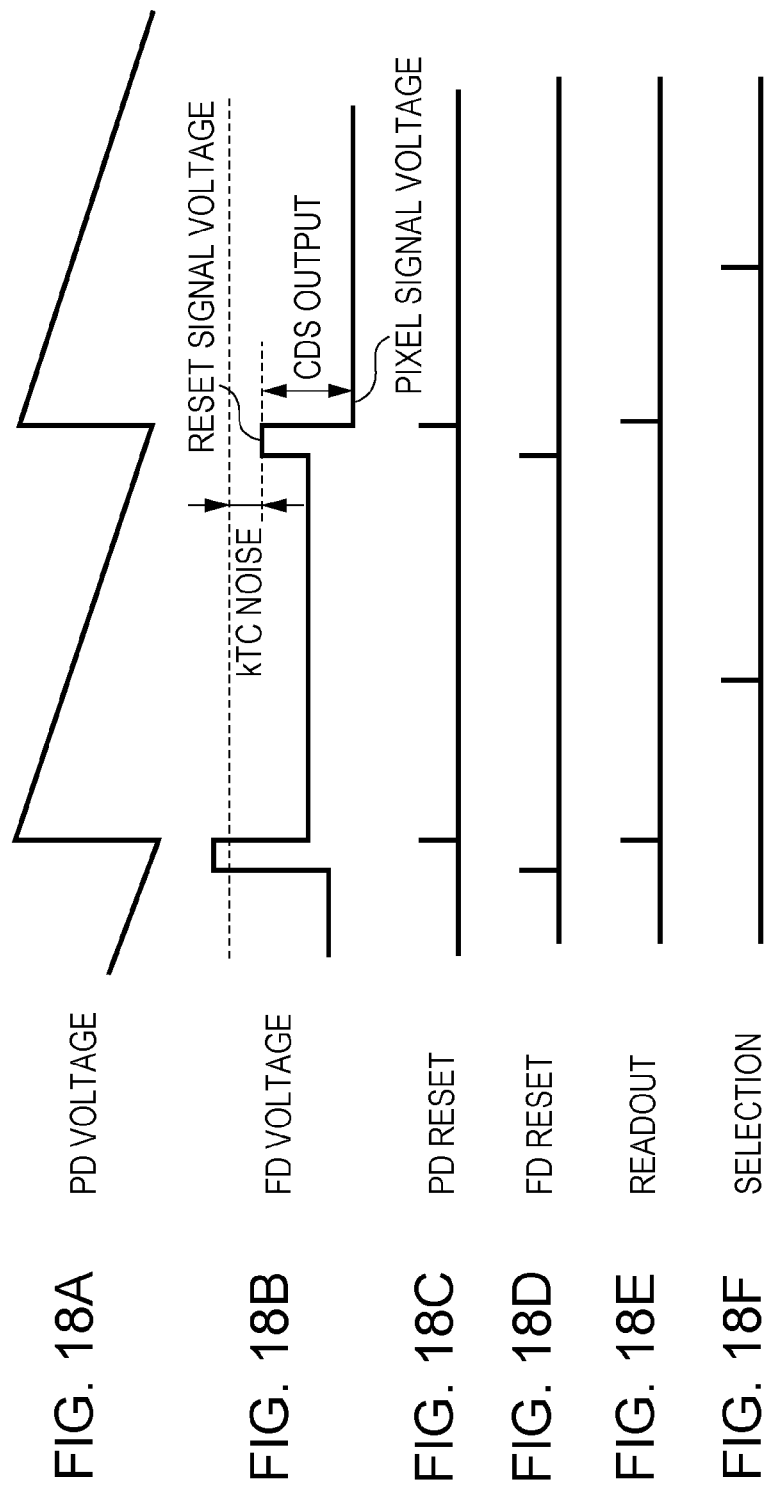
FIGS. 18A to 18F are diagrams illustrating an operation of the solid-state imaging device according to the modified example 1-2 of the first embodiment.

FIGS. 17 to 18F are diagrams illustrating an operation of the solid-state imaging device according to the modified example 1-2 of the first embodiment.

FIG. 17 is a cross-sectional view in the same manner as FIG. 12, and shows movements of electrons or holes when the incident light H enters the photoelectric conversion film 13.

Also, FIGS. 18A to 18F show timing charts in the same manner as FIGS. 13A to 13E. In FIGS. 18A to 18F, FIG. 18A indicates a voltage at the photodiode constituted by the photoelectric conversion film 13 (refer to FIG. 16). FIG. 18B indicates a voltage at the n type impurity region 411 which functions as a floating diffusion. FIG. 18C indicates a PD reset signal transmitted to the gate of the PD reset transistor M11 via the PD reset line H11. FIG. 18D indicates an FD reset signal transmitted to a gate of an FD reset transistor M12 via an FD reset line H12. FIG. 18E indicates a readout signal transmitted to the gate of the gate MOS 41 via the readout line H41. FIG. 18F indicates a selection signal transmitted to the gate of the selection transistor M31 via the selection line H31. FIGS. 18A to 18F shows that the signals have a high level at the longitudinal lines extending vertically from the transverse lines, and thus the respective transistors are turned on.

As shown in FIGS. 16 to 18F, the FD reset transistor M12 which resets a potential at the floating diffusion FD may be provided instead of the gate MOS 42 (refer to FIG. 4) in the first embodiment.

Specifically, the FD reset transistor M12, as shown in FIG. 16, has the gate connected to the FD reset line H12 which is supplied with the FD reset signal. Further, the FD reset transistor M12 has one terminal connected to the floating diffusion FD (n type impurity region 411) and the other terminal electrically connected to the power source potential supply line Vdd. Also, the FD reset transistor M12 resets a potential at the floating diffusion FD (n type impurity region 411) in response to the FD reset signal output from the FD reset line H12.

In this modified example, as shown in FIG. 17, the incident light H enters the photoelectric conversion film 13 passing through the respective portions from the upper side of the silicon substrate 11. In the photoelectric conversion film 13 which the incident light H has entered, the generated electrons (signal charges) are moved to the n type impurity area 12 (accumulator 1) of the silicon substrate 11, and the holes are moved to the transparent electrode 14. The photoinduced charges generated by the photoelectric conversion film 13 are moved to the surface opposite to the light incident surface since an internal electric field generated by a doping control exists in the n type impurity area 12 (accumulator 1) of the silicon substrate 11.

Also, the "FD reset" is made and then the potential at the floating diffusion FD is reset.

After a predetermined time for accumulation has elapsed, a potential at the n type impurity area 12 (accumulator 1) is reset to 0V or the power source voltage Vdd (V) through the "PD reset" (here, the case where reset to Vdd (V) is shown). Immediately after the reset, the signal charges begin to accumulate. In other words, after the potential at the n type impurity area 12 (accumulator 1) is reset by the PD reset transistor M11 as shown in FIGS. 18A to 18F, the electrons (signal charges) begin to accumulate.

As shown in FIGS. 17 to 18F, the signal charges accumulated in the n type impurity area 12 (accumulator 1) are transferred to the n type impurity region 411 (accumulator 2) by the gate MOS 41 and then accumulated. The readout circuit 51 reads out the signal charges and outputs the read-out signal charges to the vertical signal line 27 as electric signals.

This operation is performed in all the pixels P.

Thereafter, the selection transistor M31 is turned on using the selection line H31 for each pixel P or each row of the pixels P, a voltage variation in the n type impurity region 411 (accumulator 2 also used as FD) is amplified by the amplification transistor M21, and then the signals are sequentially read out.

At this time, by the CDS circuit, a difference between the amplified voltage and an initial voltage is read out as a signal.

In the above description, as shown in FIGS. 18A to 18F, the PD voltage drops due to the accumulation of the signal charges. In this modified example, a variation in the voltage occurs when the "PD reset" or the "FD reset" is made, and thus the kTC noise is generated. However, the variation is removed through the correlated double sampling (CDS) process and thus the kTC can be removed. In other words, as shown in FIGS. 18A to 18F, the noise can be removed with a difference between the pixel signal voltage and the reset signal voltage (CDS operation). However, in this case, since the n type impurity region 411 (according to 2 also used as FD) comes into direct contact with the surface of the silicon substrate 11, a dark current is generated at a surface level.

In addition, in this embodiment as well, the photoelectric conversion film 13 functions as a light blocking film along with the photoelectric conversion function. Thereby, as shown in FIG. 17, the incident light H is blocked from entering the respective n type impurity areas 12 and 411, which function as the accumulators, by the photoelectric conversion film 13.

Therefore, in this modified example as well, since the incident light H coming from the upper surface (rear surface) can be blocked by the photoelectric conversion film 13, and the light does not reach the accumulators, it is possible to prevent the generation of noise and improve the image quality of a captured image.

E-3. A Modified Example 1-3

Figure 19:
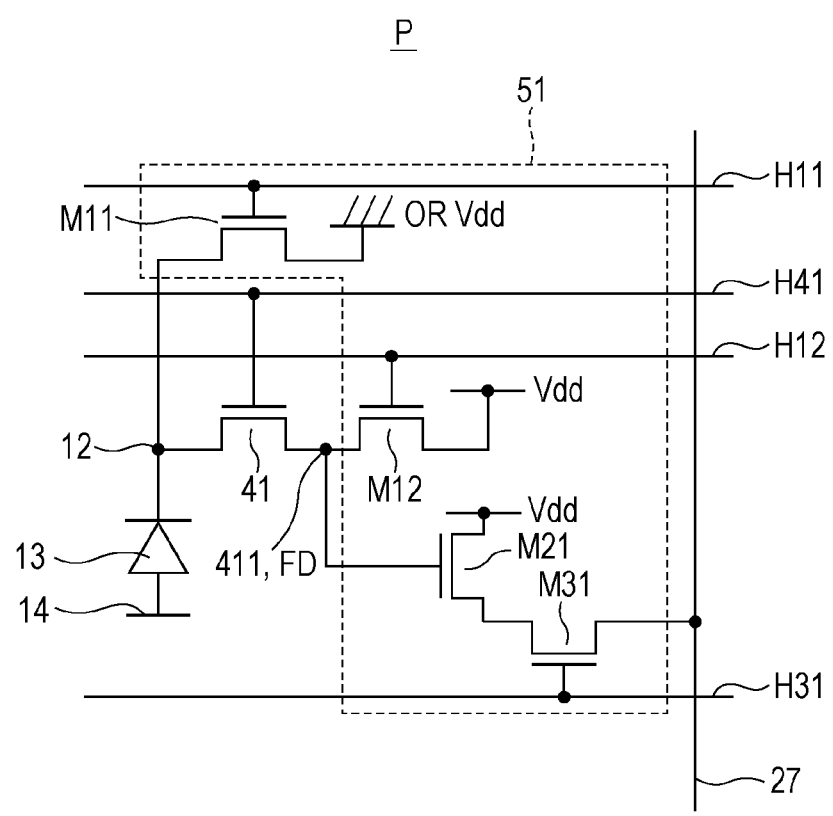
FIG. 19 is a diagram illustrating a circuit configuration of a pixel constituting a solid-state imaging device according to a modified example 1-3 of the first embodiment.

FIG. 19 is a diagram illustrating a circuit configuration of a pixel constituting a solid-state imaging device according to a modified example 1-3 of the first embodiment.

Figure 20:
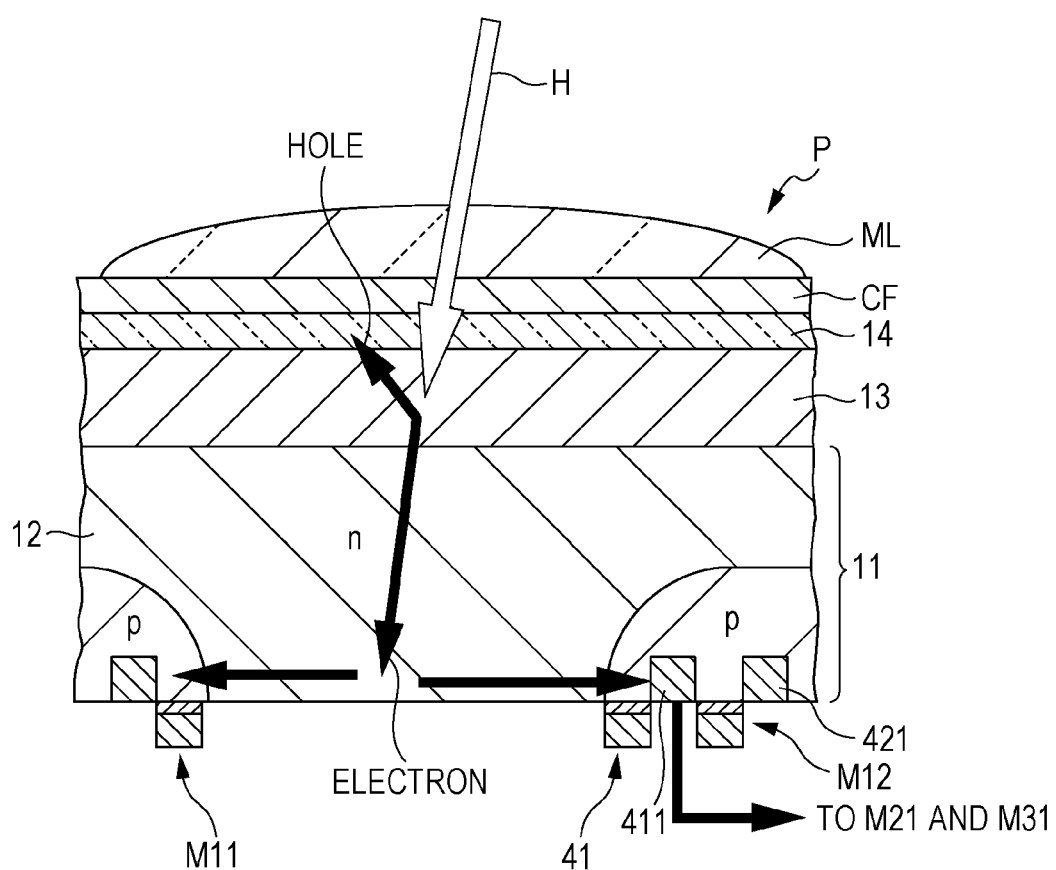
FIG. 20 is a diagram illustrating an operation of the solid-state imaging device according to the modified example 1-3 of the first embodiment.
Figure 21:
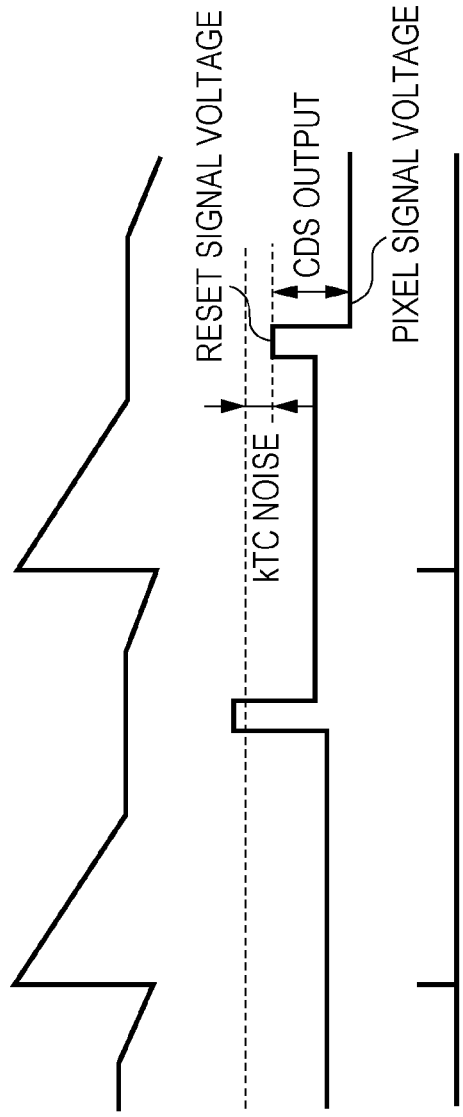
FIGS. 21A to 21G are diagrams illustrating an operation of the solid-state imaging device according to the modified example 1-3 of the first embodiment.

FIGS. 20 to 21G are diagrams illustrating an operation of the solid-state imaging device according to the modified example 1-3 of the first embodiment.

FIG. 20 is a cross-sectional view in the same manner as FIG. 17, and shows movements of electrons or holes when the incident light H enters the photoelectric conversion film 13.

Also, FIGS. 21A to 21G are diagrams illustrating an operation of the solid-state imaging device according to the modified example 1-3 of the first embodiment. FIGS. 21A to 21G show timing charts. In FIGS. 21A to 21G, FIG. 21A indicates a voltage at the photodiode constituted by the photoelectric conversion film 13 (refer to FIG. 20). FIG. 21B indicates a voltage at the n type impurity region 411 which functions as a floating diffusion. FIG. 21C indicates a PD reset signal transmitted to the gate of the PD reset transistor M11 via the PD reset line H11. FIG. 21D indicates an FD reset signal transmitted to a gate of an FD reset transistor M12 via an FD reset line H12. FIG. 21E indicates a signal (transparent electrode) transmitted to the transparent electrode 14. FIG. 21F indicates a readout signal transmitted to the gate of the gate MOS 41 via the readout line H41. FIG. 21G indicates a selection signal transmitted to the gate of the selection transistor M31 via the selection line H31. FIGS. 21A to 21G show that the signals have a high level at the longitudinal lines extending vertically from the transverse lines, and thus the respective transistors are turned on.

In FIGS. 21A to 21G, FIG. 21E shows the signal (transparent electrode) transmitted to the transparent electrode 14 in addition to the signals shown in FIGS. 18A to 18F.

As shown in FIGS. 19 to 21G, the modified example 1-2 of the first embodiment may be configured to apply a signal to the transparent electrode 14 so as to control the potential. Due to this, even in a case where there is a single accumulator, the exposure by the global shutter method can be performed.

Specifically, first, a signal of a zero bias or a negative bias is applied to the transparent electrode 14. Thereby, the generated photoinduced charges are moved to the n type impurity area 12 (accumulator 1) and then begin to be accumulated.

Next, the "PD reset" is made. Thereby, the n type impurity area 12 (accumulator 1) is reset to the voltage 0V or Vdd (V), and immediately thereafter, the accumulation begins again. In addition, FIGS. 21A to 21G show a case where the n type impurity area 12 (accumulator 1) is reset to Vdd (V). After a predetermined time for accumulation has elapsed, a positive bias is applied to the transparent electrode 14. Therefore, newly generated photoinduced charges are moved to the transparent electrode 14 side, and the accumulation in the n type impurity area 12 (accumulator 1) is finished.

Then, immediately after the "FD reset" is made, the photoinduced charges are transferred to the n type impurity region 411 (FD) using the readout line H41. Further, immediately thereafter, using the selection line H31 for each pixel P or each row of the pixels P, a voltage variation in the n type impurity region 411 (FD) is amplified by the amplification transistor M21, and then a signal thereof is read out. This is sequentially repeated.

In this way, it is possible to suppress a dark current from being generated by shortening the time for the accumulation in the n type impurity region 411 (FD). In addition, at this time, the kTC noise can be removed by reading out a difference between the pixel signal voltage and the reset signal voltage as a signal using the CDS circuit. This structure is effective for a fine pixel since the number of transistors necessary for each pixel is reduced.

E-4. A Modified Example 1-4

In the modified example 1-2 described above, since the n type impurity region 411 (accumulator 2 also used as FD) comes into direct contact with the surface of the silicon substrate 11, a dark current is generated at a surface level.

In order to lower the dark current at a surface level, the following configuration may be employed.

Figure 22:
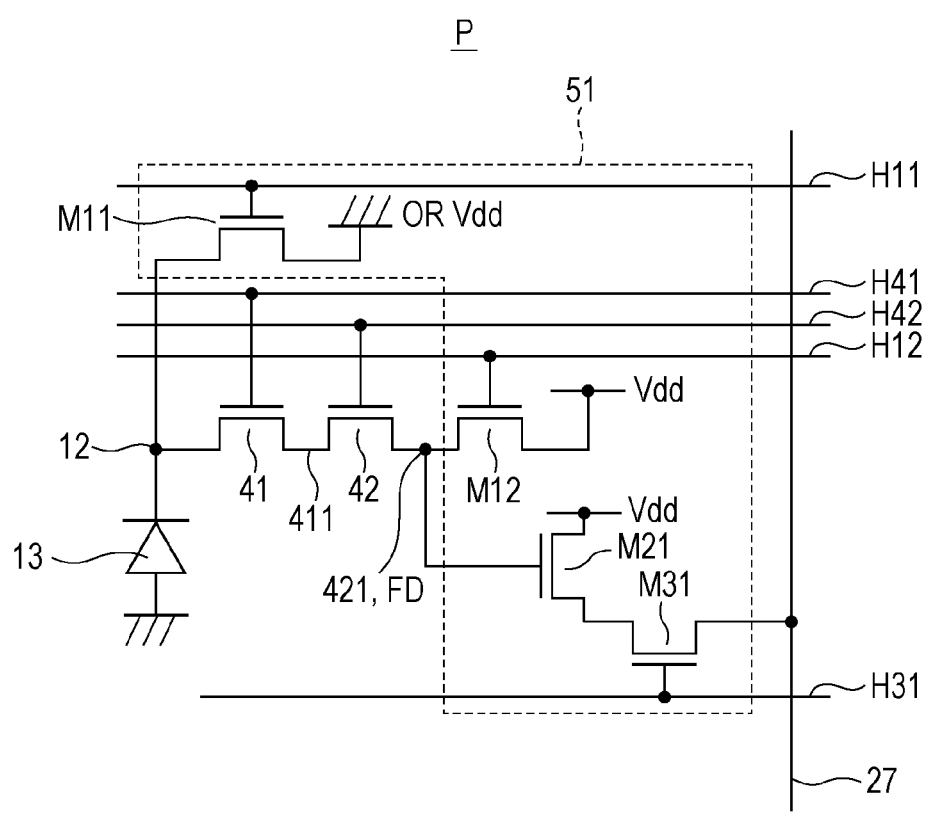
FIG. 22 is a diagram illustrating a circuit configuration of a pixel constituting a solid-state imaging device according to a modified example 1-4 of the first embodiment.

FIG. 22 is a diagram illustrating a circuit configuration of a pixel constituting a solid-state imaging device according to a modified example 1-4 of the first embodiment.

Figure 23:
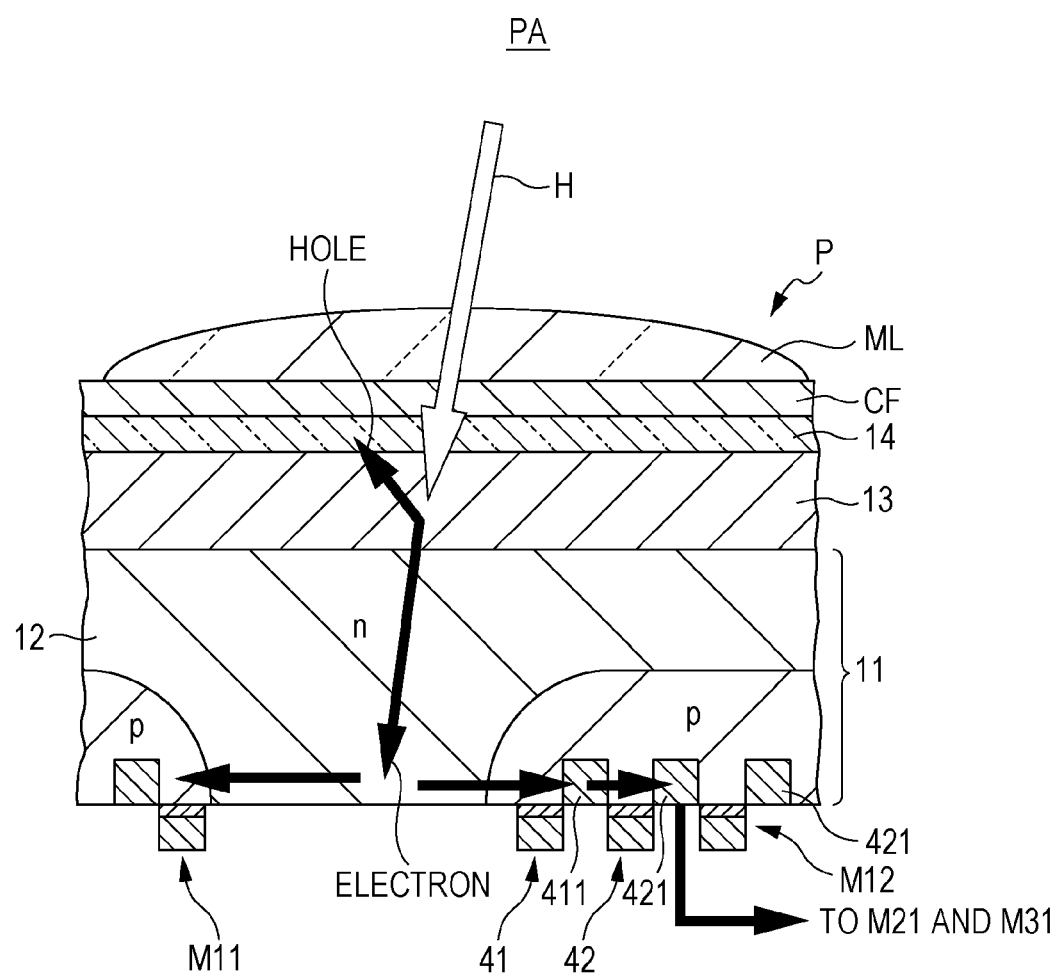
FIG. 23 is a diagram illustrating an operation of the solid-state imaging device according to the modified example 1-4 of the first embodiment.
Figure 24:
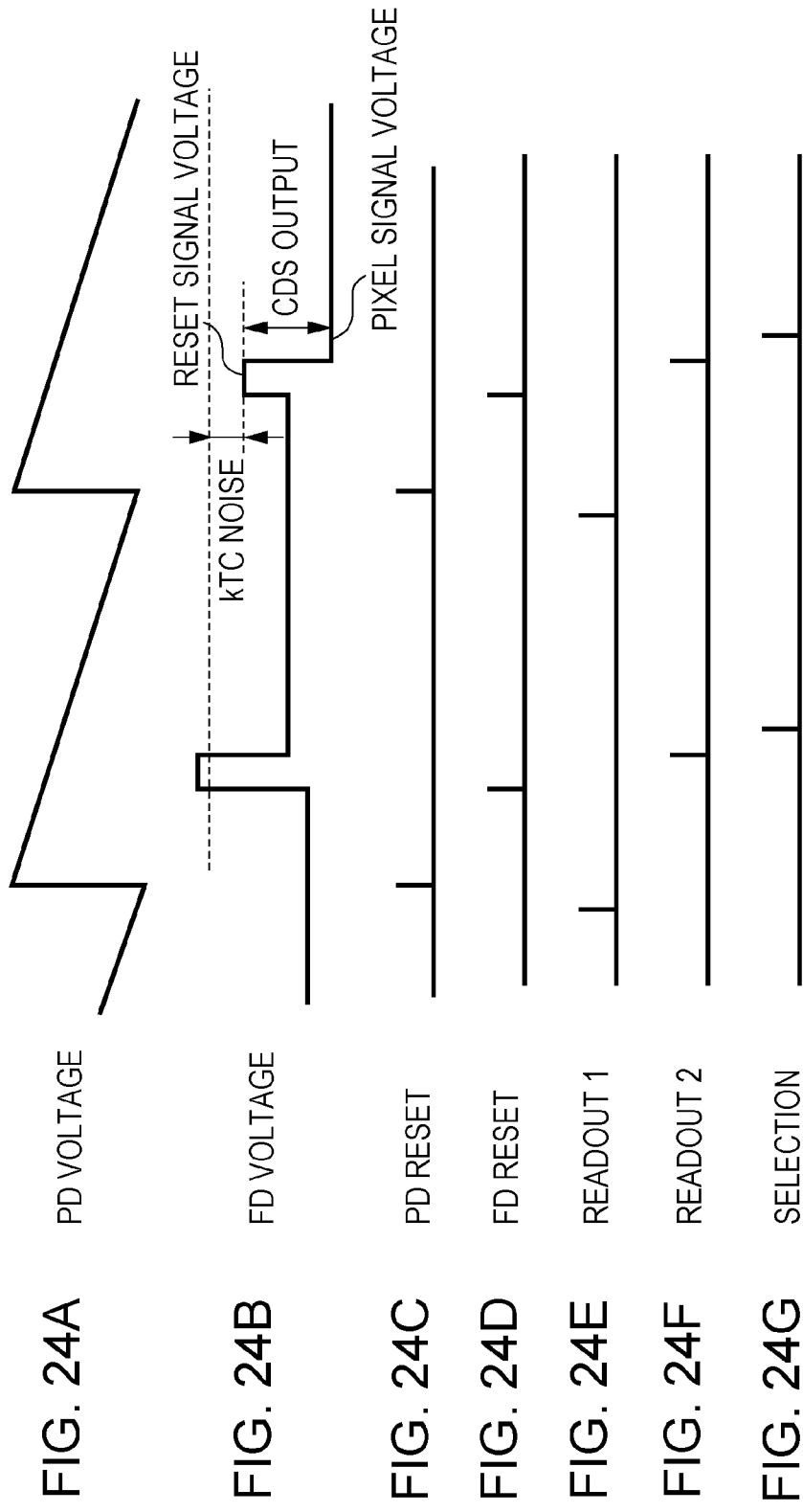
FIGS. 24A to 24G are diagrams illustrating an operation of the solid-state imaging device according to the modified example 1-4 of the first embodiment.

FIGS. 23 to 24G are diagrams illustrating an operation of the solid-state imaging device according to the modified example 1-4 of the first embodiment.

FIG. 23 is a cross-sectional view in the same manner as FIG. 12, and shows movements of electrons or holes when the incident light H enters the photoelectric conversion film 13.

Also, FIGS. 24A to 24G show timing charts in the same manner as FIGS. 13A to 13E. In FIGS. 24A to 24G, FIG. 24A indicates a voltage at the photodiode constituted by the photoelectric conversion film 13 (refer to FIG. 22). FIG. 24B indicates a voltage at the n type impurity region 421 which functions as a floating diffusion. FIG. 24C indicates a PD reset signal transmitted to the gate of the PD reset transistor M11 via the PD reset line H11. FIG. 24D indicates an FD reset signal transmitted to a gate of an FD reset transistor M12 via an FD reset line H12. FIG. 24E indicates a first readout signal transmitted to the gate of the gate MOS 41 via the readout line H41. FIG. 24F indicates a second readout signal transmitted to the gate of the gate MOS 42 via the readout line H42. FIG. 24G indicates a selection signal transmitted to the gate of the selection transistor M31 via the selection line H31. FIGS. 24A to 24G shows that the signals have a high level at the longitudinal lines extending vertically from the transverse lines, and thus the respective transistors are turned on.

As shown in FIGS. 22 to 24G, the FD reset transistor M12 described in the modified example 1-2 may be added to the configuration according to the first embodiment.

Specifically, the FD reset transistor M12, as shown in FIG. 22, has the gate connected to the FD reset line H12 which is supplied with the FD reset signal. Further, the FD reset transistor M12 has one terminal connected to the floating diffusion FD (n type impurity region 421) and the other terminal electrically connected to the power source potential supply line Vdd. Also, the FD reset transistor M12 resets a potential at the floating diffusion FD (n type impurity region 421) in response to the FD reset signal output from the FD reset line H12.

In this modified example as well, as shown in FIG. 23, the incident light H enters the photoelectric conversion film 13 passing through the respective portions from the upper side of the silicon substrate 11. In the photoelectric conversion film 13 which the incident light H has entered, the generated electrons (signal charges) are moved to the n type impurity area 12 (accumulator 1) of the silicon substrate 11, and the holes are moved to the transparent electrode 14.

In addition, as shown in FIGS. 24A to 24G, a potential at the n type impurity area 12 (accumulator 1) is reset to 0V or the power source voltage Vdd (V) through the "PD reset" (here, the case where reset to Vdd (V) is shown). Immediately after the reset, the signal charges begin to be accumulated. In other words, after the potential at the n type impurity area 12 (accumulator 1) is reset by the PD reset transistor M11 as shown in FIGS. 24A to 24G, the electrons (signal charges) begin to be accumulated.

Also, after a predetermined time for the accumulation has elapsed, the gate MOS 41 is turned on so as to transfer the signal charges from the n type impurity area 12 (accumulator 1) to the n type impurity region 411 (accumulator 2) (the "readout 1" is performed).

Through the "FD reset," a potential at the n type impurity region 421 (FD) functioning as a floating diffusion is reset.

Further, immediately after the "FD reset," as shown in FIGS. 17 to 18F, the signal charges accumulated in the n type impurity area 12 (accumulator 1) are transferred to the n type impurity region 421 (FD) by the gate MOS 41 and then accumulated (the "readout 2" is performed).

Immediately thereafter, a voltage variation in the n type impurity region 421 (FD) is amplified by the amplification transistor M21 for each pixel P or each row of the pixels P, the readout circuit 51 reads out the signals thereof and outputs the read-out signal to the vertical signal line 27 as electric signals.

In the modified example 1-2, the n type impurity region 411 functioning as the accumulator and FD is formed on the surface of the silicon substrate 11, and thus it is difficult to suppress a dark current generated at a surface level.

However, in this modified example, the n type impurity region 421 (FD) functioning as FD is formed separately, and the n type impurity region 411 (accumulator 2) does not function as FD.

Although not shown, a p+ layer in which a p type impurity is diffused with high concentration is formed in the surface of the n type impurity region 421. In other words, the p+ layer in which a impurity diffusion layer having the conductivity type different from the n type impurity region 421 (accumulator) is provided in the surface layer of the silicon substrate 11.

Moreover, it is possible to suppress a dark current from being generated by shortening the time for the accumulation in the n type impurity region 421 (FD). In addition, at this time, the kTC noise can be removed by reading out a difference between the pixel signal voltage and the reset signal voltage as a signal using the CDS circuit.

Thereby, in this modified example, in the same manner as the modified example 1-2, it is possible to prevent the generation of the kTC noise and prevent the generation of a dark current.

E-5. A Modified Example 1-5

Figure 25:
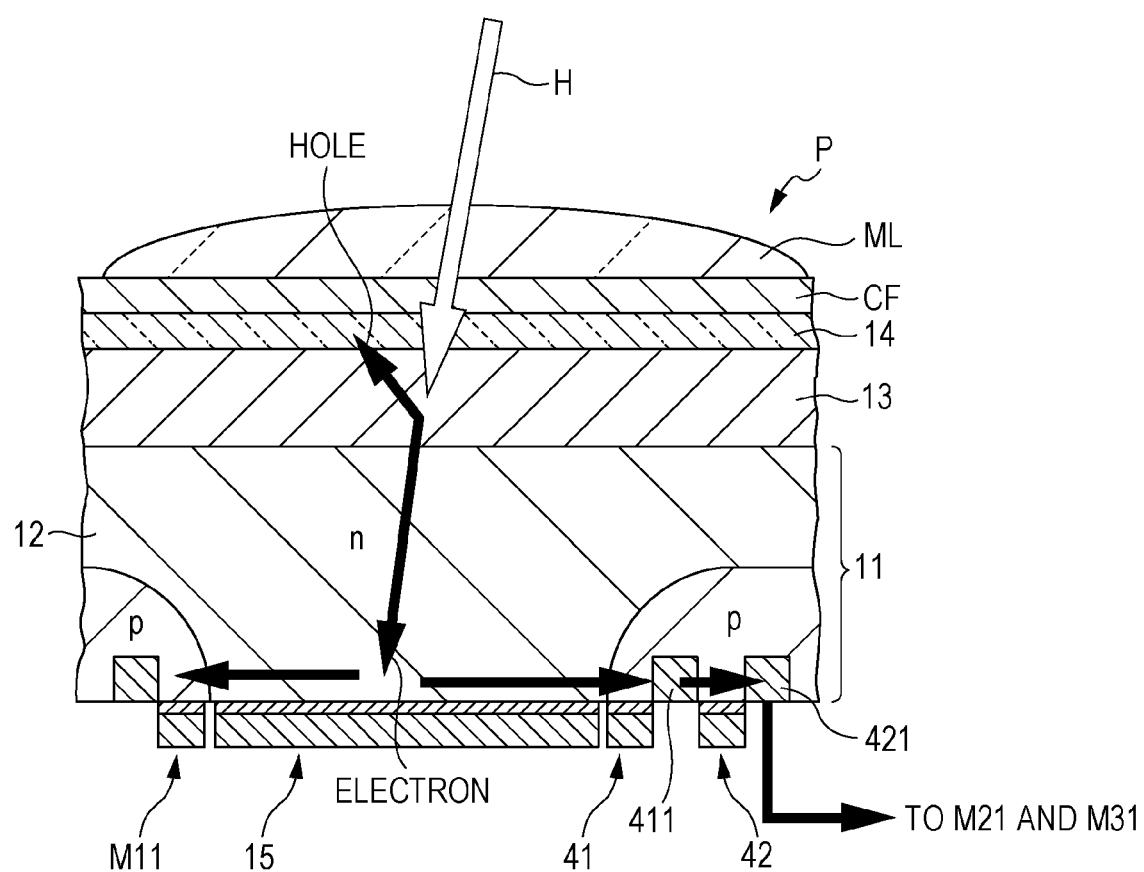
FIG. 25 is a diagram illustrating main portions of the solid-state imaging device according to a modified example 1-5 of the first embodiment.

FIG. 25 is a diagram illustrating main portions of a solid-state imaging device according to a modified example 1-5 of the first embodiment. FIG. 25 shows a cross-section of the pixel P in the same manner as FIG. 12.

Figure 26:
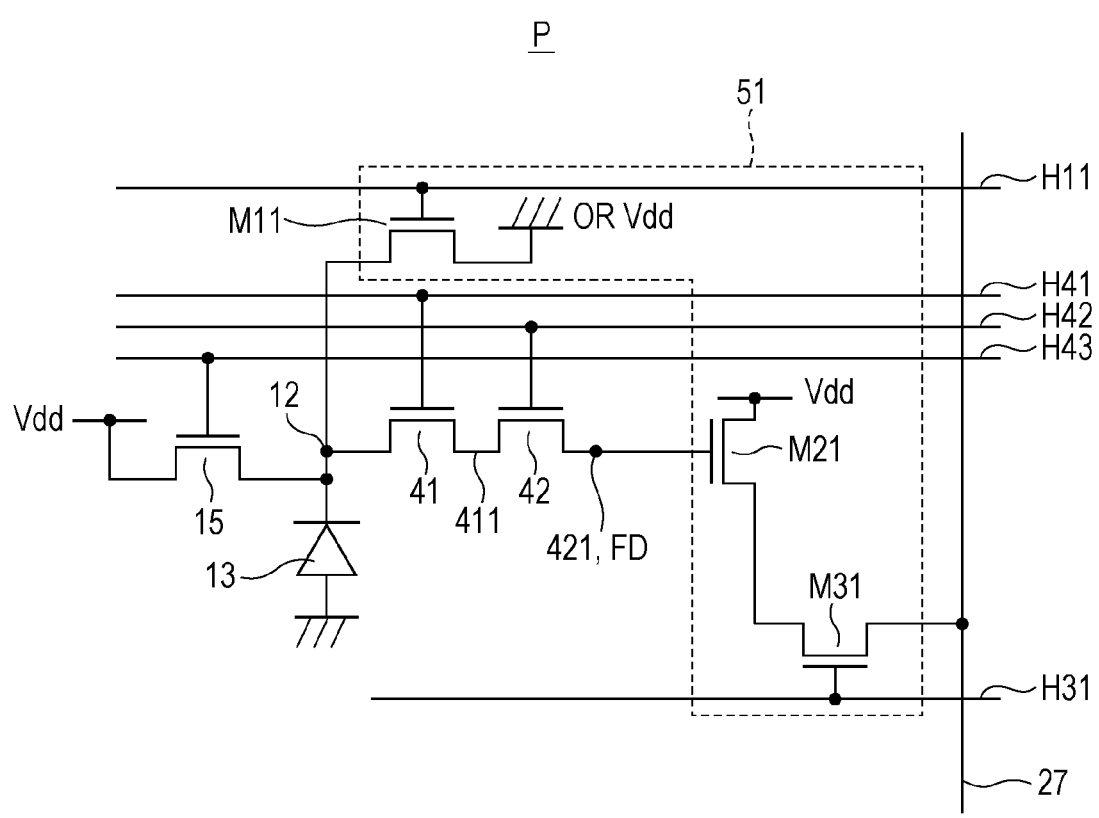
FIG. 26 is a diagram illustrating a circuit configuration of a pixel constituting the solid-state imaging device according to the modified example 1-5 of the first embodiment.
Figure 27:
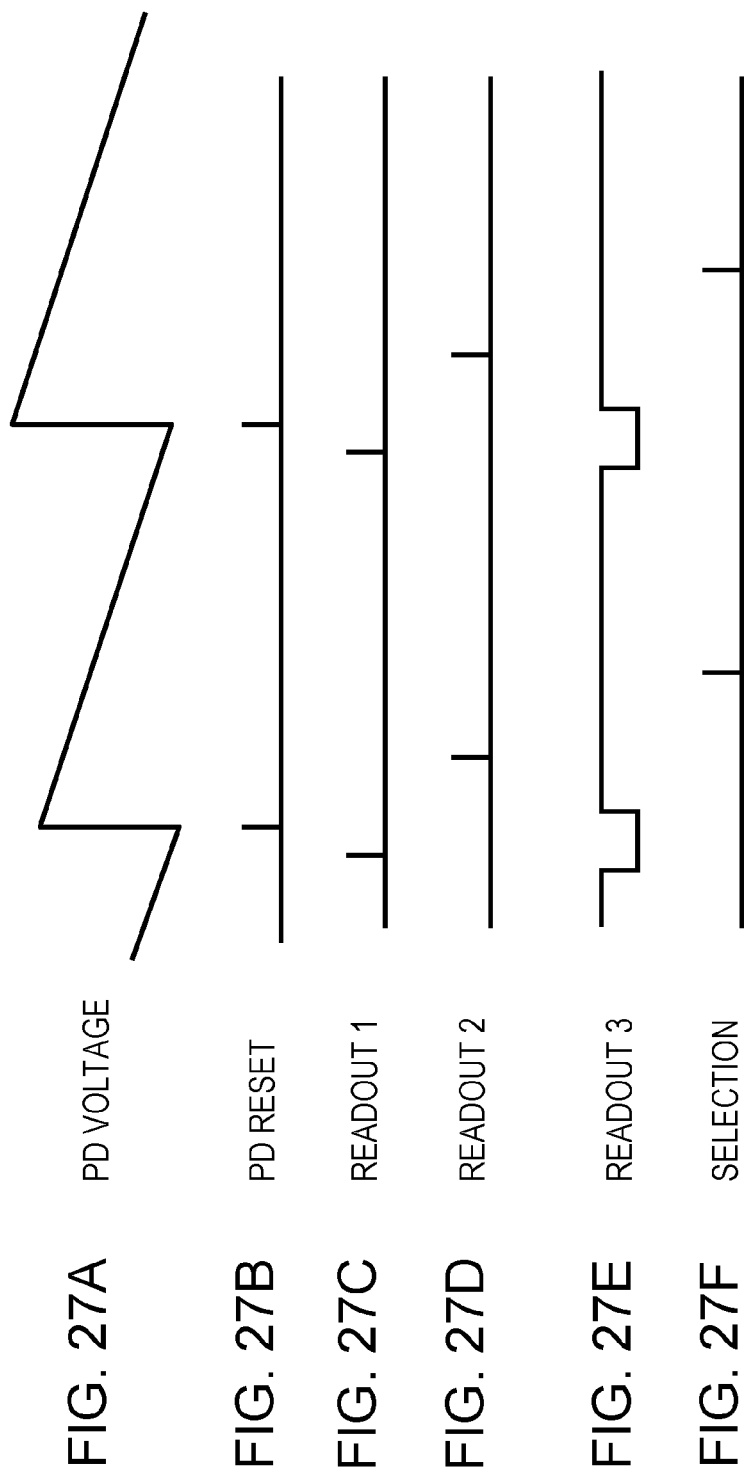
FIGS. 27A to 27F are diagrams illustrating an operation of the solid-state imaging device according to the modified example 1-5 of the first embodiment.

FIG. 26 is a diagram illustrating a circuit configuration of a pixel constituting the solid-state imaging device according to the modified example 1-5 of the first embodiment.

FIGS. 27A to 27F are diagram illustrating an operation of the solid-state imaging device according to the modified example 1-5 of the first embodiment. FIGS. 27A to 27F show timing charts. FIGS. 27A to 27F show a third readout signal (readout 3) transmitted to a control gate 15 via a readout line H43 in addition to the signals shown in FIGS. 13A to 13E.

As shown in FIGS. 25 and 26, the control gate 15 may be further added to the configuration(refer to FIG. 12).

Specifically, the control gate 15 may be formed so as to cover the part where the n type impurity area 12 (accumulator 1) is formed in the surface of the silicon substrate 11.

In the control gate 15, for example, an electric field is applied such that the signal charges (here, electrons) generated by the photoelectric conversion film 13 are moved to the n type impurity area 12 through drift.

In addition, an electric field may be applied to the control gate 15 such that the signal charges generated by the photoelectric conversion film 13 are temporarily accumulated and then moved to the n type impurity area 12 (accumulator 1).

As shown in FIG. 26, the control gate 15 is electrically connected to the readout line H43. Further, as shown in FIGS. 27A to 27F, a potential at the control gate 15 may be controlled via the readout line H43.

Specifically, as shown in FIGS. 25 to 27F, an electric field is applied to the control gate 15 for a long time such that the signal charges are moved from the photoelectric conversion film 13 to the n type impurity area 12 (accumulator 1). After the state, for a short time the electric field is not applied to the control gate 15. During the time when the electric field is not applied, the signal charges are moved from the n type impurity area 12 (accumulator 1) to the n type impurity region 411 (accumulator 2) by the gate MOS 41. Thereafter, the "PD reset" is made. Next, the electric field is secondly applied to the control gate 15 for a long time such that the signal charges are moved from the photoelectric conversion film 13 to the n type impurity area 12 (accumulator 1). During this interval, the amplified signal is read out in the same manner as in the first embodiment.

If the control gate 15 is formed, this modified example is not limited to the above-described configuration.

Figure 28:
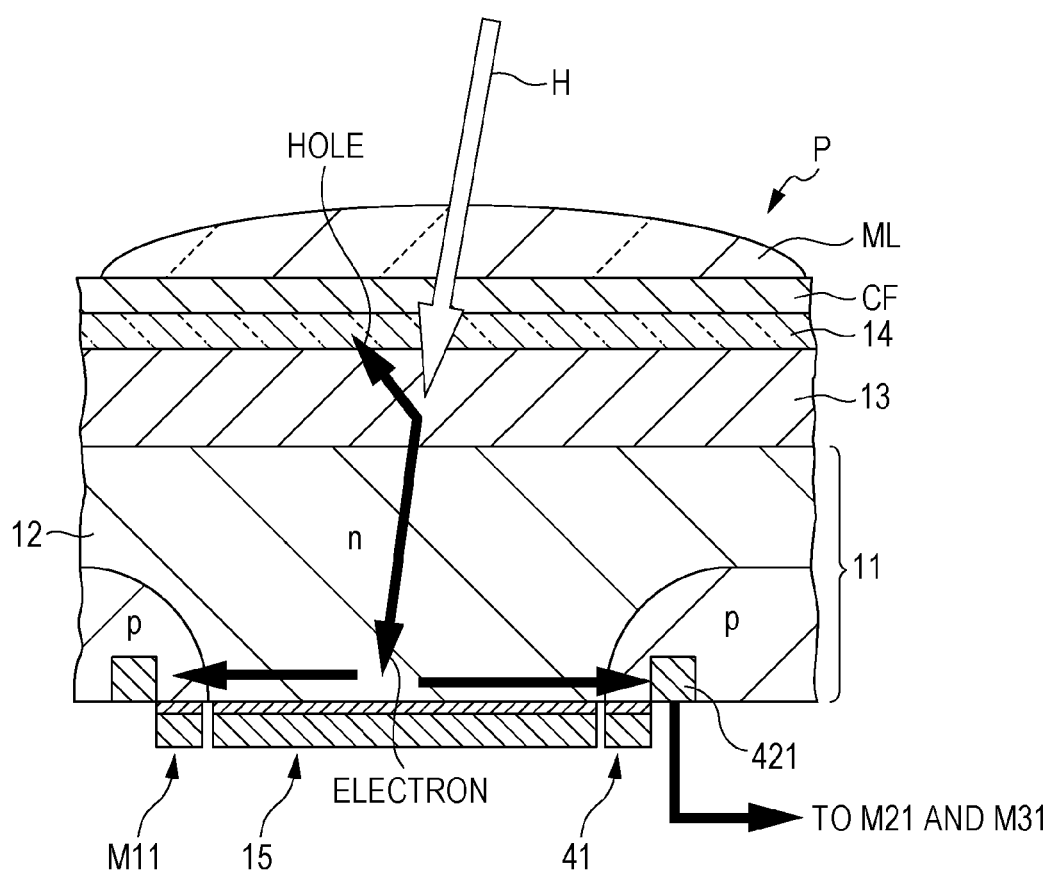
FIG. 28 is a diagram illustrating main portions of the solid-state imaging device according to the modified example 1-5 of the first embodiment.

FIG. 28 is a diagram illustrating main portions of the solid-state imaging device according to the modified example 1-5 of the first embodiment. FIG. 28 shows a cross-section of the pixel P in the same manner as FIG. 25.

Figure 29:
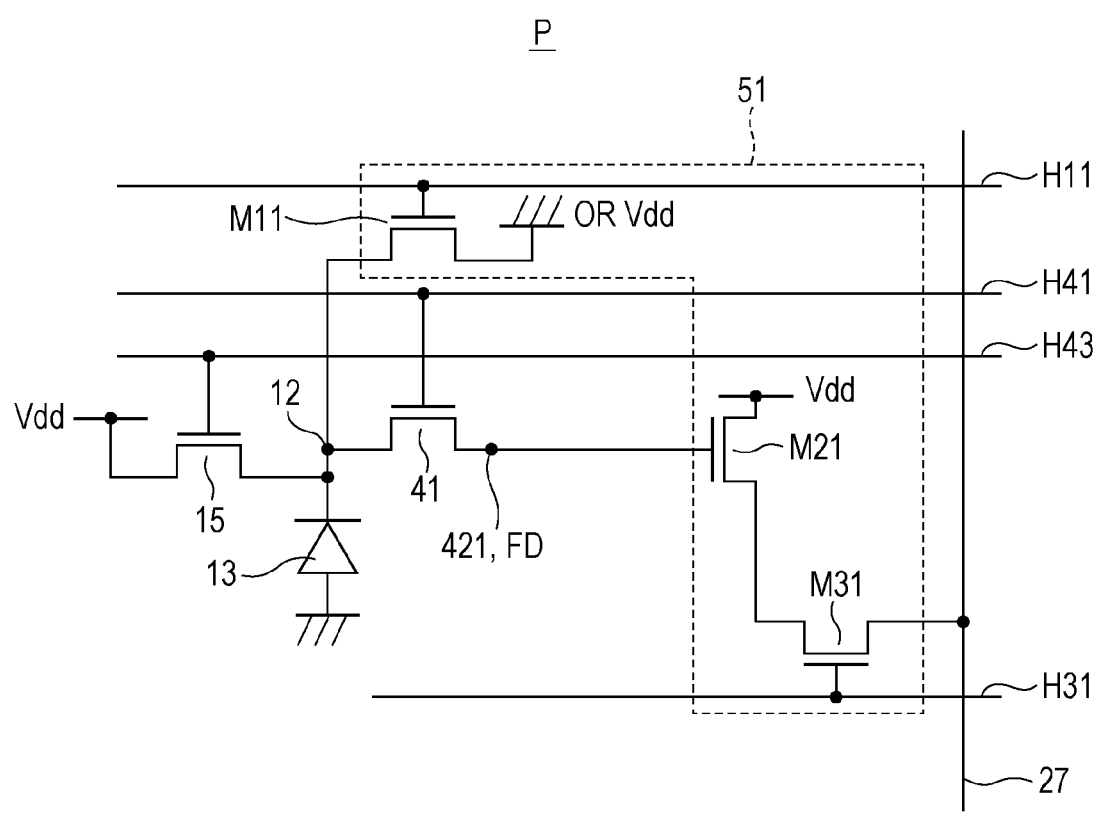
FIG. 29 is a diagram illustrating a circuit configuration of a pixel constituting the solid-state imaging device according to the modified example 1-5 of the first embodiment.

FIG. 29 is a diagram illustrating a circuit configuration of a pixel constituting the solid-state imaging device according to the modified example 1-5 of the first embodiment.

FIGS. 30A to 30E are diagrams illustrating an operation of the solid-state imaging device according to the modified example 1-5 of the first embodiment. FIGS. 30A to 30E show timing charts.

As shown in FIGS. 28 to 30E, the respective portions may be driven without forming the gate MOS 42 and the n type impurity region 411 (accumulator 2). In other words, as shown in FIGS. 30A to 30E, the signal charges are instantly moved from the photoelectric conversion film 13 of all the pixels P to the n type impurity area 12 (accumulator 1) (refer to the "readout 3"). Thereafter, in the same manner as the above-described case, the "readout 1" and the "selection" are performed, and an amplified signal is sequentially read out.

E-6. A Modified Example 1-6

Figure 31A:
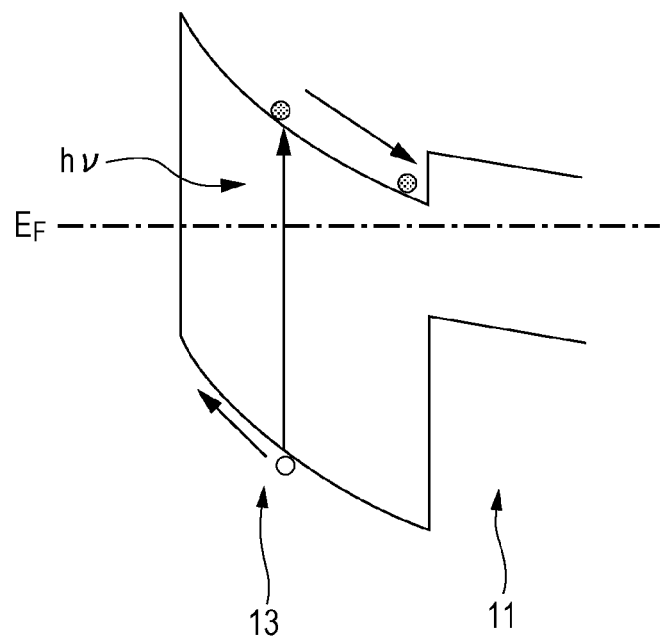
FIGS. 31A and 31B are diagrams illustrating a band structure of a solid-state imaging device according to a modified example 1-6 of the first embodiment.
Figure 31B:
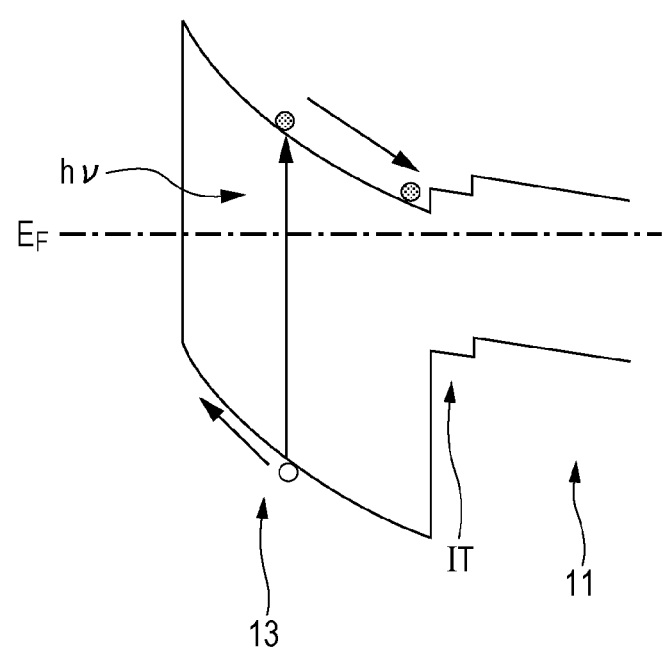

FIGS. 31A and 31B are diagrams illustrating a band structure of a solid-state imaging device according to a modified example 1-6 of the first embodiment.

FIGS. 31A and 31B, in the same manner as FIG. 8, show a band structure in the depth direction z of the photoelectric conversion film 13 and the silicon substrate 11. FIG. 31A shows a case where the photoelectric conversion film 13 with a band structure different from that in FIG. 8 is formed, and FIG. 31B shows a preferable case in that case.

A lattice matching chalcopyrite material may not be constant in the band structure. In other words, as shown in FIG. 31A, the photoelectric conversion film 13 having the different band structure may be formed in some cases as can be seen from the comparison with FIG. 8.

For example, as disclosed in D. S. Substrate and W. Neumann, Appl. Phys. Lett. 73, 785, (1998), since a CuAu type regular phase is formed according to a growth condition, this alters the band structure, and the electron affinity (an energy difference between a bottom and a vacuum level in the conduction band) may vary.

For this reason, there are cases of not forming the relation of (the electron affinity of the silicon substrate 11)>(the electron affinity of the photoelectric conversion film 13) unlike the case in FIG. 8.

As shown in FIG. 31A, in the case of (the electron affinity of the silicon substrate 11)<(the electron affinity of the photoelectric conversion film 13), a potential barrier exists between the silicon substrate 11 and the photoelectric conversion film 13. Thereby, electrons accumulated in the photoelectric conversion film 13 are hard to move to the silicon substrate 11 side in some cases.

In order to prevent the generation of such a defect, as shown in FIG. 31B, an intermediate layer IT may be interposed between the silicon substrate 11 and the photoelectric conversion film 13.

The electron affinity of the intermediate layer IT is formed to lie between the electron affinity of the silicon substrate 11 and the electron affinity of the photoelectric conversion film 13 in order to lower the potential barrier between the silicon substrate 11 and the photoelectric conversion film 13. In other words, the electron affinity of the intermediate layer IT has the following relation.

(the electron affinity of the silicon substrate 11)<(the electron affinity of the intermediate layer IT)< (the electron affinity of the photoelectric conversion film 13)

Most preferably, the electron affinity of the intermediate layer IT is exactly half the electron affinity of the silicon substrate 11 and the electron affinity of the photoelectric conversion film 13.

For example, the intermediate layer IT is preferably formed under the conditions of the following materials and film thickness.

Materials (composition): $CuGa_{0.64}In_{0.36}S_2$

Film thickness: 5 nm

In addition, as long as the intermediate layer IT has the film thickness within a critical film thickness, the intermediate layer IT may not be lattice-matched with the silicon substrate 11. For example, in the case of the intermediate layer IT ($CuGa_{0.64}In_{0.36}S_2$), the lattice mismatching with the Si substrate becomes $\Delta a/a = 5.12 \times 10^{-3}$. At this time, if the film thickness is 5 nm, the film thickness is smaller than the critical film thickness defined by the equation (1) by "Matthews and Blakeslee" (J. W. Mathews and A. E. Blakeslee, J. Cryst. Growth 27(1974) 118-125) and the equation (2) by "People and Bean" (R. People and J. C. Bean, Appl. Phys. Lett. 47(1985) 322-324).

2. A Second Embodiment (a Case of Forming a Pixel Dividing Portion Doped Through an Ion Implantation)

A. A Device Configuration and the Like

Figure 32:
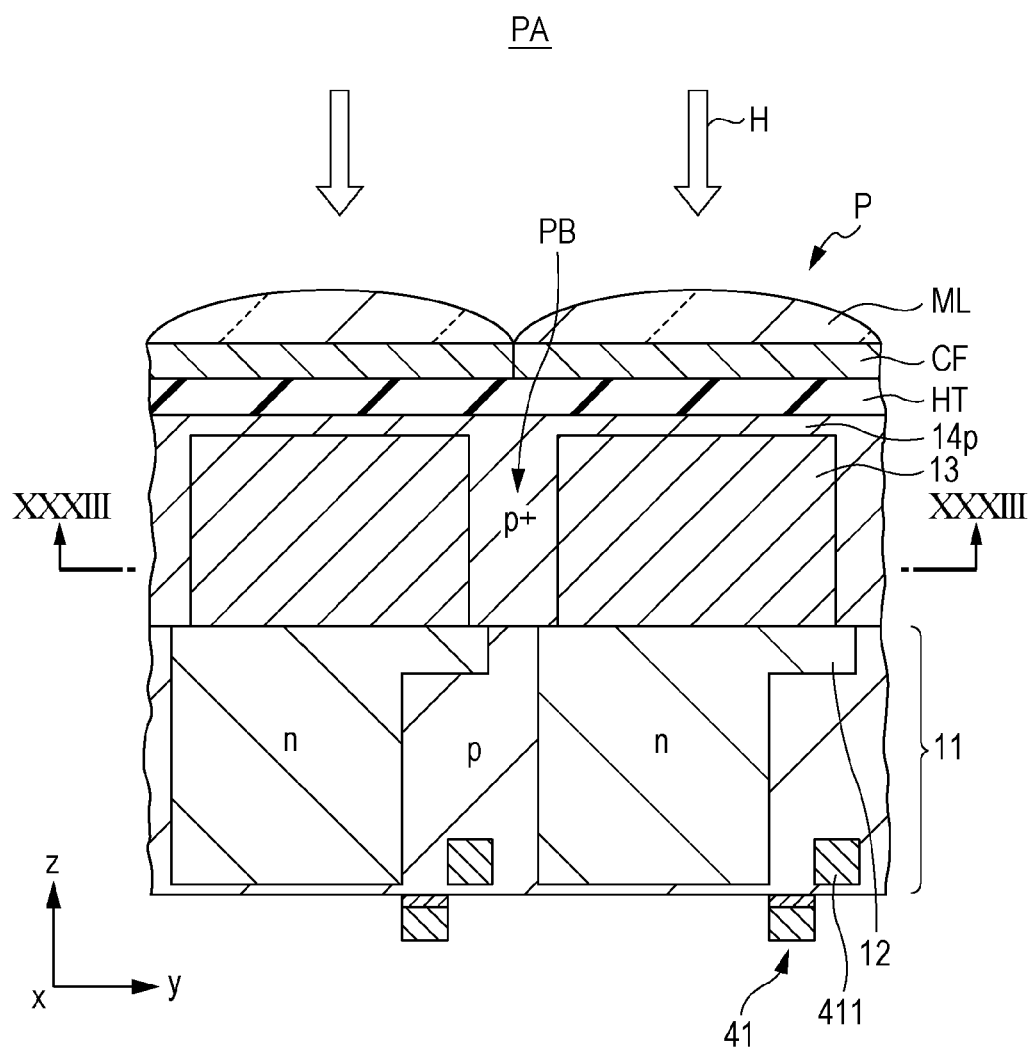
FIG. 32 is a diagram illustrating main portions of a solid-state imaging device according to a second embodiment.

FIG. 32 is a diagram illustrating main portions of a solid-state imaging device according to a second embodiment.

FIG. 32 shows a cross-section of the pixel P in the same manner as FIG. 3.

As shown in FIG. 32, in this embodiment, a pixel dividing portion PB is provided. Further, instead of the transparent electrode 14, a p+ layer 14p is provided. Except for this, this embodiment is the same as the first embodiment. Therefore, the description of the overlapping parts will be omitted.

The pixel dividing portion PB, as shown in FIG. 32, is interposed between the pixels P shown in FIG. 2, and is provided to divide the pixels from each other. In other words, the pixel dividing portion PB is provided to extend in the horizontal direction x and the vertical direction y so as to be interposed between the pixels on the imaging surface (xy plane).

Here, the pixel dividing portion PB, as shown in FIG. 32, is provided on the lateral surface of the photoelectric conversion film 13 which is provided for each P on the one surface of the silicon substrate 11.

In this embodiment, the pixel dividing portion PB is made of semiconductors including p type impurities. For example, the pixel dividing portion PB is made of a chalcopyrite based compound semiconductor including p type impurities with high concentration.

That is to say, the pixel dividing portion PB is formed to block the incident light H from entering the n type impurity areas 12, 411 and 421 which function as an accumulator in the same manner as the photoelectric conversion film 13.

The p+ layer 14p, as shown in FIG. 32, is made of a semiconductor including a p type impurity on the upper surface of the photoelectric conversion film 13.

Here, the p+ layer 14p is formed with a high concentration of the impurity such that holes generated in the photoelectric conversion film 13 enter the p+ layer 14p and are moved in the transverse direction.

For example, the p+ layer 14p is made of a compound semiconductor with the chalcopyrite structure in the same manner as the photoelectric conversion film 13 and the pixel dividing portion PB.

Figure 33:
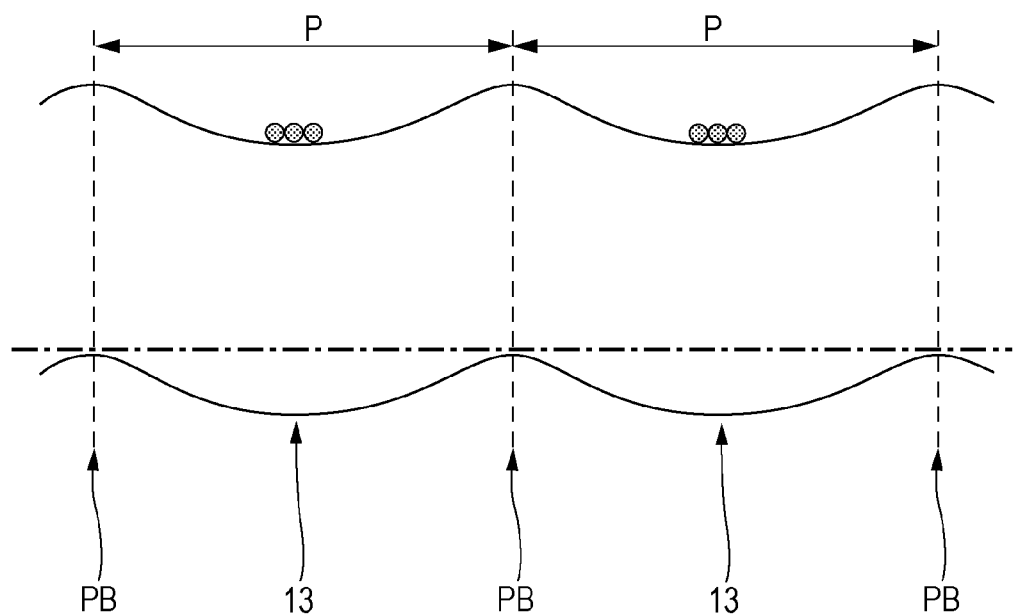
FIG. 33 is a diagram illustrating a band structure of a solid-state imaging device according to the second embodiment.

FIG. 33 is a diagram illustrating a band structure of the solid-state imaging device according to the second embodiment.

FIG. 33 shows a band structure for the part XXXIII-XXXIII marked with the chain line in FIG. 32. In other words, FIG. 33 shows a band structure for the parts where the photoelectric conversion film 13 and the pixel dividing portion PB are formed in the direction x along the surface of the silicon substrate 11.

As shown in FIG. 33, in the direction x along the surface of the silicon substrate 11, a potential barrier is formed between the photoelectric conversion film 13 and the pixel dividing portion PB. For this reason, the accumulated electrons are blocked from being moved between the pixels P.

B. Manufacturing Method

The essence of the manufacturing method of the solid-state imaging device will be described.

FIGS. 34 to 37 are diagrams illustrating the manufacturing method of the solid-state imaging device according to the second embodiment.

Here, FIGS. 34 to 37 show the cross-sections in the same manner as FIG. 3, and the solid-state imaging device 1 shown in FIG. 32 and the like is manufactured through the respective steps shown in FIGS. 34 to 37.

B-1. Formation of the Photoelectric Conversion Film 13 and the p+ Layer 14p

Figure 34:
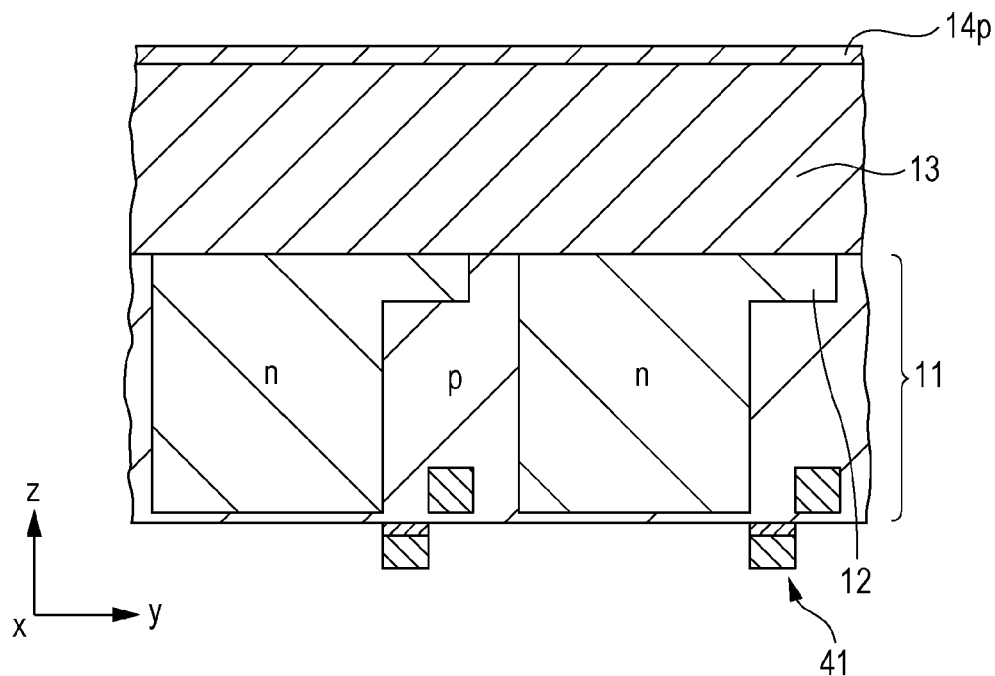
FIG. 34 is a diagram illustrating a manufacturing method of the solid-state imaging device according to the second embodiment.

First, the photoelectric conversion film 13 and the p+ layer 14p are formed as shown in FIG. 34.

Here, the respective portions such as the gate MOS 41 are formed on the surface (front surface) of the silicon substrate 11 before the photoelectric conversion film 13 and the p+ layer 14p are formed in the same manner as the first embodiment. Further, the wire layer (not shown) is formed on the surface (front surface) of the silicon substrate 11 so as to cover the respective portions such as the gate MOS 41.

Next, as shown in FIG. 34, the photoelectric conversion film 13 and the p+ layer 14p are sequentially formed on the opposite surface (rear surface) to the surface on which the respective portions such as the gate MOS 41 are formed in the silicon substrate 11.

The photoelectric conversion film 13 is made of the compound semiconductor with the chalcopyrite structure in the same manner as the first embodiment. In this embodiment, the photoelectric conversion film 13 is formed to cover a part in which the pixel dividing portion PB is formed on the upper surface of the silicon substrate 11.

Further, the p+ layer 14p is formed to cover the upper surface of the photoelectric conversion film 13. The p+ layer 14p is also made of the compound semiconductor with the chalcopyrite structure.

The p+ layer 14p is formed through the crystal growth of the compound semiconductor with the chalcopyrite structure under the condition of including a lot of an impurity such as Ga, In, As, or P, by the MOCVD method, the MBE method, or the like. Here, the p+ layer 14p is formed with high concentration such that holes enter the p+ layer 14p and are moved in the transverse direction.

For example, the p+ layer 14p is formed to have the impurity concentration of $10^{17}$ to $10^{19}$ cm$^{-3}$. In addition, the p+ layer 14p is formed to have the film thickness of 10 to 100 nm.

B-2. Formation of a Resist Pattern PR

Figure 35:
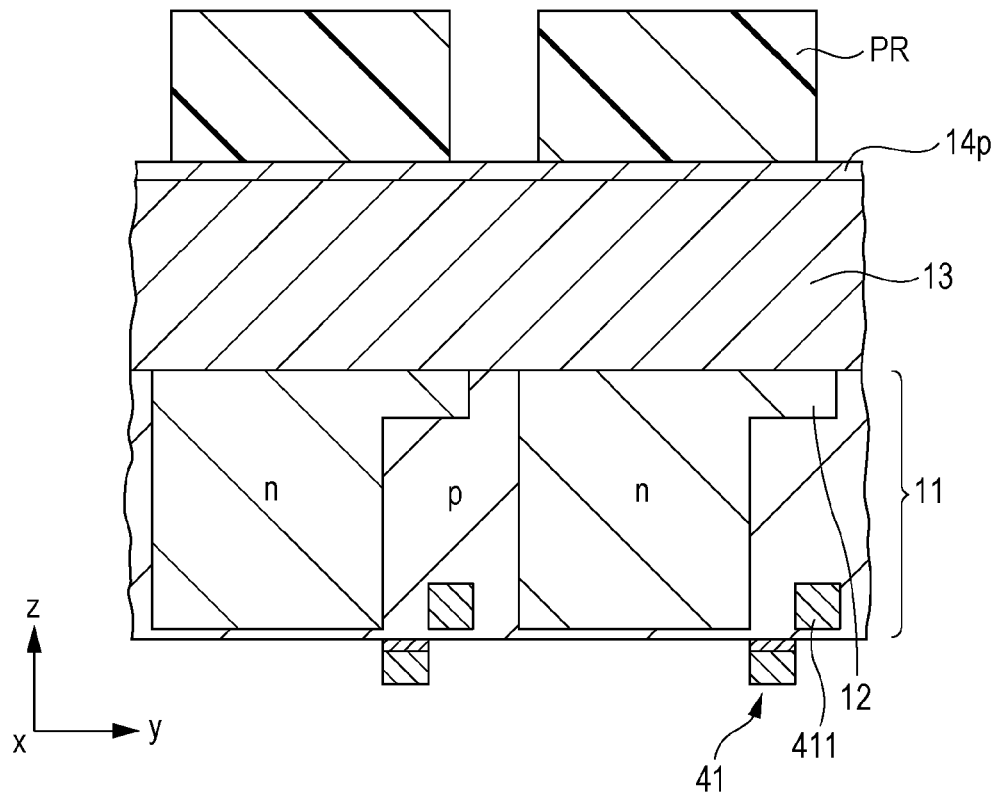
FIG. 35 is a diagram illustrating a manufacturing method of the solid-state imaging device according to the second embodiment.

Next, as shown in FIG. 35, a resist pattern PR is formed.

Here, as shown in FIG. 35, the resist pattern PR is formed on the p+ layer 14p.

In this embodiment, the resist pattern PR has apertures in order to expose a part of the upper surface of the p+ layer 14p under which the pixel dividing portion PB will be formed and to cover parts other than the exposed part.

Specifically, a photoresist film (not shown) is formed on the p+ layer 14p through application, and the resist pattern PR is formed by patterning the photoresist film by lithography.

B-3. An Ion Implantation

Figure 36:
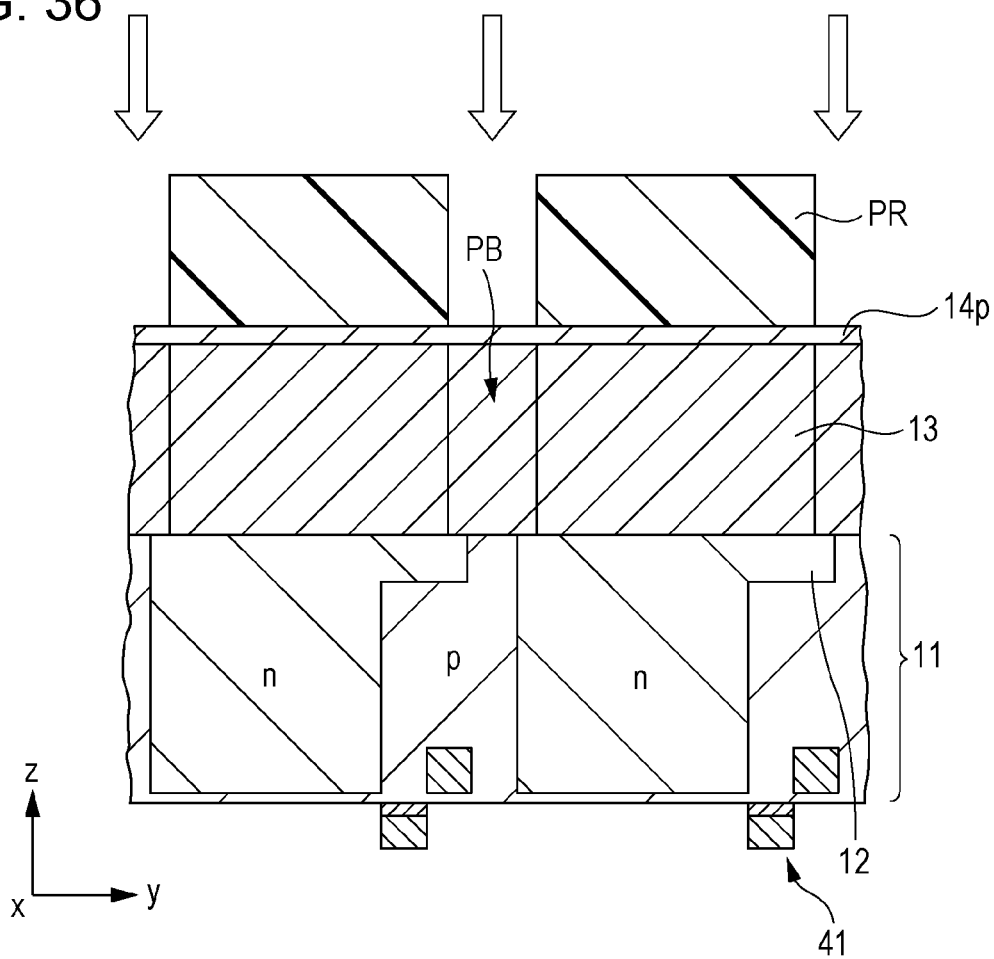
FIG. 36 is a diagram illustrating a manufacturing method of the solid-state imaging device according to the second embodiment.

Next, as shown in FIG. 36, the ion implantation is performed.

Here, as shown in FIG. 36, an impurity is ion-implanted into the photoelectric conversion film 13 by using the resist pattern PR as a mask. Thereby, the impurity is ion-implanted into the part where the pixel dividing portion PB is formed in the photoelectric conversion film 13 from the aperture of the resist pattern PR.

In this embodiment, a p type impurity such as Ga, In, As or P is ion-implanted into the part where the pixel dividing portion PB is formed in the photoelectric conversion film 13, and the p type impurity is contained with a high concentration.

For example, the ion implantation is performed such that the concentration of the p type impurity is $10^{17}$ to $10^{19}$ cm$^{-3}$ in the part where the pixel dividing portion PB is formed.

The resist pattern PR is removed from the upper surface of the p+ layer 14p.

B-4. Formation of the Pixel Dividing Portion PB

Figure 37:
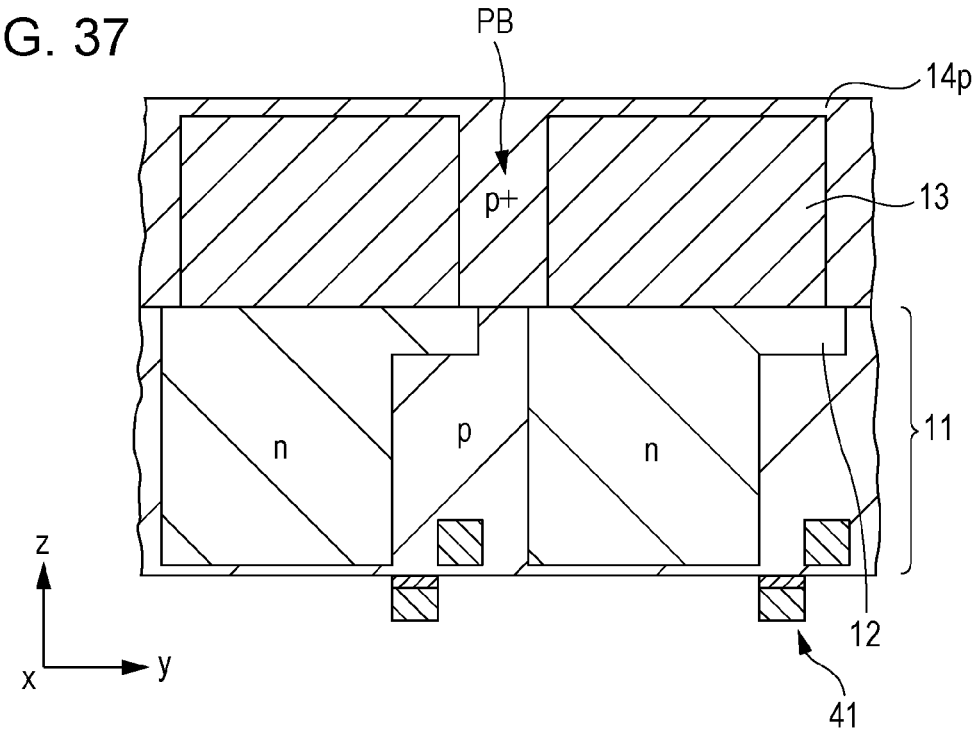
FIG. 37 is a diagram illustrating a manufacturing method of the solid-state imaging device according to the second embodiment.

Next, as shown in FIG. 37, the pixel dividing portion PB is formed.

Here, the pixel dividing portion PB is formed by activation through annealing.

Specifically, the pixel dividing portion PB is formed through the annealing at a temperature of 400° C. or more.

In this way, the pixel dividing portion PB is formed by selectively doping the part forming the pixel dividing portion PB inside the photoelectric conversion film 13 which is formed to include the part forming the pixel dividing portion PB on the silicon substrate 11.

Also, as shown in FIG. 32, the respective portions such as the color filters CF and the on-chip lenses ML are formed on the upper surface (rear surface) of the silicon substrate 11. Through the steps, the rear surface illumination type CMOS image sensor is completed.

C. Conclusion

In this embodiment, in the same manner as the first embodiment, the photoelectric conversion film 13 is provided at the side where the incident light H enters when seen from the respective portions such as the n type impurity areas 12 and 411 in the silicon substrate 11, and thus blocks the incident light H from entering the n type impurity areas 12 and 411 (refer to FIG. 32). For this reason, in this embodiment and in the same manner as the first embodiment, it is possible to realize a small size, prevent the generation of noise, and improve the image quality of a captured image.

In addition, in this embodiment, the pixel dividing portion PB is formed to be interposed between the plural pixels P. The pixel dividing portion PB is made of the compound semiconductor of which the doping concentration is controlled, so as to form potential barriers between the photoelectric conversion films 13 which are formed corresponding to the plural pixels P.

Thereby, in this embodiment, it is possible to prevent a color mixture using the pixel dividing portion PB. In the related art in which there is no pixel dividing portion PB, the electrons generated through the photoelectric conversion are freely moved between the pixels. Assuming that the electrons are moved equally in all directions, about 30% of the electrons in a pixel of 1.5 μm are moved to neighboring pixels. The movement almost disappears due to the pixel dividing portion PB formed between the pixels P.

Further, in this embodiment, the p+ layer 14p, which is a diffusion layer of the impurity with high concentration, is formed on the surface of the photoelectric conversion film 13 at the side which the incident light enters. Therefore, it is possible to suppress the generation of a dark current.

Also, in this embodiment, the p+ layer 14p is formed to be connected to each other among the plural pixels P. For this reason, holes enters the p+ layer 14p from the photoelectric conversion film 13 and then are moved to the pixels P in the transverse direction, and electrons generated in the photoelectric conversion film 13 are moved to the silicon substrate 11 side. Thereby, the transparent electrode may not be formed on the upper surface of the photoelectric conversion film 13.

3. A Third Embodiment (a Case of Forming a Pixel Dividing Portion which is Doped Through a Lateral Growth)

A. A Device Configuration and the Like

Figure 38:
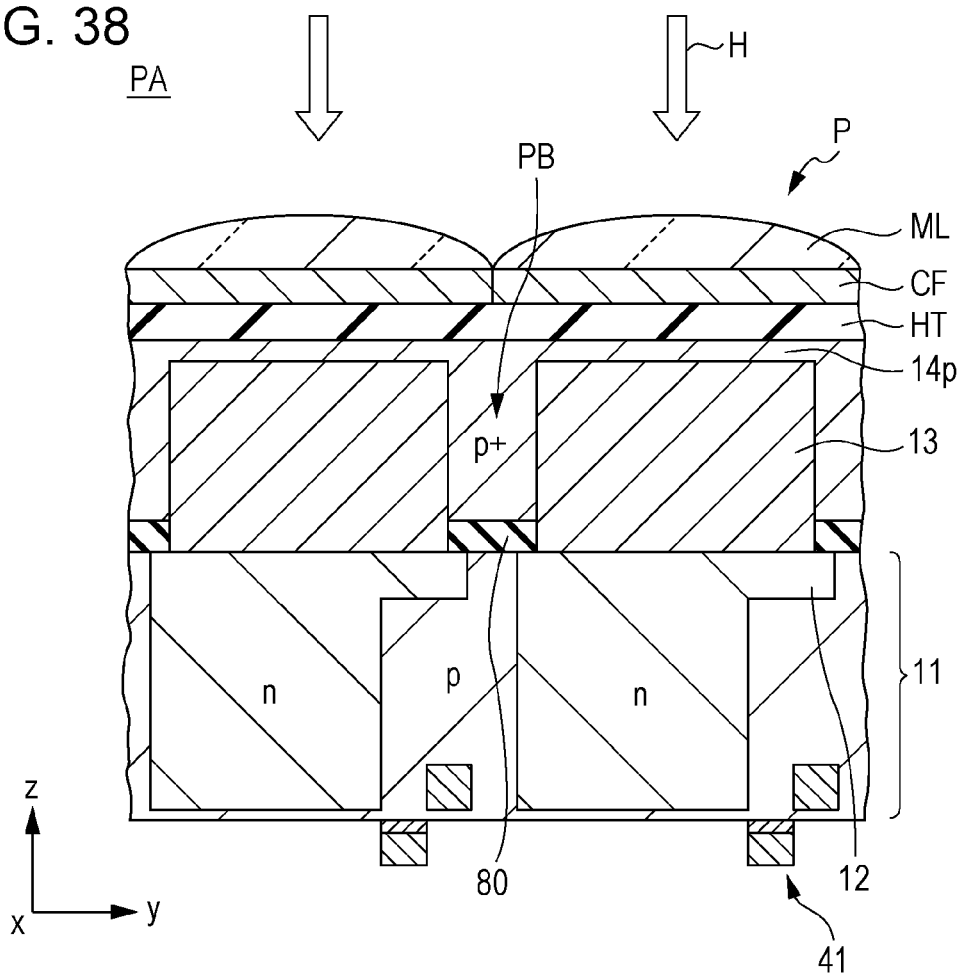
FIG. 38 is a diagram illustrating main portions of the solid-state imaging device according to a third embodiment.

FIG. 38 is a diagram illustrating the main portions of a solid-state imaging device according to a third embodiment.

FIG. 38 shows a cross-section of the pixel P in the same manner as FIG. 32.

As shown in FIG. 38, in this embodiment, an insulating film 80 is provided. Except for this, this embodiment is the same as the second embodiment. Therefore, the description of the overlapping parts will be omitted.

As shown in FIG. 38, the insulating film 80 is provided on one surface of the silicon substrate 11.

Here, in the silicon substrate 11, the insulating film 80 is provided at the part forming the pixel dividing portion PB on the surface (rear surface) side opposite to the surface (front surface) on which the respective portions such as the gate MOS 41 and the like are provided. For example, a silicon oxide film is provided as the insulating film 80. In addition, the insulating film 80 may be made of a material such as silicon nitride.

Details will be described later, and the insulating film 80 is provided on surfaces of parts other than the parts forming the photoelectric conversion film 13 such that the photoelectric conversion film 13 is selectively crystal-grown on the surface (rear surface) of the silicon substrate 11.

The pixel dividing portion PB is provided on the silicon substrate 11 with the insulating film 80 interposed therebetween.

B. Manufacturing Method

The essence of the manufacturing method of the solid-state imaging device will be described.

Figure 39:
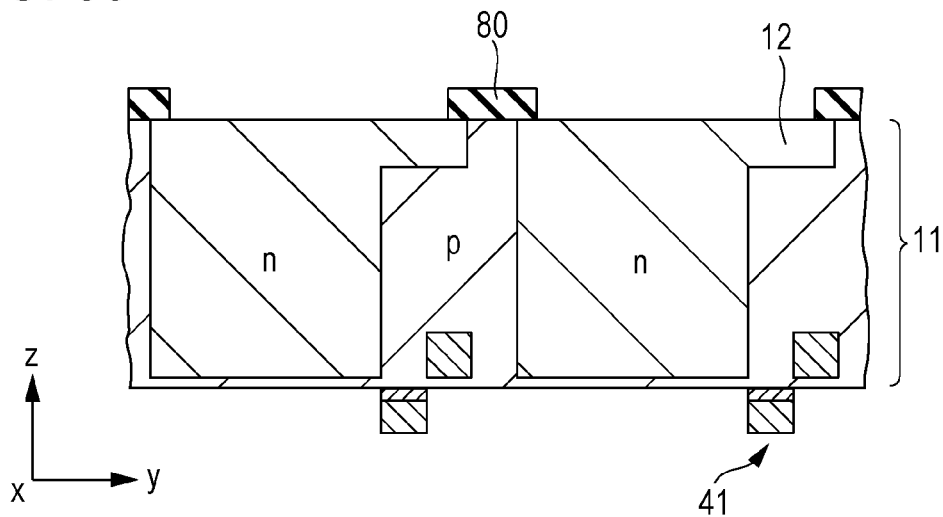
FIG. 39 is a diagram illustrating a manufacturing method of the solid-state imaging device according to the third embodiment.
Figure 40:
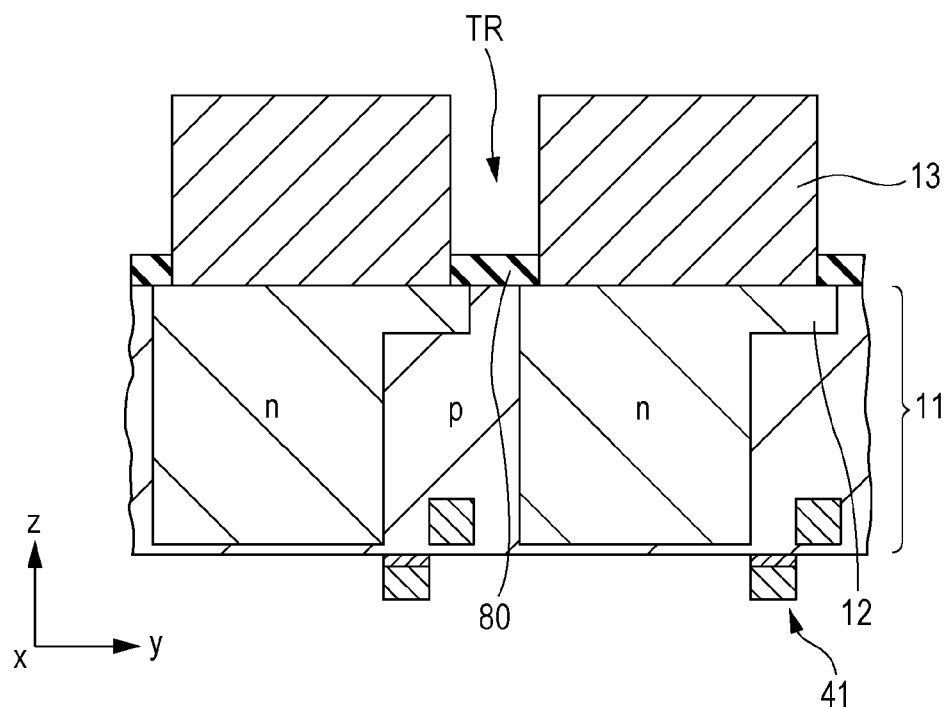
FIG. 40 is a diagram illustrating a manufacturing method of the solid-state imaging device according to the third embodiment.
Figure 41:
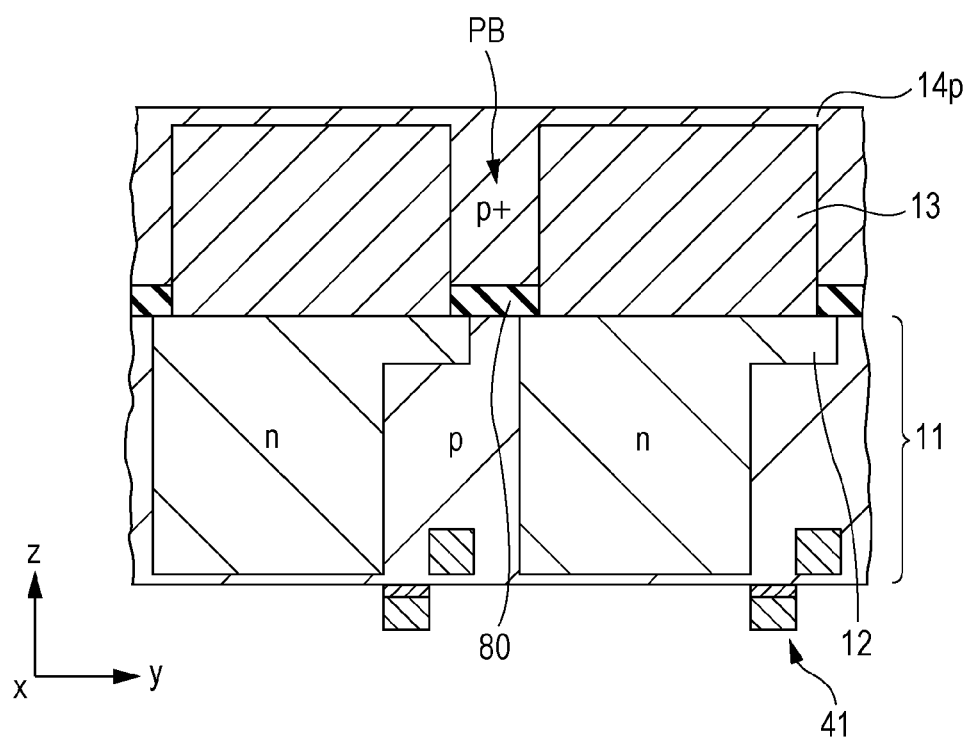
FIG. 41 is a diagram illustrating a manufacturing method of the solid-state imaging device according to the third embodiment.

FIGS. 39 to 41 are diagrams illustrating a manufacturing method of the solid-state imaging device according to the third embodiment.

Here, FIGS. 39 to 41 show the cross-sections in the same manner as FIG. 38, and the solid-state imaging device shown in FIG. 38 is manufactured through the respective steps shown in FIGS. 39 to 41.

B-1. Formation of the Insulating Film 80

First, the insulating film 80 is formed as shown in FIG. 39.

Here, the respective portions such as the gate MOS 41 are formed on the surface of the silicon substrate 11 before the insulating film 80 is formed in the same manner as the first embodiment. Further, the wire layer (not shown) is formed on the surface (front surface) of the silicon substrate 11 so as to cover the respective portions such as the gate MOS 41.

Next, as shown in FIG. 39, the insulating film 80 is formed in the parts in which the pixel dividing portion PB is formed on the opposite surface (rear surface) to the surface on which the respective portions such as the gate MOS 41 are formed in the silicon substrate 11. In other words, the insulating film 80 is formed to partition the plural pixels P.

Specifically, for example, a silicon oxide film (not shown) is formed to cover the rear surface (upper surface) of the silicon substrate 11. Thereafter, the silicon oxide film is patterned to form the insulating film 80 by the photolithography method.

For example, the insulating film 80 is formed to have the film thickness of 50 to 100 nm.

B-2. Formation of the Photoelectric Conversion Film 13

Next, as shown in FIG. 40, the photoelectric conversion film 13 is formed.

Here, as shown in FIG. 40, the photoelectric conversion film 13 is sequentially formed on the opposite surface (rear surface) to the surface on which the respective portions such as the gate MOS 41 are formed in the silicon substrate 11. In the same manner as the second embodiment, the photoelectric conversion film 13 is made of the compound semiconductor with the chalcopyrite structure.

The photoelectric conversion film 13 is formed on the silicon substrate 11 through the epitaxial growth of the compound semiconductor by the MOCVD method, the MBE method, or the like.

In this embodiment, unlike the case of the first embodiment, the compound semiconductor is epitaxially grown to selectively cover the parts forming the photoelectric conversion films on the upper surface of the silicon substrate 11, and the photoelectric conversion films 13 are formed.

As shown in FIG. 39, the insulating film 80 is formed to partition the plural pixels P on the silicon substrate 11. For this reason, on the surface of the silicon substrate 11, the photoelectric conversion films 13 are formed on the exposed parts other than the parts forming the insulating films 80. Here, the photoelectric conversion film 13 is formed to be thicker than the insulating film 80. Thereby, trenches TR are provided between the photoelectric conversion films 13 provided to correspond to the respective pixels P.

B-3. Formation of the Pixel Dividing Portion PB and the p+ Layer 14p

Next, the pixel dividing portion PB and the p+ layer 14p are formed as shown in FIG. 41.

Here, as shown in FIG. 41, the pixel dividing portion PB and the p+ layer 14p are formed on the opposite surface (rear surface) to the surface on which the respective portions such as the gate MOS 41 are formed in the silicon substrate 11. In other words, the pixel dividing portion PB and the p+ layer 14p are formed such that the pixel dividing portion PB covers the insulating film 80 and the p+ layer 14p covers the photoelectric conversion film 13.

For example, each of the pixel dividing portion PB and the p+ layer 14p is made of a compound semiconductor with the chalcopyrite structure.

Specifically, the compound semiconductor is laterally grown under the condition of including a lot of an impurity such as Ga, In, As, or P. Thereby, the compound semiconductor is implanted into the trench TR between the photoelectric conversion films 13, thus the pixel dividing portion PB is formed and the p+ layer 14*p* is formed on the photoelectric conversion film 13.

For example, the pixel dividing portion PB and the p+ layer 14*p* are formed to have the impurity concentration of $10^{17}$ to $10^{19}$ cm$^{-3}$.

In this way, on the silicon substrate 11, the pixel dividing portion PB is formed through the crystal growth of the compound semiconductor so as to cover the part forming the pixel dividing portion PB. Along therewith, the p+ layer 14*p* is formed through the crystal growth of the compound semiconductor so as to cover the upper surface of the photoelectric conversion film 13.

Also, as shown in FIG. 38, the respective portions such as the color filters CF and the on-chip lenses ML are formed on the upper surface (rear surface) of the silicon substrate 11. Through these steps, the rear surface illumination type CMOS image sensor is completed.

C. Conclusion

As described above, in this embodiment, in the same manner as the second embodiment, the photoelectric conversion film 13 is provided at the side where the incident light H enters when seen from the respective portions such as the n type impurity areas 12 and 411 in the silicon substrate 11, and thus blocks the incident light H from entering the n type impurity areas 12 and 411 (refer to FIG. 38). For this reason, in this embodiment and in the same manner as the second embodiment, it is possible to realize a small size, prevent the generation of noise, and improve the image quality of a captured image.

In addition, in this embodiment, the pixel dividing portion PB is formed to be interposed between the pixels P in the same manner as the second embodiment. The pixel dividing portion PB is provide so as to form potential barriers between the photoelectric conversion films 13 which are formed corresponding to the plural pixels P. Thereby, in this embodiment, it is possible to prevent a color mixture using the pixel dividing portion PB.

This embodiment is appropriate in terms of manufacturing costs since the number of process steps such as the ion implantation and the annealing is reduced as compared with the above-described embodiments. Further, since the ion implantation or the annealing is not performed, there is no damage caused by the processes (for example, damage during the ion implantation or an adverse effect on the wire layer during the annealing).

4. A Fourth Embodiment (in a Case of Forming a Pixel Dividing Portion Through Control of Composition) (Non-Doping)

A. A Device Configuration and the Like

Figure 42:
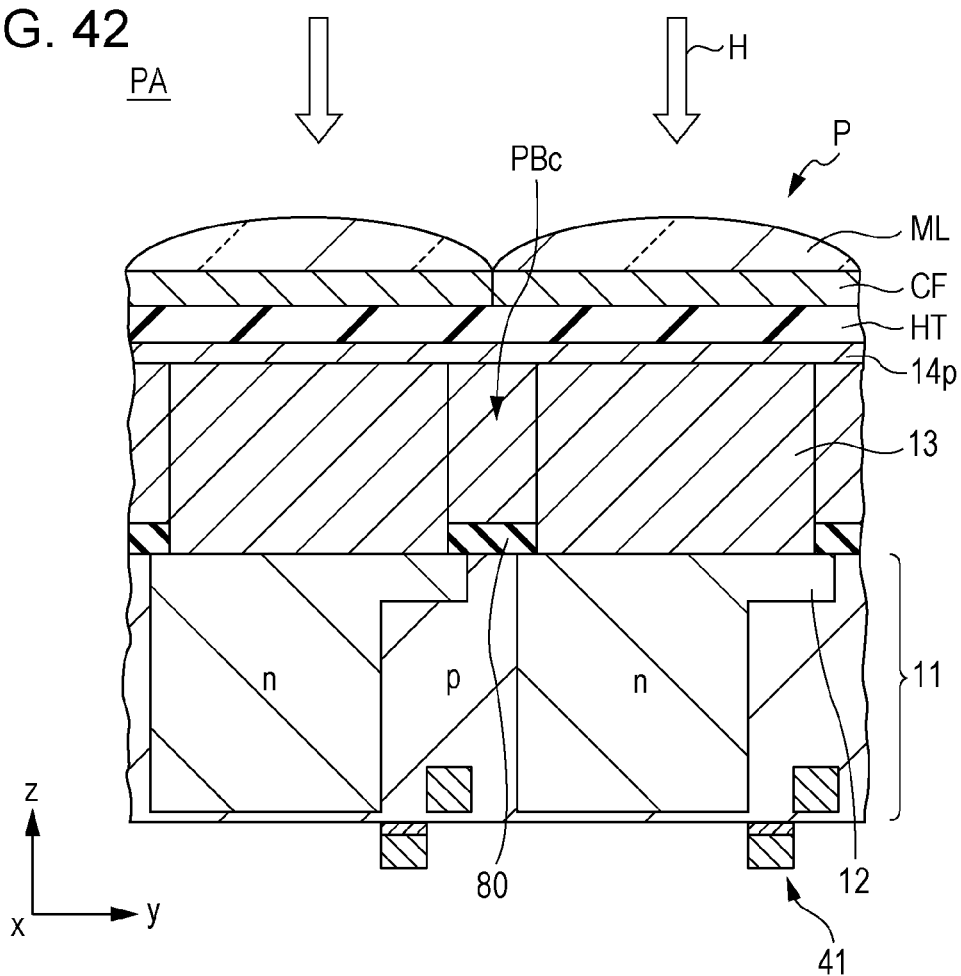
FIG. 42 is a diagram illustrating main portions of the solid-state imaging device according to a fourth embodiment.

FIG. 42 is a diagram illustrating main portions of a solid-state imaging device according to a fourth embodiment.

FIG. 42 shows a cross-section of the pixel P in the same manner as FIG. 38.

As shown in FIG. 42, in this embodiment, a pixel dividing portion PBc is provided unlike the third embodiment. Except for this, this embodiment is the same as the third embodiment. Therefore, the description of the overlapping parts will be omitted.

The pixel dividing portion PBc, as shown in FIG. 42, is provided to cover the insulating film 80 between the plural photoelectric conversion films 13 formed corresponding to the pixels P.

In this embodiment, the pixel dividing portion PBc is made of a semiconductor which does not include p type impurities unlike the second embodiment. For example, the pixel dividing portion PBc is made of a chalcopyrite based compound semiconductor having a wide band gap. For example, the pixel dividing portion PBc is formed such that the band gap is kT=27 meV or more. In this way, potential barriers are formed between the plural photoelectric conversion films 13 formed corresponding to the pixels P, and the pixels P are divided by the pixel dividing portion PBc.

B. Manufacturing Method

The essence of the manufacturing method of the solid-state imaging device will be described.

Figure 43:
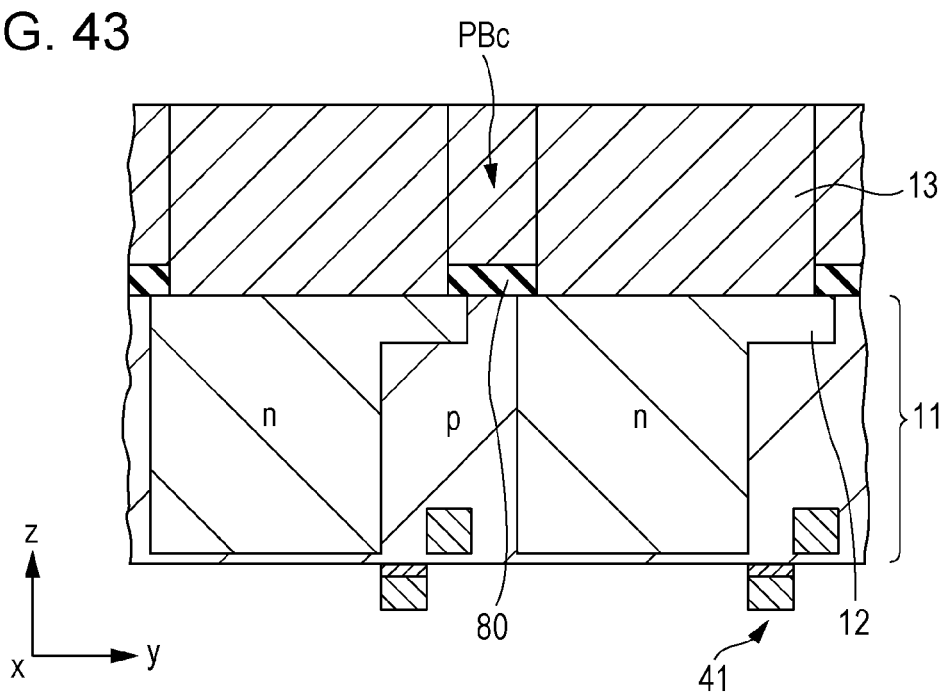
FIG. 43 is a diagram illustrating a manufacturing method of the solid-state imaging device according to the fourth embodiment.
Figure 44:
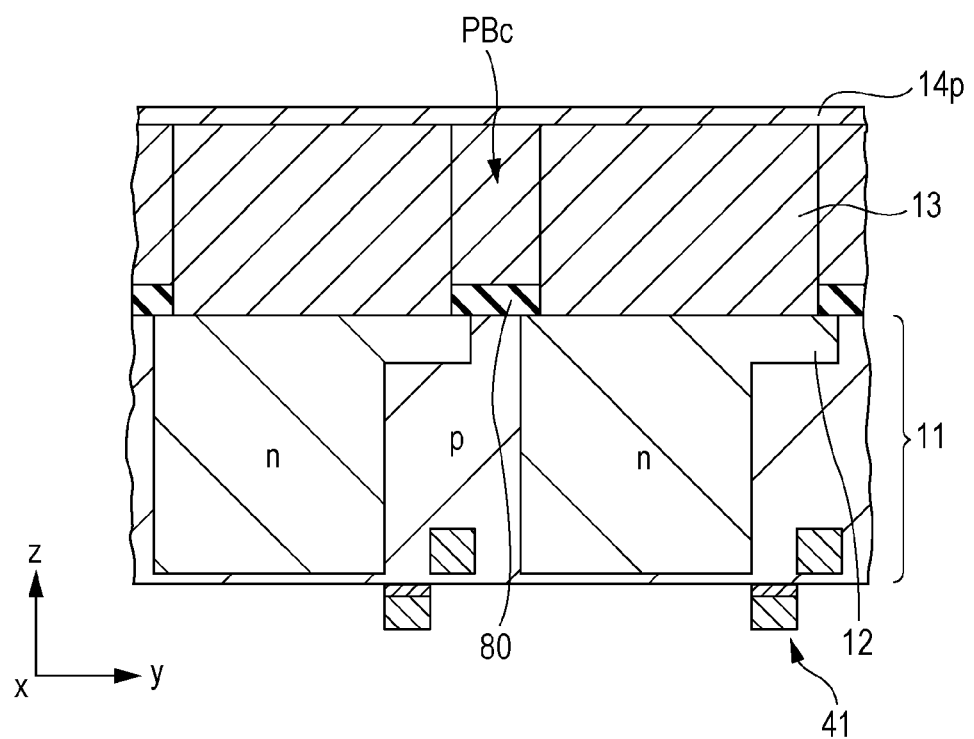
FIG. 44 is a diagram illustrating a manufacturing method of the solid-state imaging device according to the fourth embodiment.

FIGS. 43 and 44 are diagrams illustrating a manufacturing method of the solid-state imaging device according to the fourth embodiment.

Here, FIGS. 43 and 44 show the cross-sections in the same manner as FIG. 42, and the solid-state imaging device shown in FIG. 42 is manufactured through the respective steps shown in FIGS. 43 and 44.

B-1. Formation of the Pixel Dividing Portion PBc

First, as shown in FIG. 43, the pixel dividing portion PBc is formed.

Here, the insulating film 80 and the photoelectric conversion film 13 are formed in the same manner as the second embodiment before the pixel dividing portion PBc is formed (refer to FIGS. 39 and 40).

Next, as shown in FIG. 43, the pixel dividing portion PBc is formed to cover the insulating film 80 between the plural photoelectric conversion films 13 formed corresponding to the pixels P.

In this step, the pixel dividing portion PBc is formed, for example, using a chalcopyrite based compound semiconductor having a wide band gap.

Specifically, unlike the third embodiment, the compound semiconductor is laterally grown under a condition of not including p type impurities. Thereby, the compound semiconductor is implanted into the trench TR between the photoelectric conversion films 13.

For example, the pixel dividing portion PBc is formed such that a composition ratio of copper-aluminum-gallium-indium-sulfur-selenium is 1.0:0.36:0.64:0:1.28:0.72, or 1.0:0.24:0.23:0.53:2.0:0. That is to say, the pixel dividing portion PBc is formed to give $CuAl_{0.36}Ga_{0.64}S_{1.28}Se_{0.72}$ or $CuAl_{0.24}Ga_{0.23}In_{0.53}S_2$.

B-2. Formation of the p+ Layer 14*p*

As shown in FIG. 44, the p+ layer 14*p* is formed. Here, as shown in FIG. 44, the p+ layer 14*p* is formed to cover the photoelectric conversion films 13 and the pixel dividing portions PBc on the rear surface (upper surface) side of the silicon substrate 11.

For example, the p+ layer 14*p* is made of a compound semiconductor with the chalcopyrite structure in the same manner as the second embodiment.

Specifically, the compound semiconductor is crystal-grown under the condition of including a lot of an impurity such as Ga, In, As, or P, thereby forming the p+ layer 14*p*.

Also, as shown in FIG. 42, the respective portions such as the color filters CF and the on-chip lenses ML are formed on the upper surface (rear surface) of the silicon substrate 11. Through the steps, the rear surface illumination type CMOS image sensor is completed.

C. Conclusion

As described above, in this embodiment, in the same manner as the second embodiment, the photoelectric conversion film 13 is provided at the side where the incident light H enters when seen from the respective portions such as the n type impurity areas 12 and 411 in the silicon substrate 11, and thus blocks the incident light H from entering the n type impurity areas 12 and 411 (refer to FIG. 42). For this reason, in this embodiment in the same manner as the second embodiment, it is possible to realize a small size, prevent the generation of noise, and improve the image quality of a captured image.

In this embodiment, the pixel dividing portion PBc is made of the compound semiconductor of which the composition is controlled, so as to form potential barriers between the photoelectric conversion films 13 which are formed corresponding to the plural pixels P. Thereby, in this embodiment, it is possible to prevent a color mixture using the pixel dividing portion PBc.

Since the potential barriers are formed through the control of composition and the doping is not performed in this embodiment, the crystallinity of the pixel dividing portion PBc is good as compared with the cases of other embodiments. In addition, this embodiment is appropriate in terms of manufacturing costs since the number of process steps such as the ion implantation and the annealing is reduced as compared with other embodiments.

5. A Fifth Embodiment (in a Case of Reading Out Signal Charges Via Metal Electrodes (a Rear Surface Illumination Type))

A. A Device Configuration and the Like

Figure 45:
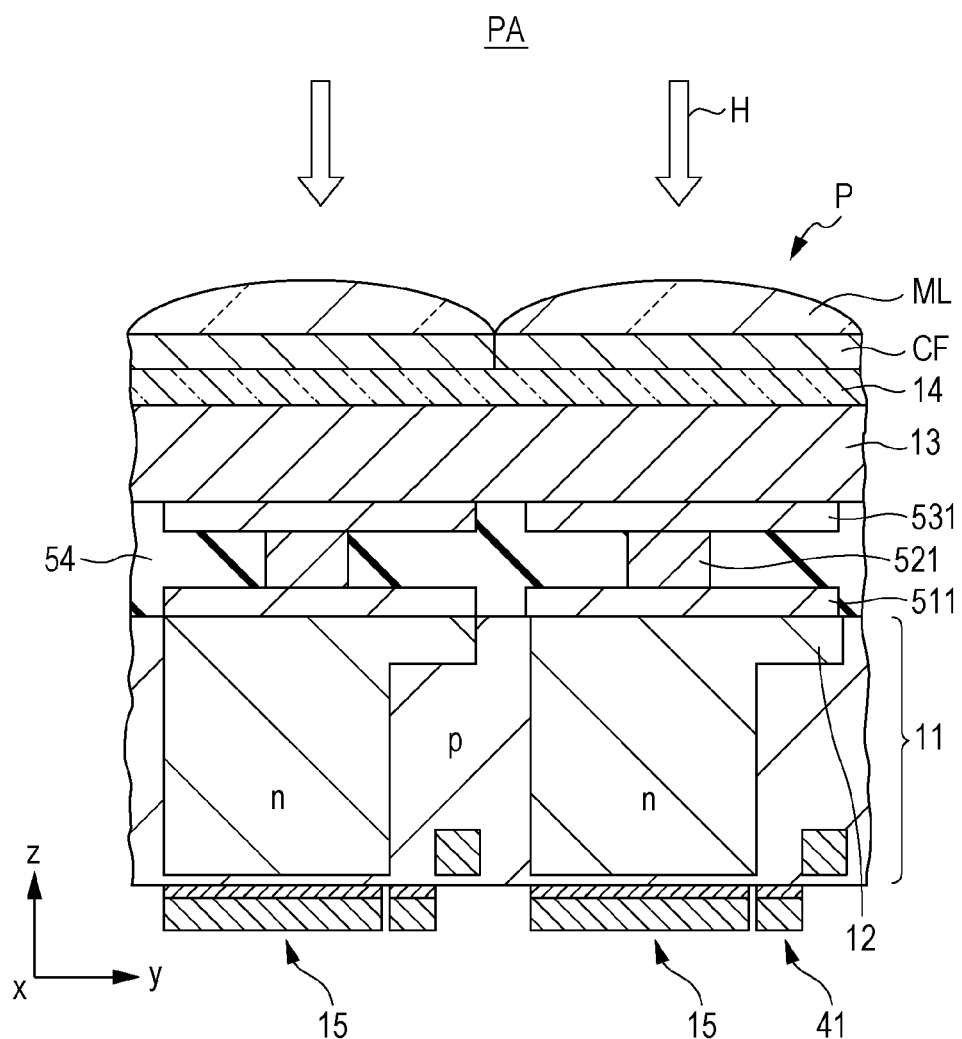
FIG. 45 is a diagram illustrating main portions of a solid-state imaging device according to a fifth embodiment of the present invention.

FIG. 45 is a diagram illustrating main portions of a solid-state imaging device according to a fifth embodiment.

FIG. 45 shows a cross-section of the pixel P in the same manner as FIG. 3.

As shown in FIG. 45, this embodiment is different from the modified example 1-5 of the first embodiment in that electrodes 511 and 531, and a contact 521 are further provided. Except for this, this embodiment is the same as the modified example 1-5 of the first embodiment. Therefore, the description of the overlapping parts will be omitted.

A set of the electrodes 511 and 531 and the contact 521 are formed corresponding to each pixel P as shown in FIG. 45. Here, in the silicon substrate 11, the electrodes 511 and 531 and the contact 521 are formed on the upper surface of the n type impurity area 12 formed for each pixel P. An insulating layer 54 is provided around the pixels P to insulate each other of the pixels P.

The electrodes 511 and 531 and the contact 521 make an electric connection between the photoelectric conversion film 13 and the n type impurity area 12, and thus the signal charges generated in the photoelectric conversion film 13 are moved to the n type impurity area 12 via the electrodes 511 and 531 and the contact 521.

The electrodes 511 and 531 are formed using metal materials, and block light from above.

B. Conclusion

In this embodiment, in the same manner as the first embodiment, the photoelectric conversion film 13 is provided at the side where the incident light H enters when seen from the respective portions such as the n type impurity areas 12 and 411 in the silicon substrate 11, and thus blocks the incident light H from entering the n type impurity areas 12 and 411 (refer to FIG. 45). Also, the electrodes 511 and 531 are formed as lower electrodes in the lower side of the photoelectric conversion film 13, and the electrodes 511 and 531 block the incident light H from entering the n type impurity areas 12 and 411 and the like (refer to FIG. 45). In other words, in this embodiment, due to the combination of the photoelectric conversion film 13 and the lower electrode 531, the incident light H is blocked.

For this reason, in this embodiment in the same manner as the first embodiment, it is possible to realize a small size, prevent the generation of noise, and improve the image quality of a captured image.

Also, although the case where the photoelectric conversion film 13 has a light blocking function has been described, this embodiment is not limited thereto. Through the combination of the photoelectric conversion film 13 and the electrodes 511 and 531, light may be blocked from entering the n type impurity area 12. That is to say, the entire photoelectric conversion unit including the photoelectric conversion film 13 and the electrodes 511 and 531 functioning as the lower electrodes may realize the light blocking function.

6. A Sixth Embodiment (in a Case of Reading Out Signal Charges Via Metal Electrodes (a Front Surface Illumination Type))

A. A Device Configuration and the Like

Figure 46:
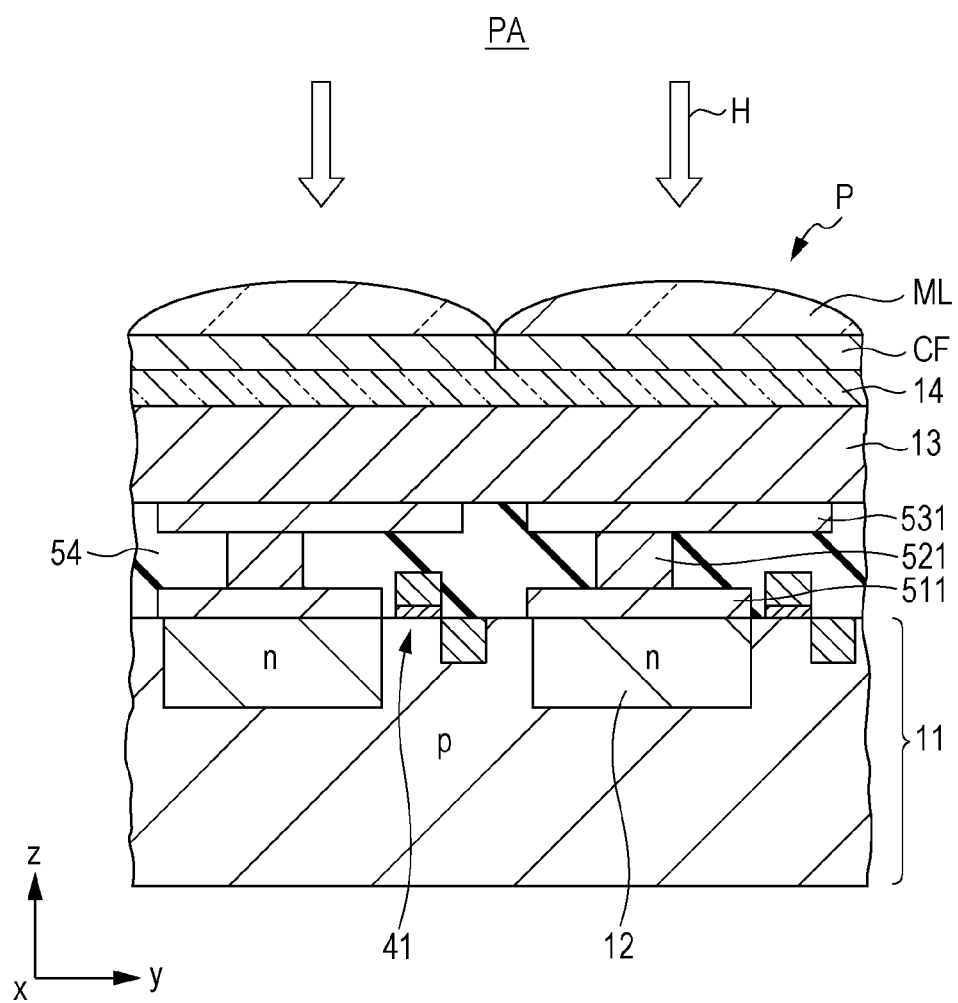
FIG. 46 is a diagram illustrating main portions of a solid-state imaging device according to a sixth embodiment.

FIG. 46 is a diagram illustrating main portions of a solid-state imaging device according to a sixth embodiment.

FIG. 46 shows a cross-section of the pixel P in the same manner as FIG. 45.

As shown in FIG. 46, in this embodiment, a position of the gate MOS 41 is different. Also, the n type impurity area 12 is different. Except for this and parts related thereto, this embodiment is the same as the fifth embodiment. Therefore, the description of the overlapping parts will be omitted.

As shown in FIG. 46, in this embodiment, the electrodes 511 and 531 and the contact 521 are provided on the upper surface of the silicon substrate 11 in the same manner as the fifth embodiment. Unlike the fifth embodiment, the gate MOS 41 is also provided on the upper surface of the silicon substrate 11. Although not shown, the gate MOS 42 and the readout circuit 51 are provided separately in addition to the gate MOS 41. Wires connected to the respective portions such as the gate MOS 41 and the like are provided on one surface of the silicon substrate 11.

The n type impurity area 12 is provided inside the silicon substrate 11 in the same manner as the fifth embodiment. However, unlike the fifth embodiment, the n type impurity area 12 is provided on the upper surface side of the silicon substrate 11 and is not provided around the lower surface.

The wire layer (not shown) is not provided on the upper surface of the silicon substrate 11 unlike the fifth embodiment.

In this embodiment, the photoelectric conversion film 13 senses the incident light H coming from the upper surface (front surface) on which the respective portions such as the photoelectric conversion film 13 are provided on the silicon substrate 11. In other words, the solid-state imaging device in this embodiment is a "front surface illumination type CMOS image sensor."

B. Conclusion

In this embodiment, in the same manner as the fifth embodiment, the photoelectric conversion film 13 is provided at the side where the incident light H enters when seen from the respective portions such as the n type impurity areas 12 and 411 in the silicon substrate 11, and thus blocks the incident light H from entering the n type impurity areas 12 and 411 (refer to FIG. 46). Also, the electrodes 511 and 531 are formed as lower electrodes in the lower side of the photoelectric conversion film 13, and the electrodes 511 and 531 block the incident light H from entering the n type impurity areas 12 and 411 and the like (refer to FIG. 46). In other words, in this embodiment, due to the combination of the photoelectric conversion film 13 and the lower electrode 531, the incident light H is blocked.

For this reason, in this embodiment in the same manner as the fifth embodiment, it is possible to realize a small size, prevent the generation of noise, and improve the image quality of a captured image.

Also, although the case where the photoelectric conversion film 13 has a light blocking function has been described, this embodiment is not limited thereto. Through the combination of the photoelectric conversion film 13 and the electrodes 511 and 531, light may be blocked from entering the n type impurity area 12. That is to say, the entire photoelectric conversion unit including the photoelectric conversion film 13 and the electrodes 511 and 531 functioning as the lower electrodes may realize the light blocking function.

7. A Seventh Embodiment (in a Case of Using an Off Substrate)

A. A Configuration and the Like

In the above-described embodiments, the silicon substrate of which a main surface is the (100) plane is used, the above-described compound semiconductor is epitaxially grown in the main surface, thereby forming the photoelectric conversion film. In other words, the case of using the {100} substrate has been described. However, the present invention is not limited thereto.

When the above-described compound semiconductor is epitaxially grown using an ionic element as a material on a nonpolar silicon substrate with no ionic property, there are cases where a defect called an antiphase domain occurs. That is to say, cation and anion locally have antiphase and are grown, thereby generating the antiphase domain.

For this reason, as the silicon substrate, an off substrate may be used. It is possible to suppress the generation of the antiphase domain through the epitaxial growth on the off substrate (refer to Mitsuhisa Kawabe, Hidetoshi Takasugi, Toshio Ueda, and Akira Yokoyama, and Yoshio Bando: Initial Growth Process of GaAs on Si; Division of Crystals Science and Technology, 4th Crystal Engineering Symposium Text (1987 Jul. 17) pp. 1-8)

Figure 47:
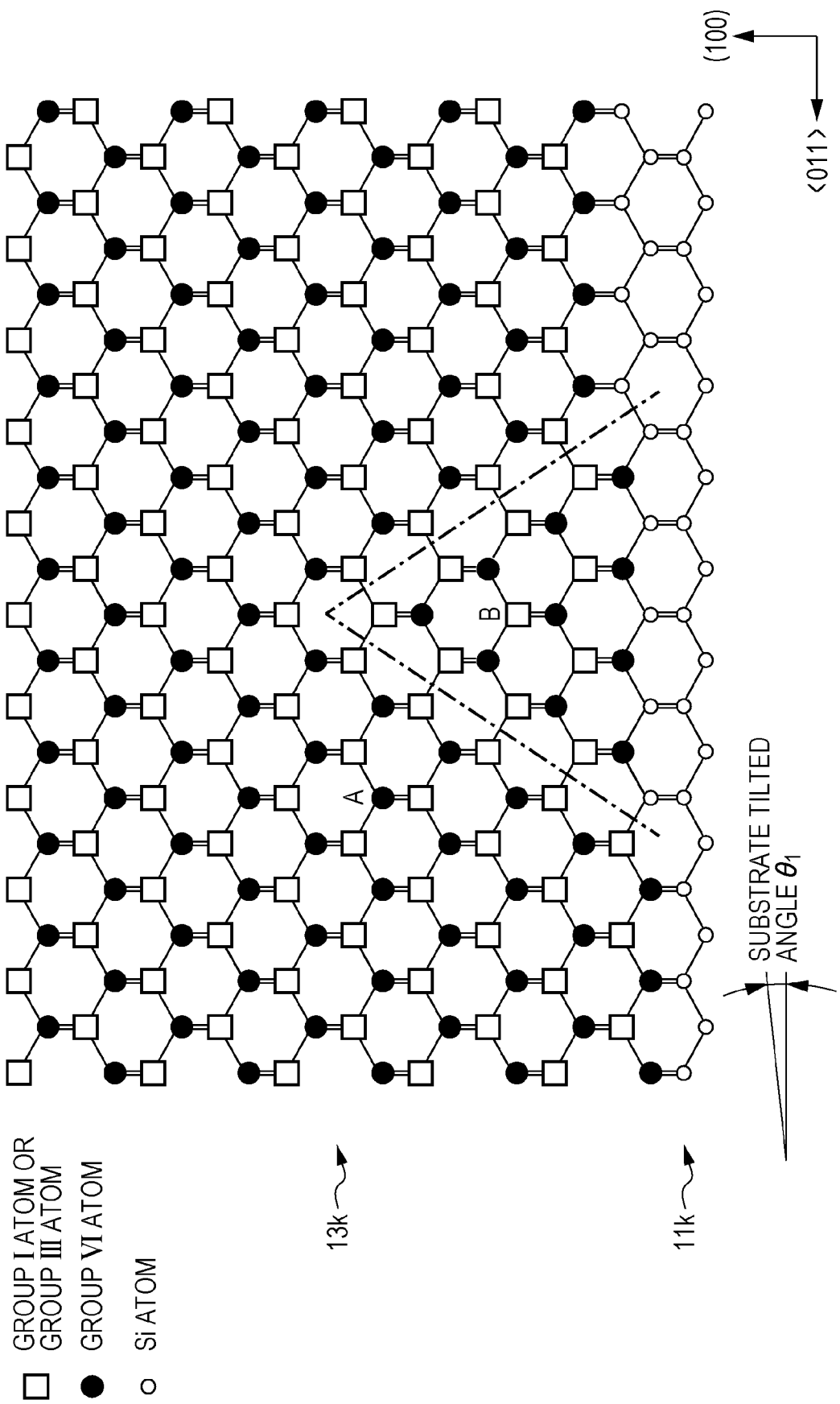
FIG. 47 is a diagram illustrating an atomic arrangement when a photoelectric conversion film is formed on a silicon substrate which is an off substrate, according to a seventh embodiment.
Figure 48:
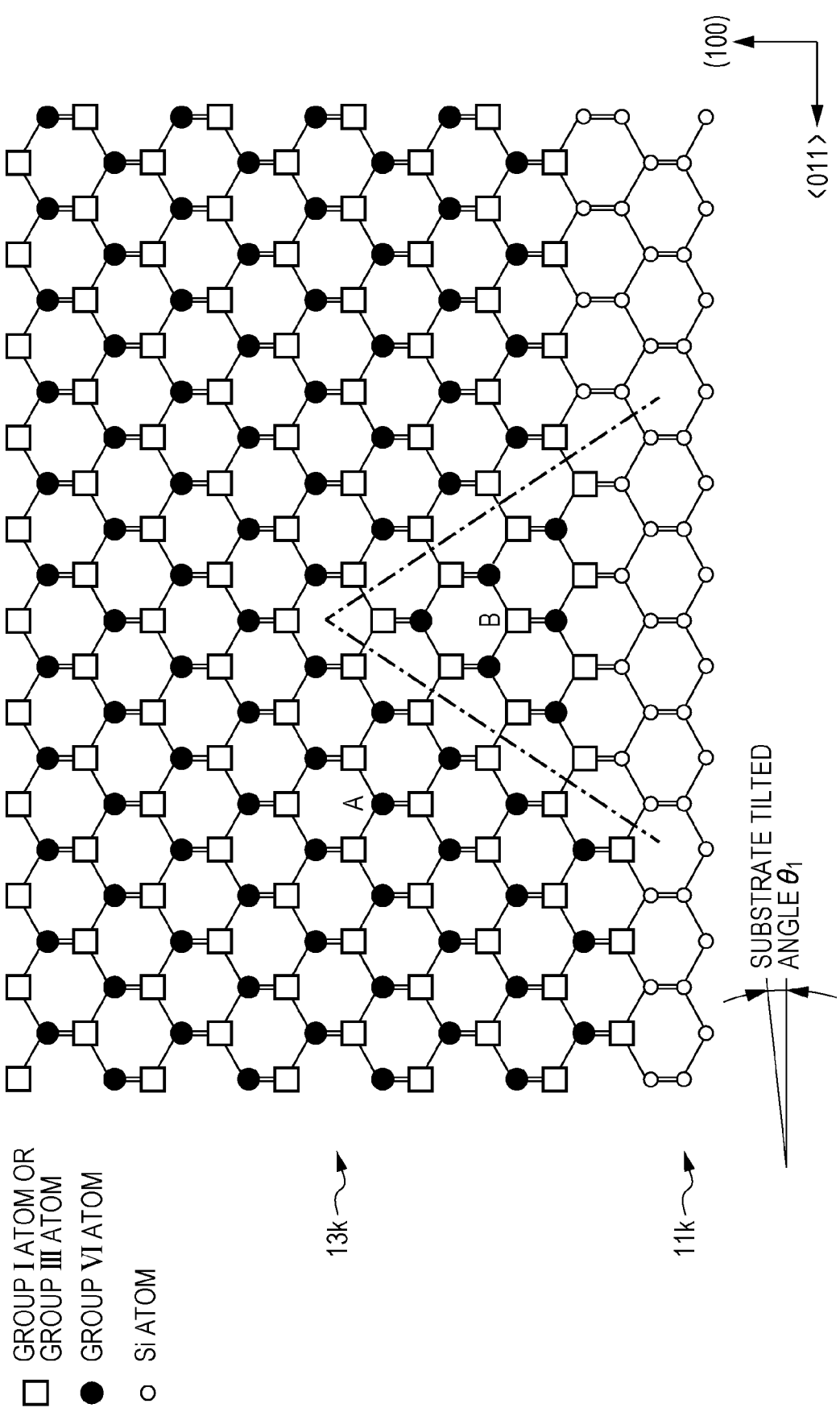
FIG. 48 is a diagram illustrating an atomic arrangement when a photoelectric conversion film is formed on a silicon substrate which is an off substrate, according to the seventh embodiment.
Figure 49:
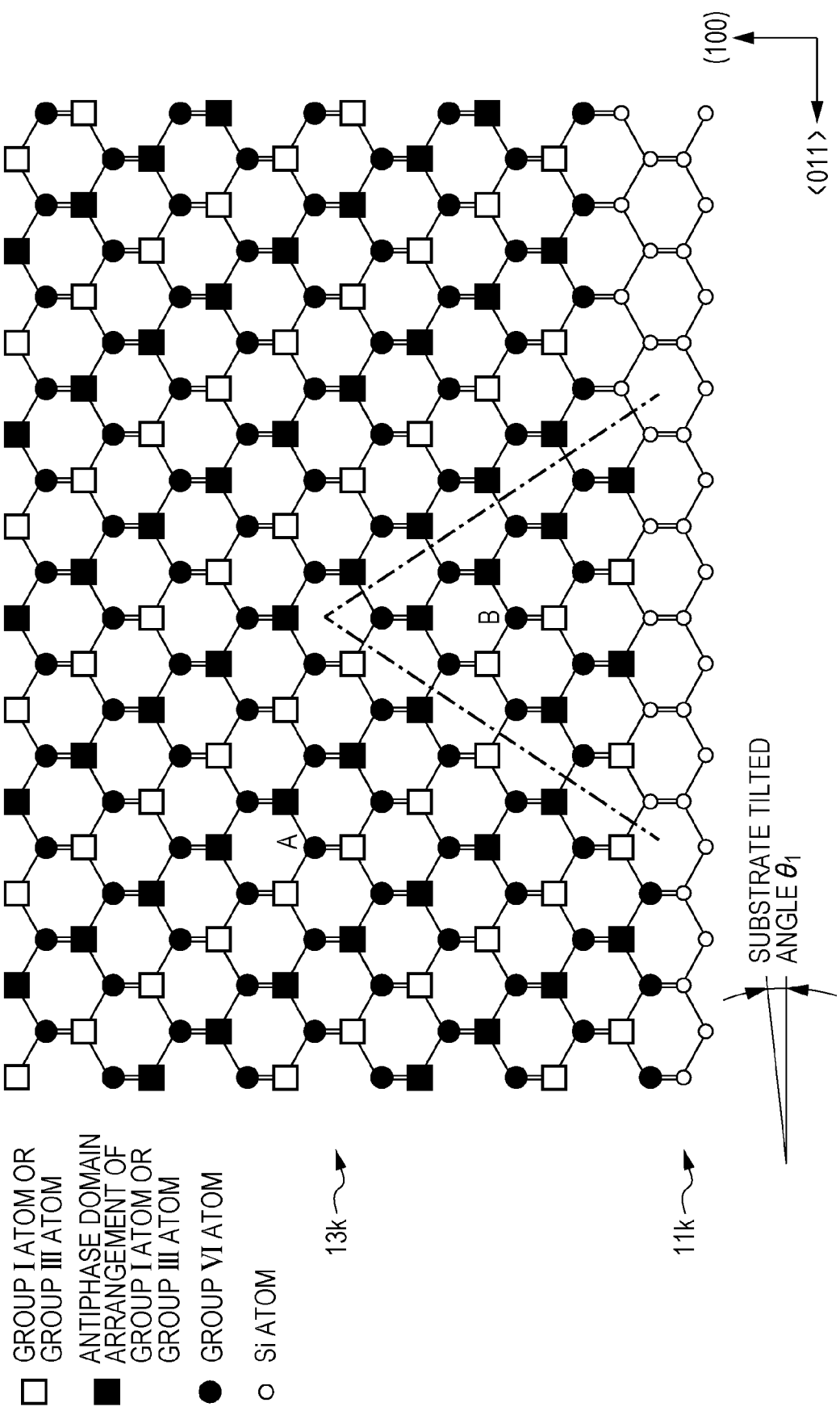
FIG. 49 is a diagram illustrating an atomic arrangement when a photoelectric conversion film is formed on a silicon substrate which is an off substrate, according to the seventh embodiment.

FIGS. 47 to 49 are diagrams illustrating atomic arrangements when a photoelectric conversion film 13k is formed on a silicon substrate 11k which is an off substrate in the seventh embodiment. FIGS. 47 to 49 are respectively cross-sectional views of a crystal when seen from the <0-1 1>direction.

In FIGS. 47 to 49, for example, a group I atom is a copper (Cu) atom, a group III atom is a gallium (Ga) atom or an indium (In) atom, and a group VI atom is a sulfur (S) atom, a selenium (Se) atom, or the like. In FIGS. 47 to 49, "group I strings or group III strings" marked with the white rectangle indicate that the group I atom and the group III atom are alternately arranged in the direction perpendicular to the paper. Also, in FIG. 49, "antiphase arrangement of group I atom or group III atom" marked with the black rectangle indicates that the group I atom and the group III atom are arranged reversely to "the group I atom strings or the group III atom strings." Specifically, in the <0-1 1>direction, the group I atom (for example, Cu) and the group III atom (for example, In) are alternately arranged via the group VI atom, but this positional relationship is reverse thereto.

Among the figures, FIG. 47 shows that the growth starts from the group VI atom on the silicon substrate 11k. FIG. 48 shows that the growth starts from the group I atom or the group III atom. FIGS. 47 and 48 show a case where the antiphase domain between the cation (positive ionic atom) the group I atom or the group III atom and the anion (negative ionic atom) of the group VI atom is annihilated. In contrast, FIG. 49 shows that the antiphase domain between the group I atom and the group III atom is annihilated.

As shown in FIGS. 47 to 49, in this embodiment, the off substrate in which, for example, the main surface is tilted with a predetermined tilted angle (off angle) $\theta_1$ in the <011>direction from the (100) plane is used as the silicon substrate 11k. In other words, the off substrate in which a {100} substrate is off in the <011>direction is used as the silicon substrate 11k. For example, an off substrate of which the tilted angle (off angle) $\theta_1$ is about 6° is used.

On the silicon substrate 11k which is an off substrate, the cation (positive ionic atom) of the group I or the group III and the anion (negative ionic atom) of the group VI are regularly arranged to form the photoelectric conversion film 13k.

In this case, the cation and the anion are grown in the antiphase locally as in the area B (area marked with the chain lines), thereby generating the antiphase domain.

However, as shown in FIGS. 47 to 49, the crystal is grown on the main surface of the off substrate, and the area B in which the antiphase domain is generated is closed in the triangular shape.

FIG. 50 is an enlarged perspective view of the area B in which the antiphase domain is generated when the photoelectric conversion film 13k is formed on the silicon substrate 11k in the seventh embodiment.

As shown in FIG. 50, in the area B, the antiphase domain with the triangular cross-section is formed to consecutively extend in the depth direction (<0-1 1>direction). In other words, the antiphase domain is formed in such a shape that a triangular prism reclines in the side.

Also, as shown in FIGS. 47 to 49, the epitaxial growth is performed to generate only the area A in which the antiphase domain is not generated, in the upper side of the area B.

For this reason, in this embodiment, it is possible to suppress the antiphase domain from being generated.

In FIGS. 47 to 49, although the case of the tilted angle $\theta_1=6°$ is shown, the present invention is not limited thereto. As long as there is a slight tilt, it achieves the operation and the effect due to the closeness in the triangular shape as described above. As the tilted angle $\theta_1$ is increased, the area B is smaller, but the tilted angle $\theta_1$ of 2° or more is preferable. Due to this, the area B is settled in the size of about three times the size in FIGS. 47 and 48, and thus it is possible to achieve a sufficient effect.

For example, the height of the triangle of the area B becomes about 5 nm. At present, the thickness necessary for the photoelectric conversion film is equal to or more than about 120 nm at the light absorption coefficient of $10^5$ cm$^{-1}$ (at this time, 70° or more of light is absorbed). If the tilted angle $\theta_1$ is 2° C., the height of the triangle of the area B is settled to a degree of about 15 nm. In this case, since areas with no defect such as the antiphase domain exist at least 100 nm or more from the surface, it is possible to achieve the effect of reducing a dark current. Also, the upper limit value is an angle until a stepwise substrate structure can be maintained. Specifically, $\theta_1$ allows 90° to the maximum.

B. Conclusion

As described above, unlike other embodiments, the photoelectric conversion film 13k is formed by epitaxially growing the compound semiconductor on the silicon substrate ilk which is an off substrate. Thereby, as described above, it is possible to suppress the antiphase domain from being generated.

8. An Eighth Embodiment (in a Case of a Lamination Type)

A. A Configuration and the Like

FIG. 51 is a diagram illustrating main portions of a solid-state imaging device according to an eighth embodiment.

Here, FIG. 51 schematically shows a cross-section of the pixel P.

As shown in FIG. 51, in this embodiment, as the photoelectric conversion film 13, a red photoelectric conversion film 13R, a green photoelectric conversion film 13G, and a blue photoelectric conversion film 13B are provided. The red photoelectric conversion film 13R, the green photoelectric conversion film 13G, and the blue photoelectric conversion film 13B are respectively provided with upper electrodes 14R, 14G and 14B and lower electrodes 53R, 53G and 53B. In addition, the accumulator 12R, 12G and 12B which are the n type impurity area 12 are respectively provided in the red photoelectric conversion film 13R, the green photoelectric conversion film 13G, and the blue photoelectric conversion film 13B. Further, the color filter CF is not provided. Except for this and parts related thereto, this embodiment is the same as the sixth embodiment. Therefore, the description of the overlapping parts will be omitted.

As shown in FIG. 51, the photoelectric conversion film 13 includes the red photoelectric conversion film 13R, the green photoelectric conversion film 13G, and the blue photoelectric conversion film 13B, which are sequentially laminated on the front surface of the silicon substrate 11.

The red photoelectric conversion film 13R of the photoelectric conversion film 13 is provided in the upper side of the surface of the silicon substrate 11 as shown in FIG. 51. The red photoelectric conversion film 13R selectively disperses a red light beam of the incident light beams H coming from above and photoelectric-converts the red light beam. In other words, the red photoelectric conversion film 13R is provided to sense with high sensitivity a light beam in a red wavelength band of light beams passing through the respective portions and generate charges through the photoelectric conversion.

The green photoelectric conversion film 13G of the photoelectric conversion film 13 is provided on the upper side of the surface of the silicon substrate 11 with the red photoelectric conversion film 13R interposed between it and the substrate as shown in FIG. 51. The green photoelectric conversion film 13G selectively disperses a green light beam of the incident light beams H coming from above and photoelectric-converts the green light beam. In other words, the green photoelectric conversion film 13G is provided to sense with high sensitivity a light beam in a green wavelength band of light beams passing through the respective portions and generate charges through the photoelectric conversion.

As shown in FIG. 51, the blue photoelectric conversion film 13B of the photoelectric conversion film 13 is provided on the upper side of the surface of the silicon substrate 11 with the red photoelectric conversion film 13R and the green photoelectric conversion film 13G interposed between it and the substrate as shown in FIG. 51. The blue photoelectric conversion film 13B selectively disperses a blue light beam of the incident light beams H coming from above and photoelectric-converts the blue light beam. In other words, the blue photoelectric conversion film 13B is provided to sense with high sensitivity a light beam in a blue wavelength band of light beams passing through the respective portions and generate charges through the photoelectric conversion.

The red photoelectric conversion film 13R, the green photoelectric conversion film 13G, and the blue photoelectric conversion film 13B are respectively provided with the upper electrodes 14R, 14G and 14B and the lower electrodes 53R, 53G and 53B between them and the silicon substrate 11 in the depth direction z of the silicon substrate 11.

Here, as shown in FIG. 51, the upper electrodes 14R, 14G and 14B are respectively provided on the upper surfaces of the red photoelectric conversion film 13R, the green photoelectric conversion film 13G, and the blue photoelectric conversion film 13B, and are electrically connected to the ground.

Also, as shown in FIG. 51, the lower electrodes 53R, 53G and 53B are respectively on the lower surfaces of the red photoelectric conversion film 13R, the green photoelectric conversion film 13G, and the blue photoelectric conversion film 13B, and are electrically connected to the n type impurity area 12 which is provided as accumulators 12R, 12G and 12B in the silicon substrate 11.

Although not shown, insulating films are interposed between the combinations of the respective red photoelectric conversion film 13R, the green photoelectric conversion film 13G, and the blue photoelectric conversion film 13B, and the upper electrodes 14R, 14G and 14B and the lower electrodes 53R, 53G and 53B.

In the above description, the red photoelectric conversion film 13R, the green photoelectric conversion film 13G, and the blue photoelectric conversion film 13B are respectively formed using, for example, organic materials.

Figure 52A:
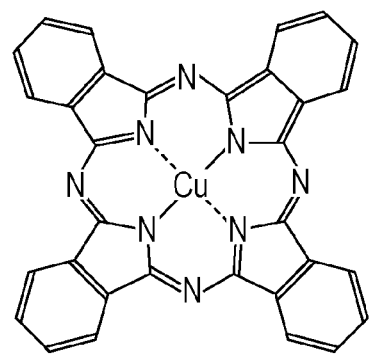
FIGS. 52A to 52C are diagrams illustrating examples of materials used for forming a red photoelectric conversion film, a green photoelectric conversion film, and a blue photoelectric conversion film, in the eighth embodiment.
Figure 52B:
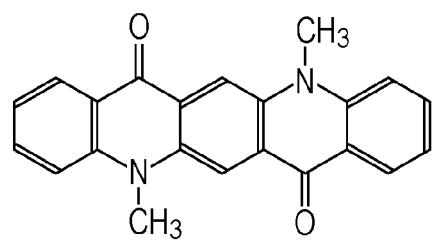
Figure 52C:
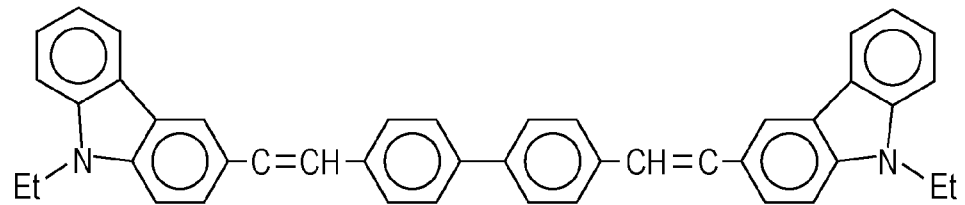

FIGS. 52A to 52C are diagrams illustrating examples used as materials when the red photoelectric conversion film 13R, the green photoelectric conversion film 13G, and the blue photoelectric conversion film 13B are formed in the eighth embodiment. FIG. 52A shows an example of a material used when the red photoelectric conversion film 13R is formed. FIG. 52B shows an example of a material used when the green photoelectric conversion film 13G is formed. FIG. 52C shows an example of a material used when the blue photoelectric conversion film 13B is formed.

As shown in FIG. 52A, the red photoelectric conversion film 13R is formed using, for example, ZnPc. As shown in FIG. 52B, the green photoelectric conversion film 13G is formed using, for example, quinacridone. As shown in FIG. 52C, the blue photoelectric conversion film 13B is formed using, for example, BCzVBi. Each of the red photoelectric conversion film 13R, the green photoelectric conversion film 13G, and the blue photoelectric conversion film 13B is formed to have the film thickness of 100 nm or more.

Each of the upper electrodes 14R, 14G and 14B and the lower electrodes 53R, 53G and 53B is a transparent electrode, and allows light to pass therethrough. For example, each of them is formed by forming a film of metal oxide such as indium tin oxide (ITO) using a film forming method such as a sputtering method.

As described above, the solid-state imaging device in this embodiment is a "photoelectric conversion film laminated type" image sensor, and disperses the incident light H into the respective colors of red, green and blue in the depth direction z for the photoelectric conversion.

Due to the combination of the plural laminated photoelectric conversion films 13R, 13G and 13B, the incident light H is blocked from entering the silicon substrate 11.

Figure 53A:
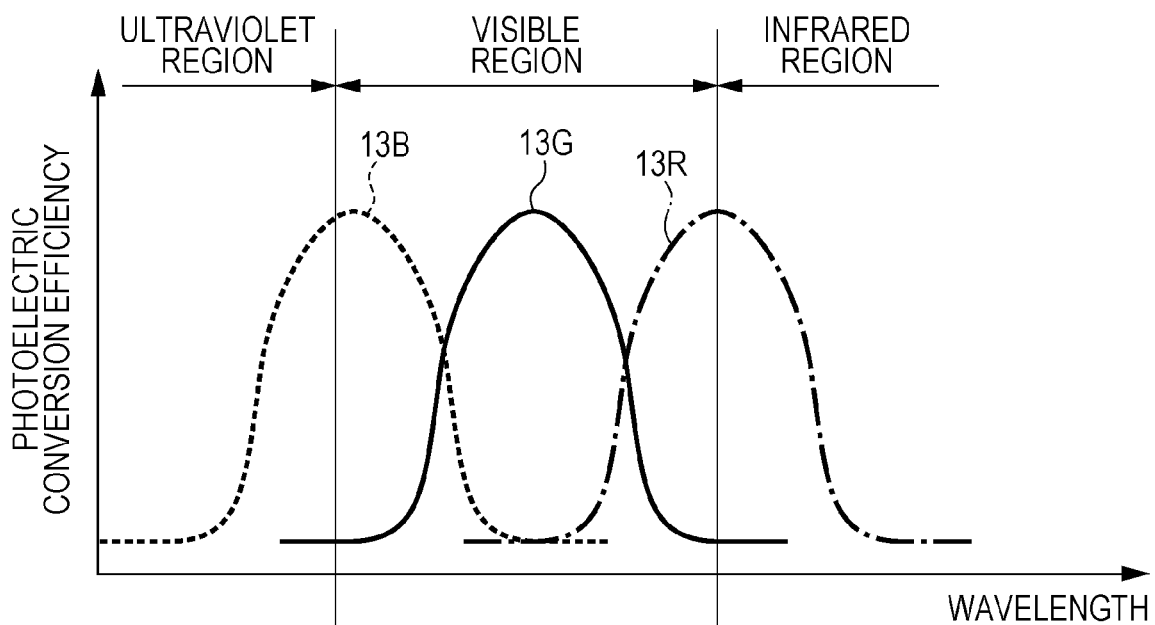
FIGS. 53A and 53B are diagrams illustrating characteristics of the red photoelectric conversion film, the green photoelectric conversion film, and the blue photoelectric conversion film, in the eighth embodiment.
Figure 53B:
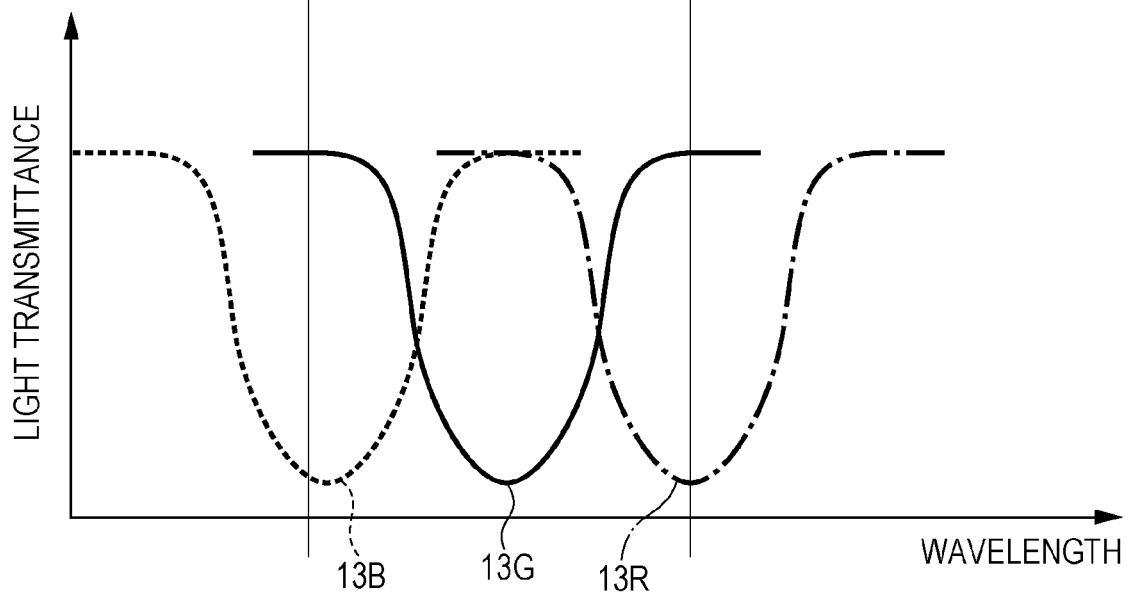

FIGS. 53A and 53B are diagrams illustrating the characteristics of the red photoelectric conversion film 13R, the green photoelectric conversion film 13G, and the blue photoelectric conversion film 13B in the eighth embodiment. FIG. 53A shows a relationship between the wavelength of the incident light and the photoelectric conversion efficiency regarding each of the red photoelectric conversion film 13R, the green photoelectric conversion film 13G, and the blue photoelectric conversion film 13B. FIG. 53B shows a relationship between the wavelength of the incident light and the light transmittance regarding each of the red photoelectric conversion film 13R, the green photoelectric conversion film 13G, and the blue photoelectric conversion film 13B. In FIGS. 53A and 53B, the chain line denotes the case of the red photoelectric conversion film 13R, the solid line denotes the case of the green photoelectric conversion film 13G, and the broken line denotes the case of the blue photoelectric conversion film 13B.

As shown in FIG. 53A, if the red photoelectric conversion film 13R, the green photoelectric conversion film 13G, and the blue photoelectric conversion film 13B are combined, the photoelectric conversion is performed with the high photoelectric conversion efficiency throughout the visible region.

For this reason, as shown in FIG. 53B, if the red photoelectric conversion film 13R, the green photoelectric conversion film 13G, and the blue photoelectric conversion film 13B are combined, the light transmittance is nearly zero throughout the visible region.

Therefore, the visible light does not enter the accumulators 12R, 12G and 12B provided in the lower side of the photoelectric conversion film 13 but is blocked by the photoelectric conversion film 13. In addition, light in the infrared region is cut by forming an infrared cutoff filter in the upper side of the photoelectric conversion film 13. Further, light in the ultraviolet region is cut by forming an ultraviolet cutoff filter in the upper side of the photoelectric conversion film 13.

B. Conclusion

As described above, the plural photoelectric conversion films 13R, 13G and 13B having different absorption spectra are provided, and the plural photoelectric conversion films 13R, 13G and 13B are laminated. Due to the combination of the plural laminated photoelectric conversion films 13R, 13G and 13B, the incident light H is blocked from entering the silicon substrate 11.

For this reason, in this embodiment, since the plural photoelectric conversion films 13R, 13G and 13B block the incident light H from entering the n type impurity area 12 and the like, in the same manner as other embodiments, it is possible to realize a small size, prevent the generation of noise, and improve the image quality of a captured image.

9. A Ninth Embodiment (in a Case of a Lamination Type)

A. A Configuration and the Like

Figure 54:
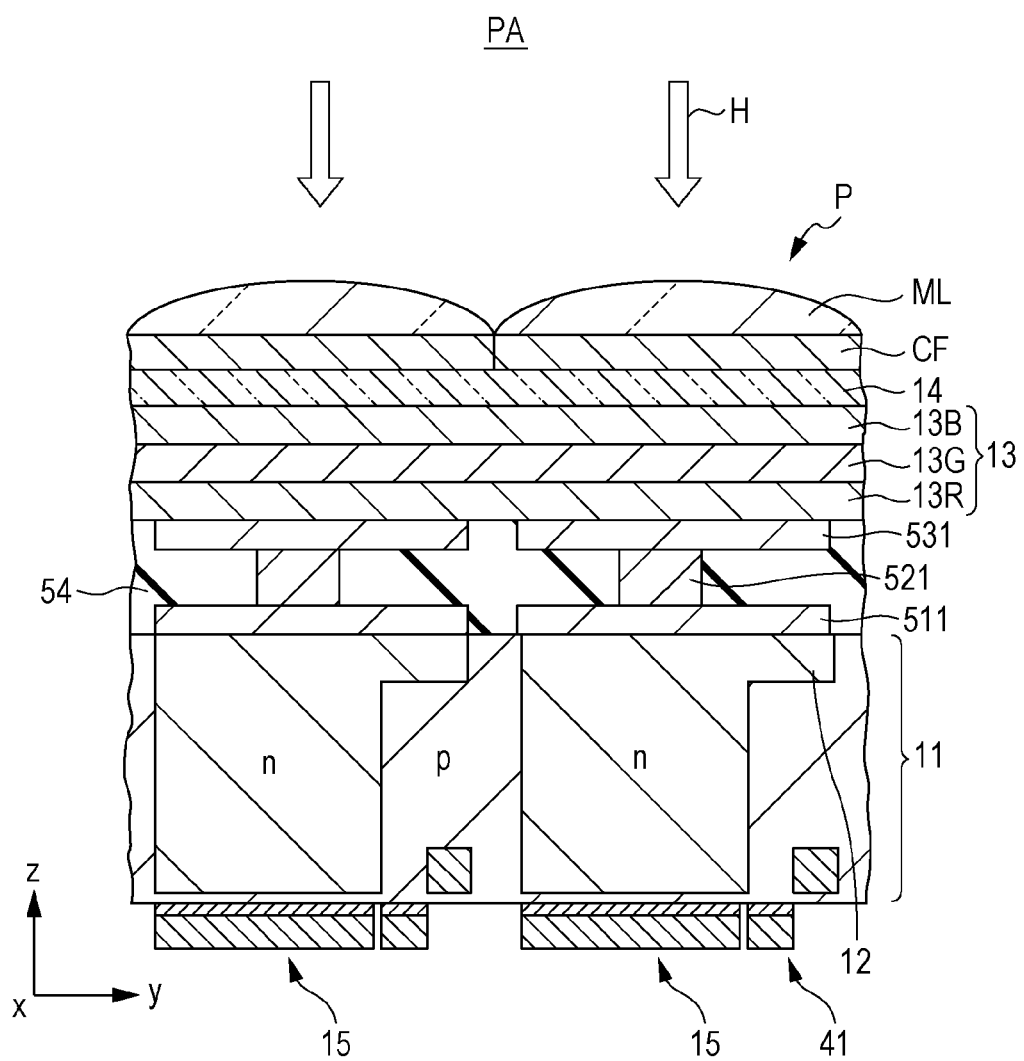
FIG. 54 is a diagram illustrating main portions of a solid-state imaging device according to a ninth embodiment.

FIG. 54 is a diagram illustrating main portions of a solid-state imaging device according to a ninth embodiment.

Here, FIG. 54 shows a cross-section of the pixel P in the same manner as FIG. 45.

As shown in FIG. 54, this embodiment is different from the fifth embodiment in a configuration of the photoelectric conversion film 13. Except for this, this embodiment is the same as the fifth embodiment. The photoelectric conversion film 13 has the same configuration as that in the eighth embodiment. Therefore, the description of the overlapping parts will be omitted.

As shown in FIG. 54, the photoelectric conversion film 13 includes the red photoelectric conversion film 13R, the green photoelectric conversion film 13G, and the blue photoelectric conversion film 13B, which are sequentially laminated on the front surface of the silicon substrate 11.

As shown in FIG. 54, the red photoelectric conversion film 13R is provided in the upper side of the surface of the silicon substrate 11, and selectively disperses a red light beam of the incident light beams H coming from above and photoelectric-converts the red light beam. The green photoelectric conversion film 13G is provided on the upper side of the surface of the silicon substrate 11 with the red photoelectric conversion film 13R interposed between it and the substrate, and selectively disperses a green light beam of the incident light beams H coming from above and photoelectric-converts the green light beam. The blue photoelectric conversion film 13B is provided on the upper side of the surface of the silicon substrate 11 with the red photoelectric conversion film 13R and the green photoelectric conversion film 13G interposed between it and the substrate, and selectively disperses a blue light beam of the incident light beams H coming from above and photoelectric-converts the blue light beam.

In this embodiment, the color filters CF are provided over the photoelectric conversion film 13. For this reason, the light passing through the color filters CF is sensed by the red photoelectric conversion film 13R, the green photoelectric conversion film 13G, and the blue photoelectric conversion film 13B. For example, in the color filters CF, a red light beam passing through a red filter layer (not shown) is sensed by the red photoelectric conversion film 13R and undergoes the photoelectric conversion. Also, in the color filters CF, a green light beam passing through a green filter layer (not shown) is sensed by the green photoelectric conversion film 13G and undergoes the photoelectric conversion. Further, in the color filters CF, a blue light beam passing through a blue filter layer (not shown) is sensed by the blue photoelectric conversion film 13B and undergoes the photoelectric conversion.

In the above description, the red photoelectric conversion film 13R, the green photoelectric conversion film 13G, and the blue photoelectric conversion film 13B are respectively are formed using, for example, organic materials in the same manner the eighth embodiment. In addition, materials such as a chalcopyrite based material may be used.

As described above, the solid-state imaging device in this embodiment is a "photoelectric conversion film laminated type" image sensor, and disperses the incident light H into the respective colors of red, green and blue in the depth direction z for the photoelectric conversion.

Due to the combination of the plural laminated photoelectric conversion films 13R, 13G and 13B, the incident light H is blocked from entering the silicon substrate 11.

Figure 55:
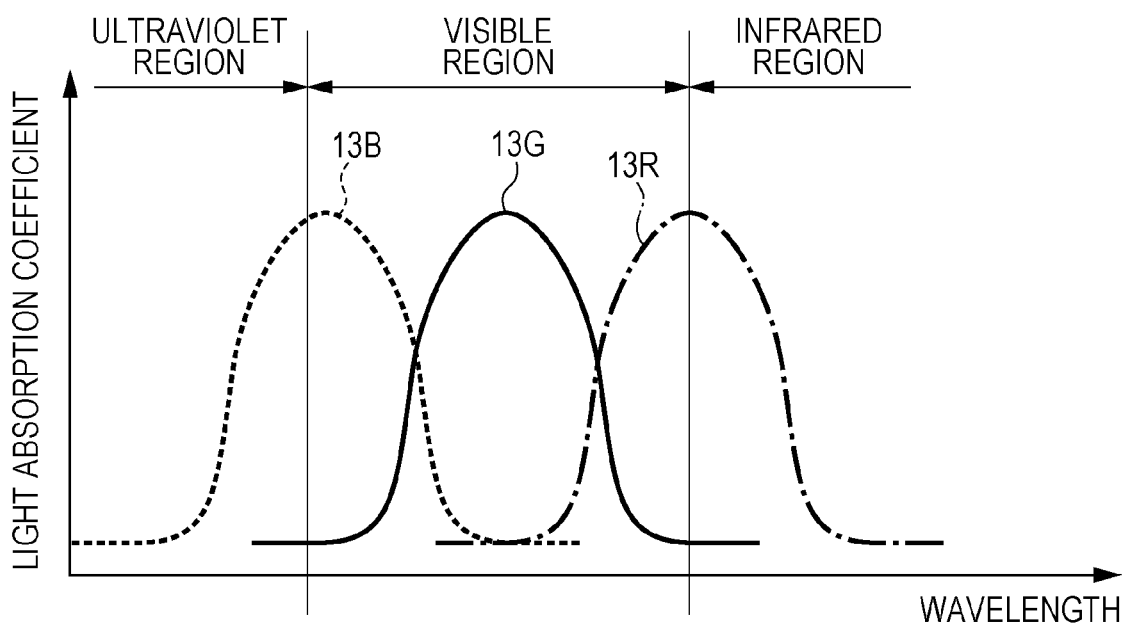
FIG. 55 is a diagram illustrating characteristics of a red photoelectric conversion film, a green photoelectric conversion film, and a blue photoelectric conversion film, in the ninth embodiment.

FIG. 55 is a diagram illustrating the characteristics of the red photoelectric conversion film 13R, the green photoelectric conversion film 13G, and the blue photoelectric conversion film 13B in the ninth embodiment. FIG. 55 shows a relationship between the wavelength of the incident light and the light absorption coefficient regarding each of the red photoelectric conversion film 13R, the green photoelectric conversion film 13G, and the blue photoelectric conversion film 13B. In FIG. 55, the chain line denotes the case of the red photoelectric conversion film 13R, the solid line denotes the case of the green photoelectric conversion film 13G, and the broken line denotes the case of the blue photoelectric conversion film 13B.

As shown in FIG. 55, if the red photoelectric conversion film 13R, the green photoelectric conversion film 13G, and the blue photoelectric conversion film 13B are combined, the light is absorbed throughout the visible region. Therefore, the visible light does not enter the n type impurity area 12 provided in the lower side of the photoelectric conversion film 13 but is blocked by the photoelectric conversion film 13.

Particularly, in this embodiment, since the light passing through the color filters CF is absorbed by the red photoelectric conversion film 13R, the green photoelectric conversion film 13G, and the blue photoelectric conversion film 13B, the light is efficiently blocked.

B. Conclusion

As described above, in this embodiment, the plural photoelectric conversion films 13R, 13G and 13B having different absorption spectra are provided, and the plural photoelectric conversion films 13R, 13G and 13B are laminated. Due to the combination of the plural laminated photoelectric conversion films 13R, 13G and 13B, the incident light H is blocked from entering the silicon substrate 11.

For this reason, in this embodiment, since the plural photoelectric conversion films 13R, 13G and 13B block the incident light H from entering the n type impurity area 12 and the like, in the same manner as other embodiments, it is possible to realize a small size, prevent the generation of noise, and improve the image quality of a captured image.

10. A Tenth Embodiment (in a Case of a Lamination Type)

A. A Configuration and the Like

Figure 56:
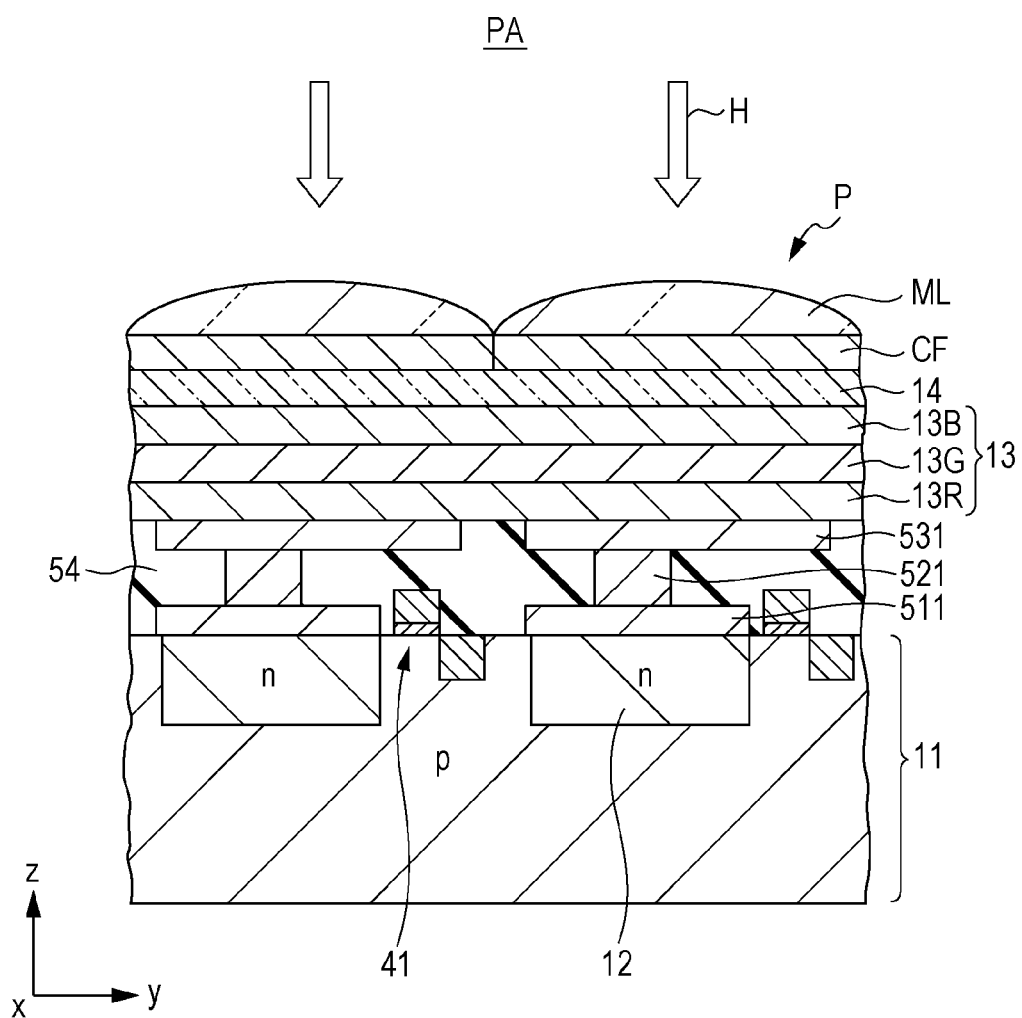
FIG. 56 is a diagram illustrating main portions of a solid-state imaging device according to a tenth embodiment.

FIG. 56 is a diagram illustrating main portions of a solid-state imaging device according to a tenth embodiment.

Here, FIG. 56 shows a cross-section of the pixel P in the same manner as FIG. 46.

As shown in FIG. 56, this embodiment is different from the sixth embodiment in a configuration of the photoelectric conversion film 13. Except for this, this embodiment is the same as the sixth embodiment. The photoelectric conversion film 13 has the same configuration as that in the ninth embodiment. Therefore, the description of the overlapping parts will be omitted.

As shown in FIG. 56, in this embodiment, in the same manner as the sixth embodiment, the photoelectric conversion film 13 senses the incident light H coming from the upper surface (front surface) on which the respective portions such as the gate MOS 41 are provided on the silicon substrate 11. In other words, the solid-state imaging device in this embodiment is a "front surface illumination type CMOS image sensor."

As shown in FIG. 56, in the same manner as the ninth embodiment, the photoelectric conversion film 13 includes the red photoelectric conversion film 13R, the green photoelectric conversion film 13G, and the blue photoelectric conversion film 13B, which are sequentially laminated on the front surface of the silicon substrate 11 (refer to FIG. 54).

In other words, the solid-state imaging device in this embodiment is a "photoelectric conversion film laminated type" image sensor, and disperses the incident light H into the respective colors of red, green and blue in the depth direction z for the photoelectric conversion.

Further, in the same manner as the ninth embodiment, due to the combination of the plural laminated photoelectric conversion films 13R, 13G and 13B, the incident light H is blocked from entering the silicon substrate 11.

For this reason, if the red photoelectric conversion film 13R, the green photoelectric conversion film 13G, and the blue photoelectric conversion film 13B are combined, the light is absorbed throughout the visible region. Therefore, the visible light does not enter the n type impurity area 12 provided in the lower side of the photoelectric conversion film 13 but is blocked by the photoelectric conversion film 13.

B. Conclusion

As described above, in this embodiment, in the same manner as the ninth embodiment, the plural photoelectric conversion films 13R, 13G and 13B having different absorption spectra are provided, and the plural photoelectric conversion films 13R, 13G and 13B are laminated. Due to the combination of the plural laminated photoelectric conversion films 13R, 13G and 13B, the incident light H is blocked from entering the silicon substrate 11.

For this reason, in this embodiment, since the plural photoelectric conversion films 13R, 13G and 13B block the incident light H from entering the n type impurity area 12 and the like, in the same manner as other embodiments, it is possible to realize a small size, prevent the generation of noise, and improve the image quality of a captured image.

11. An Eleventh Embodiment

A. A Configuration and the Like

Figure 57:
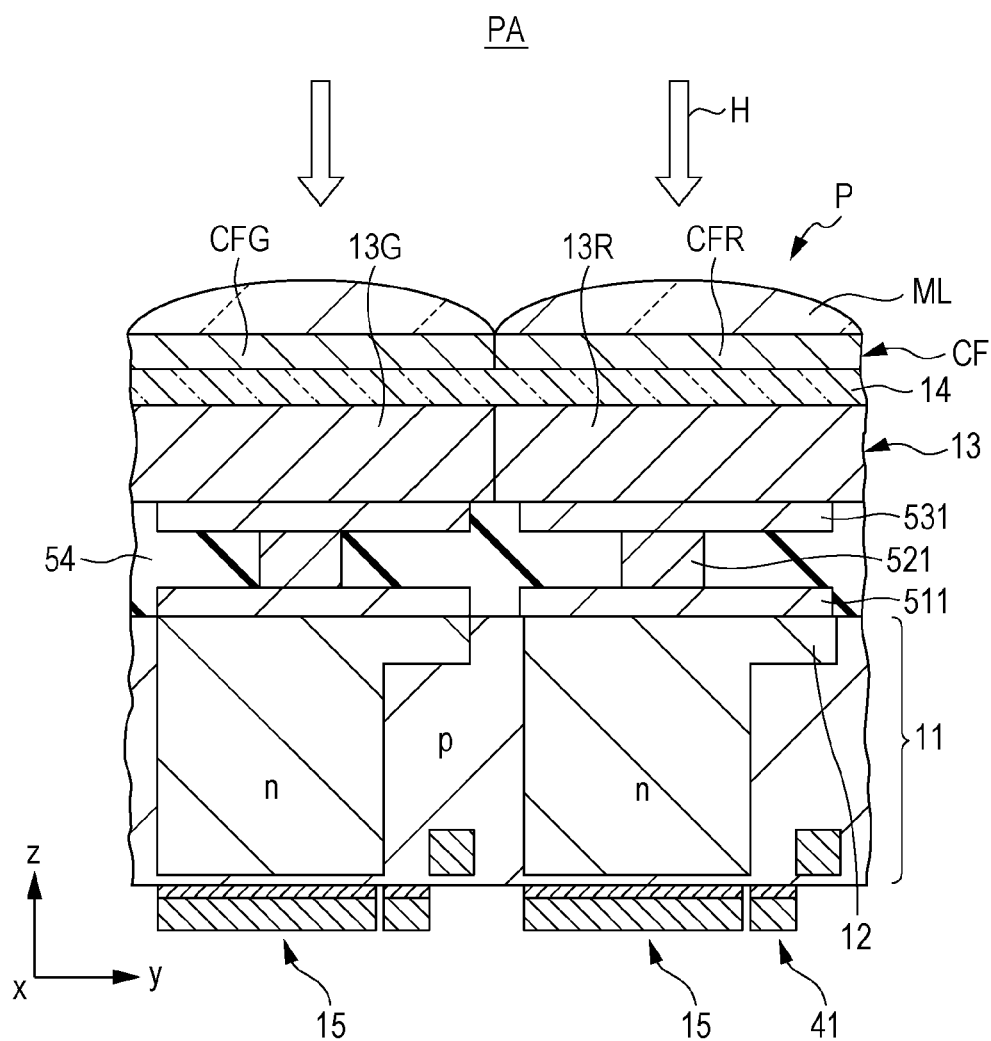
FIG. 57 is a diagram illustrating main portions of the solid-state imaging device according to an eleventh embodiment.

FIG. 57 is a diagram illustrating main portions of a solid-state imaging device according to an eleventh embodiment.

Here, FIG. 57 shows a cross-section of the pixel P in the same manner as FIG. 45.

As shown in FIG. 57, this embodiment is different from the fifth embodiment in a configuration of the photoelectric conversion film 13. Except for this, this embodiment is the same as the fifth embodiment. Therefore, the description of the overlapping parts will be omitted.

As shown in FIG. 57, the photoelectric conversion film 13 includes the red photoelectric conversion film 13R and the green photoelectric conversion film 13G, which are provided to be arranged along the front surface of the silicon substrate 11. Although not shown in FIG. 57, the photoelectric conversion film 13 further includes the blue photoelectric conversion film 13B in addition to the red photoelectric conversion film 13R and the green photoelectric conversion film 13G, and the blue photoelectric conversion film 13B is arranged along with the red photoelectric conversion film 13R and the green photoelectric conversion film 13G.

In this embodiment, the photoelectric conversion film 13 blocks the incident light H due to the combination of the red photoelectric conversion film 13R, the green photoelectric conversion film 13G, and the blue photoelectric conversion film 13B, the red filter layer CFR, the green filter layer CFG, and the blue filter layer CFB.

Specifically, as shown in FIG. 57, the red color filter layer CFR as the color filter CF is provided over the red photoelectric conversion film 13R, and a red light beam passing through the red color filter layer CFR enters the red photoelectric conversion film 13R.

Further, as shown in FIG. 57, the green color filter layer CFG as the color filter CF is provided over the green photoelectric conversion film 13G, and a green light beam passing through the green color filter layer CFG enters the green photoelectric conversion film 13G.

Also, although not shown in FIG. 57, the blue color filter layer CFB as the color filter CF is provided over the blue photoelectric conversion film 13B, and a blue light beam passing through the blue color filter layer CFB enters the blue photoelectric conversion film 13B.

In this way, the red photoelectric conversion film 13R, the green photoelectric conversion film 13G, and the blue photoelectric conversion film 13B are arranged in the Bayer arrangement in the same manner as the red filter layer CFR, the green filter layer CFG, and the blue filter layer CFB constituting the color filter CF.

Figure 58:
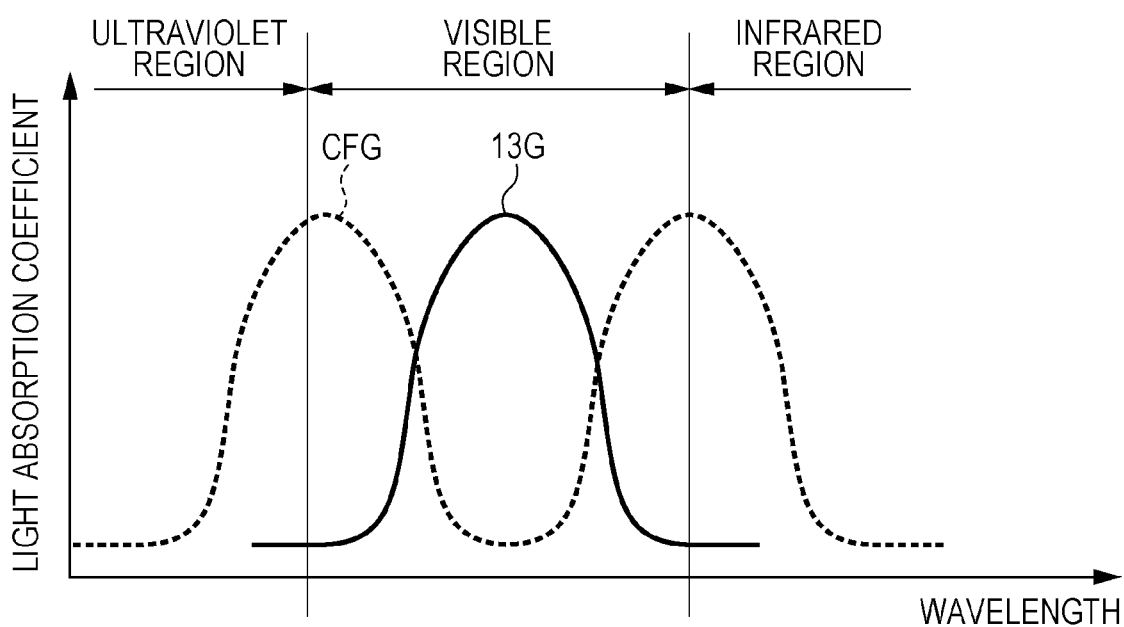
FIG. 58 is a diagram illustrating characteristics of a green photoelectric conversion film and a green filter layer in the eleventh embodiment.

FIG. 58 is a diagram illustrating the characteristics of the green photoelectric conversion film 13G and the green filter layer CFG in the eleventh embodiment. FIG. 58 shows a relationship between the wavelength of the incident light and the light absorption coefficient regarding each of the green photoelectric conversion film 13G and the green filter layer CFG. In FIG. 58, the solid line denotes the case of the green photoelectric conversion film 13G, and the broken line denotes the case of the green filter layer CFG.

As shown in FIG. 58, the green photoelectric conversion film 13G has the high light absorption coefficient with respect to light in the wavelength region corresponding to the green. In contrast, the green filter layer CFG has the high light absorption coefficient with respect to light in the visible region other than the wavelength region corresponding to the green.

For this reason, as shown in FIG. 58, if the green photoelectric conversion film 13G and the green filter layer CFG are combined, the light is absorbed throughout the visible region. Therefore, the visible light does not enter the n type impurity area 12 provided in the lower side of the green photoelectric conversion film 13G but is blocked by the photoelectric conversion film 13.

In the same manner as the combination of the green photoelectric conversion film 13G and the green filter layer CFG, if the red photoelectric conversion film 13R and the red filter layer CFR are combined as well, the light is absorbed throughout the visible region. Therefore, the visible light does not enter the n type impurity area 12 provided in the lower side of the red photoelectric conversion film 13R but is blocked by the photoelectric conversion film 13.

Likewise, if the blue photoelectric conversion film 13B and the blue filter layer CFB are combined as well, the light is absorbed throughout the visible region. Therefore, the visible light does not enter the n type impurity area 12 provided in the lower side of the blue photoelectric conversion film 13B but is blocked by the photoelectric conversion film 13.

B. Conclusion

As described above, in this embodiment, the photoelectric conversion film 13 blocks the incident light H due to the combination of the red photoelectric conversion film 13R, the green photoelectric conversion film 13G, and the blue photoelectric conversion film 13B, the red filter layer CFR, the green filter layer CFG, and the blue filter layer CFG.

For this reason, in this embodiment, since the plural photoelectric conversion film 13 blocks the incident light H from entering the n type impurity area 12 and the like, in the same manner as other embodiments, it is possible to realize a small size, prevent the generation of noise, and improve the image quality of a captured image.

12. A Twelfth Embodiment

A. A Configuration and the Like

Figure 59:
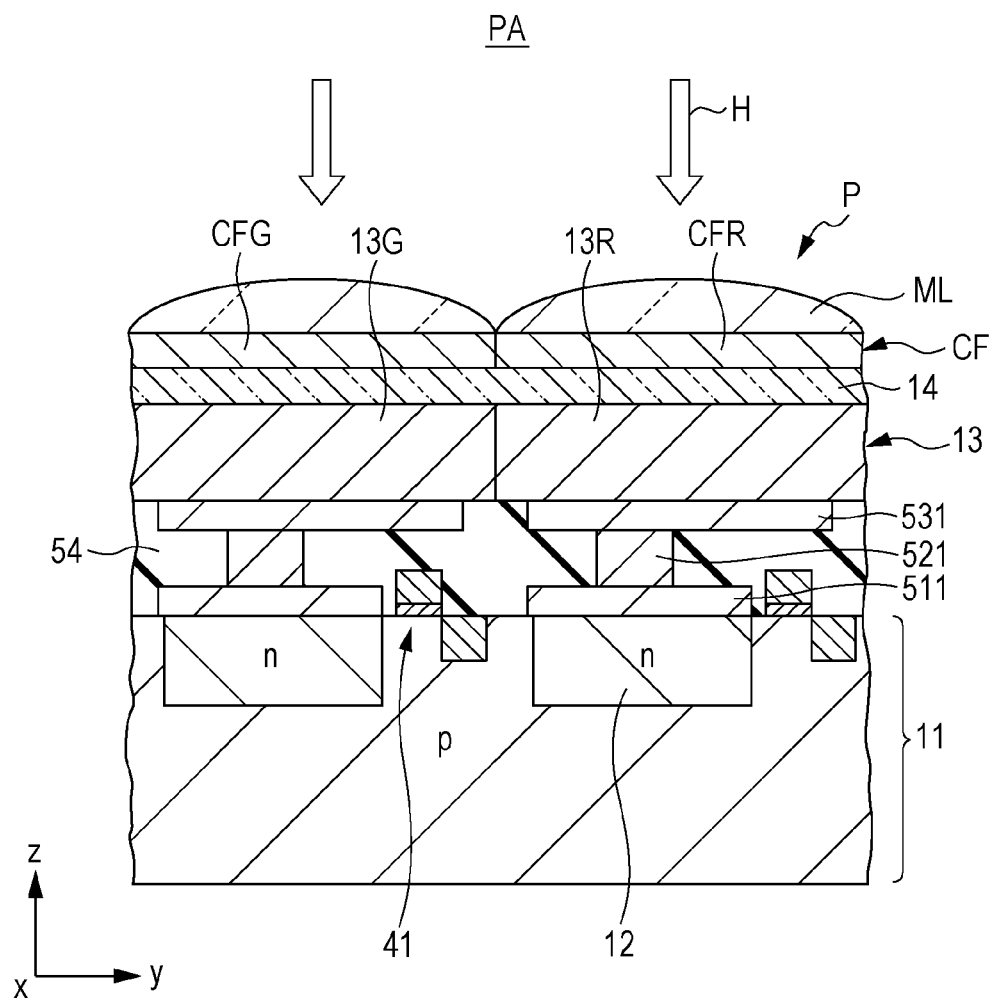
FIG. 59 is a diagram illustrating main portions of a solid-state imaging device according to a twelfth embodiment.

FIG. 59 is a diagram illustrating main portions of a solid-state imaging device according to a twelfth embodiment.

Here, FIG. 59 shows a cross-section of the pixel P in the same manner as FIG. 46.

As shown in FIG. 59, this embodiment is different from the sixth embodiment in a configuration of the photoelectric conversion film 13. Except for this, this embodiment is the same as the sixth embodiment. The photoelectric conversion film 13 has the same configuration as that in the eleventh embodiment. Therefore, the description of the overlapping parts will be omitted.

As shown in FIG. 59, in this embodiment, in the same manner as the sixth embodiment, the photoelectric conversion film 13 senses the incident light H coming from the upper surface (front surface) on which the respective portions such as the gate MOS 41 are provided on the silicon substrate 11. In other words, the solid-state imaging device in this embodiment is a "front surface illumination type CMOS image sensor."

As shown in FIG. 59, in the same manner as the case of the eleventh embodiment, the photoelectric conversion film 13 includes the red photoelectric conversion film 13R and the green photoelectric conversion film 13G, and the like, which are provided to be arranged along the front surface of the silicon substrate 11. Although not shown in FIG. 59, the photoelectric conversion film 13 further includes the blue photoelectric conversion film 13B in addition to the red photoelectric conversion film 13R and the green photoelectric conversion film 13G, and the blue photoelectric conversion film 13B is arranged along with the red photoelectric conversion film 13R and the green photoelectric conversion film 13G.

In the same manner as the eleventh embodiment, the photoelectric conversion film 13 blocks the incident light H due to the combination of the red photoelectric conversion film 13R, the green photoelectric conversion film 13G, and the blue photoelectric conversion film 13B, the red filter layer CFR, the green filter layer CFG, and the blue filter layer CFB.

In this way, the red photoelectric conversion film 13R, the green photoelectric conversion film 13G, and the blue photoelectric conversion film 13B are arranged in the Bayer arrangement in the same manner as the red filter layer CFR, the green filter layer CFG, and the blue filter layer CFB constituting the color filter CF.

B. Conclusion

As described above, in this embodiment, the photoelectric conversion film 13 blocks the incident light H due to the combination of the red photoelectric conversion film 13R, the green photoelectric conversion film 13G, and the blue photoelectric conversion film 13B, the red filter layer CFR, the green filter layer CFG, and the blue filter layer CFB.

For this reason, in this embodiment, since the photoelectric conversion film 13 blocks the incident light H from entering the n type impurity area 12 and the like, in the same manner as other embodiments, it is possible to realize a small size, prevent the generation of noise, and improve the image quality of a captured image.

13. Others

In practice, the present invention is not limited to the above-described embodiments, but may have a variety of modifications.

In the embodiments, although the case where the present invention is applied a camera has been described, it is not limited thereto. The present invention may be applied to other electronic devices including a solid-state imaging device such as a scanner or a copier.

Further, in the embodiments, although the case where the solid-state imaging device is the CMOS image sensor has been described, the present invention is not limited thereto. If necessary, the present invention may be applied to a CCD type image sensor in addition to the CMOS image sensor.

In the embodiments, although the case where the readout circuit is singly provided for each photoelectric conversion unit has been described, the present invention is not limited thereto. For example, a readout circuit may be singly provided in a plurality of photoelectric conversion units. That is to say, plural pixels may share transistors so as to reduce the number of the transistors. Thereby, finer pixels can be realized.

Also, in the embodiments, although the case where a second conductivity type (for example, an n type) impurity area is formed in a first conductivity type (for example, a p type) silicon substrate has been described (refer to FIG. 3 and the like), the present invention is not limited thereto. A first conductivity type (for example, a p type) well may be formed in a second conductivity type (for example, an n type) silicon substrate, and the second conductivity type (for example, the n type) impurity region may be formed in the well.

In the embodiments, although the case where "electrons" are read out as a signal has been described, the present invention is not limited thereto. There may be a configuration where "holes" are read out as a signal. In this case, the conductivity type for each portion shown in each embodiment is made reverse, and thus the "holes" can be read out as a signal.

Further, the structures or the operations disclosed in Japanese Unexamined Patent Application Publications No. 2009-268083 and the like may be appropriately employed. For example, as shown in FIG. 45 in Japanese Unexamined Patent Application Publications No. 2009-268083, the present invention may be applied in a case of not forming the PD reset transistor M11 (refer to FIG. 12 and the like in this application). Specifically, first, a charge draining operation is performed in all pixels P at the same time, and an exposure starts at the same time. Thereby, generated photoinduced charges are accumulated in the n type impurity area 12 (refer to FIG. 12 and the like in this specification). Further, the gate MOS 41 is turned on in all the pixels P at the same time, and thus the accumulated photoinduced charges are transferred to the n type impurity region 411. Then, the reset transistor is turned on and charges in the n type impurity region 421 functioning as an FD (floating diffusion) are drained. Further, a signal with a reset level is read out from the n type impurity region 421 via an amplification transistor (period P). Next, the gate MOS 42 is turned on so as to transfer the charges to the n type impurity region 421 functioning as the FD. Also, a signal level Vpd corresponding to charges Qpd in the FD is read out through the amplification transistor (period D). Through the correlated double sampling (CDS) process, noise included in the signal level Vpd are removed by a difference between the reset level Vrst and the signal level Vpd. At this time, since the reset noise included in the signal level correspond with the reset noise read out through the readout of the reset level, it is possible to reduce noise including the kTC noise.

In addition to the typical CDS driving, an operation by a DDS driving may be performed. Particularly, if the photoelectric conversion unit does not have a HAD structure like a case of using an organic photoelectric conversion film, the FD is reset after the signal charges are accumulated, which is preferable since the generation of noise can be suppressed. In other words, through the readout of the reset level after the readout of the signal level, it is possible to reduce image quality deterioration due to an after-image phenomenon when the reset operation is performed, since random noise or unevenness in a surface at the time of the reset decreases.

In addition, the above-described respective embodiments may be appropriately combined.

It should be understood by those skilled in the art that various modifications, combinations, sub-combinations and alterations may occur depending on design requirements and other factors insofar as they are within the scope of the appended claims or the equivalents thereof.

Although modifications and changes may be suggested by those skilled in the art, it is the intention of the inventors to embody within the patent warranted hereon all changes and modifications as reasonably and properly come within the scope of their contribution to the art.

What is claimed is:
1. An imaging device, comprising:
   a substrate;
   a first charge accumulation region disposed in the substrate;
   a photoelectric conversion film disposed above a light incident side surface of the substrate, wherein the photoelectric conversion film is configured to generate an electric signal by converting incident light into the electric signal; and
   a first impurity region, wherein the first impurity region is provided on an upper surface of the photoelectric conversion film, wherein the first impurity region is provided on at least a portion of a side surface of the photoelectric conversion film, and wherein the first impurity region is in contact with a portion of the light incident side surface of the substrate.

2. The imaging device of claim 1, further comprising:
a plurality of pixels, wherein each pixel includes: a first charge accumulation region disposed in the substrate; a photoelectric conversion film disposed above a light incident side surface of the substrate; and a first impurity region, wherein the first impurity region is provided on an upper surface of the photoelectric conversion film.

3. The imaging device of claim 2, wherein the first impurity region is provided on at least a portion of a side surface of the photoelectric conversion film of each of the pixels.

4. The imaging device of claim 1, wherein the first impurity region is made of a semiconductor including a p type impurity.

5. The imaging device of claim 4, wherein holes generated in the photoelectric conversion film enter the first impurity region and are moved in a transverse direction.

6. The imaging device of claim 1, wherein the first impurity region is made of a compound semiconductor with a chalcopyrite structure.

7. The imaging device of claim 1, wherein the photoelectric conversion film is in contact with the first charge accumulation region.

8. The imaging device of claim 1, further comprising:
a second charge accumulation region.

9. The imaging device of claim 8, wherein the photoelectric conversion film blocks incident light from entering the first and second charge accumulation regions.

10. The imaging device of claim 1, wherein the light incident side surface of the substrate is a first side of the substrate, and wherein a gate MOS is disposed at a second side of the substrate.

11. The imaging device of claim 1, wherein the first impurity region is a p+ layer.

12. An imaging device, comprising:
a substrate;
a first charge accumulation region disposed in the substrate;
a photoelectric conversion film disposed above a light incident side surface of the substrate, wherein the photoelectric conversion film is configured to generate an electric signal by converting incident light into the electric signal;
a first impurity region, wherein the first impurity region is provided on an upper surface of the photoelectric conversion film; and
a plurality of pixels, wherein each pixel includes: a first charge accumulation region disposed in the substrate; a photoelectric conversion film disposed above a light incident side surface of the substrate; and a first impurity region, wherein the first impurity region is provided on an upper surface of the photoelectric conversion film, wherein the first impurity region is provided on at least a portion of a side surface of the photoelectric conversion film of each of the pixels, and wherein the first impurity region is in contact with portions of the light incident side surface of the substrate.

13. The imaging device of claim 12, wherein the first impurity region extends between the photoelectric conversion film of adjacent pairs of the pixels.

14. The imaging device of claim 13, wherein the first impurity region forms a pixel dividing portion.

15. The imaging device of claim 14, wherein the pixel dividing portion blocks incident light.

16. The imaging device of claim 14, wherein the pixel dividing portion blocks electrons from moving between the adjacent pairs of pixels.

17. An imaging device, comprising:
a substrate;
a first charge accumulation region disposed in the substrate;
a photoelectric conversion film disposed above a light incident side surface of the substrate, wherein the photoelectric conversion film is configured to generate an electric signal by converting incident light into the electric signal; and
a first impurity region, wherein the first impurity region is provided on an upper surface of the photoelectric conversion film, wherein the photoelectric conversion film is in contact with the first charge accumulation region, and wherein an area of the first charge accumulation region along the light incident side surface of the substrate is greater than an area of the photoelectric conversion film along the light incident side surface of the substrate.

* * * * *